(12) United States Patent
Song

(10) Patent No.: US 12,725,644 B2
(45) Date of Patent: Sep. 1, 2026

(54) PROCESSING-IN-MEMORY (PIM) DEVICE FOR PERFORMING A BURST MULTIPLICATION AND ACCUMULATION (MAC) OPERATION

(71) Applicant: SK hynix Inc., Icheon-si (KR)

(72) Inventor: Choung Ki Song, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 1083 days.

(21) Appl. No.: 17/866,219

(22) Filed: Jul. 15, 2022

(65) Prior Publication Data

US 2022/0351765 A1 Nov. 3, 2022

Related U.S. Application Data

(63) Continuation-in-part of application No. 17/090,462, filed on Nov. 5, 2020, now Pat. No. 11,537,323.

(Continued)

(30) Foreign Application Priority Data

Jan. 17, 2020 (KR) ........................ 10-2020-0006902

(51) Int. Cl.

*G11C 8/10* (2006.01)
*G06F 7/544* (2006.01)

(Continued)

(52) U.S. Cl.

CPC .............. *G11C 8/10* (2013.01); *G06F 7/5443* (2013.01); *G11C 7/22* (2013.01); *G11C 8/06* (2013.01)

(58) Field of Classification Search

CPC ........ G06F 15/7821; G06F 9/223; G06F 9/30; G06F 9/30145; G06F 9/3016;

(Continued)

(56) References Cited

U.S. PATENT DOCUMENTS 10,042,639 B2 8/2018 Gopal et al.
2003/0154347 A1* 8/2003 Ma .......................... G11C 8/16 711/131

(Continued)

FOREIGN PATENT DOCUMENTS

KR 1020180014946 A 2/2018

OTHER PUBLICATIONS

P. Chi et al., PRIME: A Novel Processing-in-memory Architecture for Neural Network Computation in ReRAM-based Main Memory, 2016 ACM/IEEE 43rd Annual International Symposium on Computer Architecture, IEEE Computer Society, 2016 (Year: 2016).*

*Primary Examiner* — Emily E Larocque

(74) *Attorney, Agent, or Firm* — WILLIAM PARK AND ASSOCIATES LTD.

(57) ABSTRACT

A processing-in-memory (PIM) device includes a command decoder configured to repeatedly output internal multiplication and accumulation (MAC) operation control signals at a predetermined cycle in response to a MAC operation command received from outside the PIM device, a MAC unit configured to perform MAC operations in response to the internal MAC operation control signals, and an address signal generator configured to repeatedly transmit internal address signals designating storage positions of weight data and vector data that are used for the MAC operations to the MAC unit at the predetermined cycle, based on an address signal received from outside the PIM device.

20 Claims, 46 Drawing Sheets

Related U.S. Application Data

(60) Provisional application No. 62/958,223, filed on Jan. 7, 2020.

(51) Int. Cl.
*G11C 7/22* (2006.01)
*G11C 8/06* (2006.01)

(58) Field of Classification Search
CPC .. G06F 9/30196; G06F 9/3818; G06F 7/5443; G11C 7/22; G11C 8/06; G11C 8/10
See application file for complete search history.

(56) References Cited

U.S. PATENT DOCUMENTS

| | | | | |
|---|---|---|---|---|
| 2020/0193277 | A1 | 6/2020 | Kwon | |
| 2020/0294575 | A1* | 9/2020 | O | G11C 11/4096 |

* cited by examiner

Figure 1:
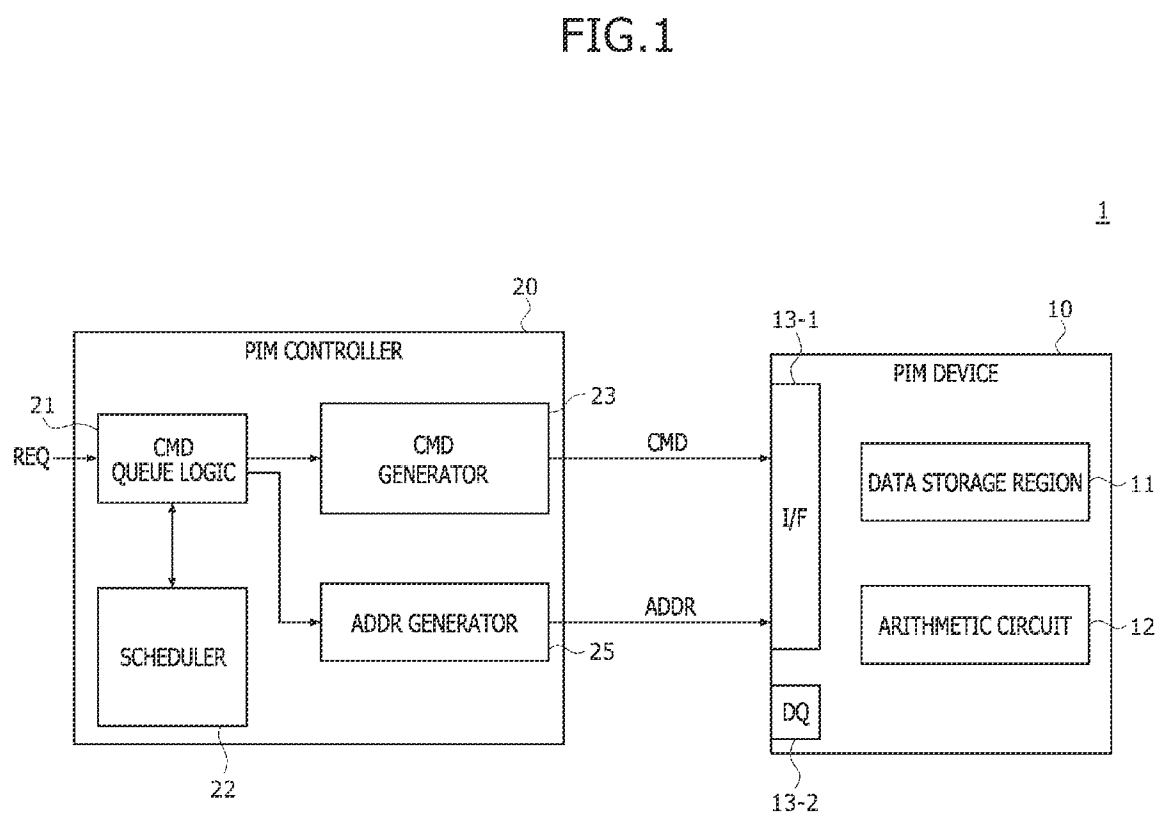

PIM DEVICE 10

DATA STORAGE REGION 11

ARITHMETIC CIRCUIT 12

I/F 13-1

DQ 13-2

CMD

ADDR

PIM CONTROLLER 20

CMD GENERATOR 23

ADDR GENERATOR 25

CMD QUEUE LOGIC 21

SCHEDULER 22

REQ

Figure 2:
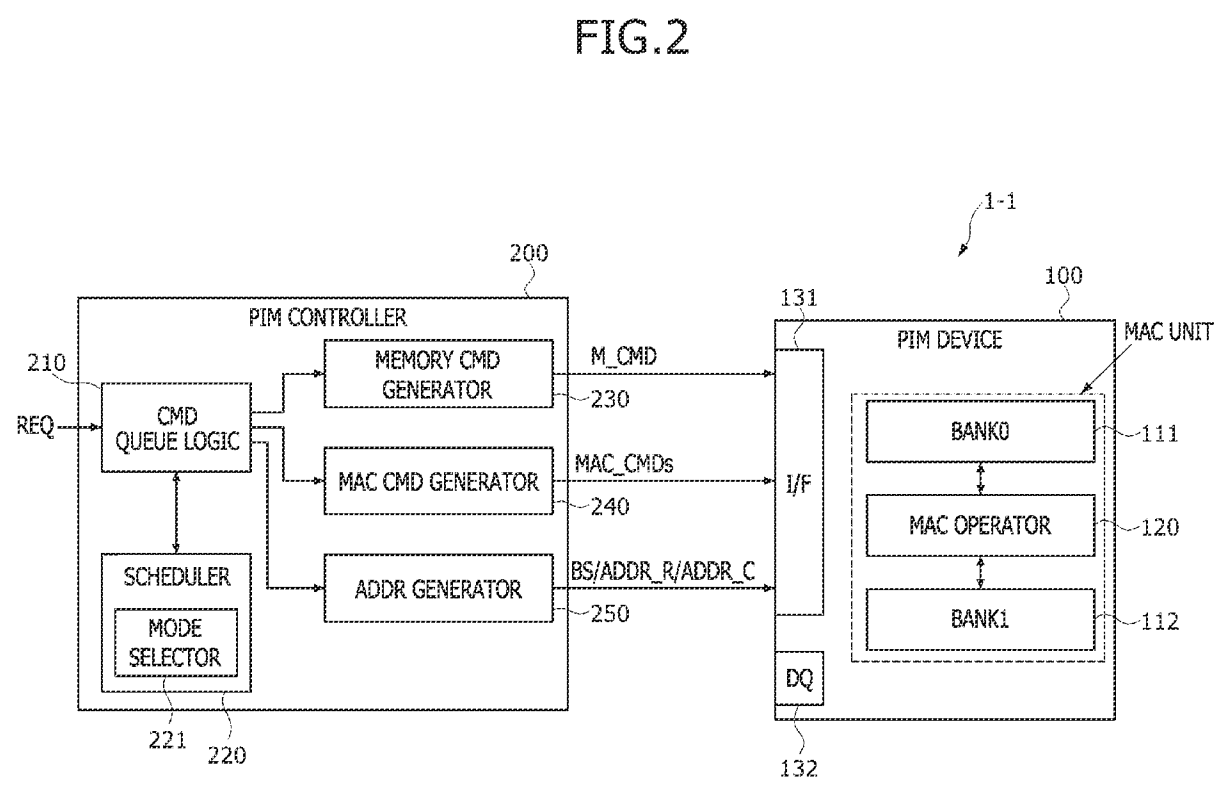

200
PIM CONTROLLER
REQ
210
CMD QUEUE LOGIC
SCHEDULER
MODE SELECTOR
221
220
MEMORY CMD GENERATOR
230
MAC CMD GENERATOR
240
ADDR GENERATOR
250
M_CMD
MAC_CMDs
BS/ADDR_R/ADDR_C

100
PIM DEVICE
131
I/F
DQ
132
MAC UNIT
111
BANK0
120
MAC OPERATOR
112
BANK1

FIG.4

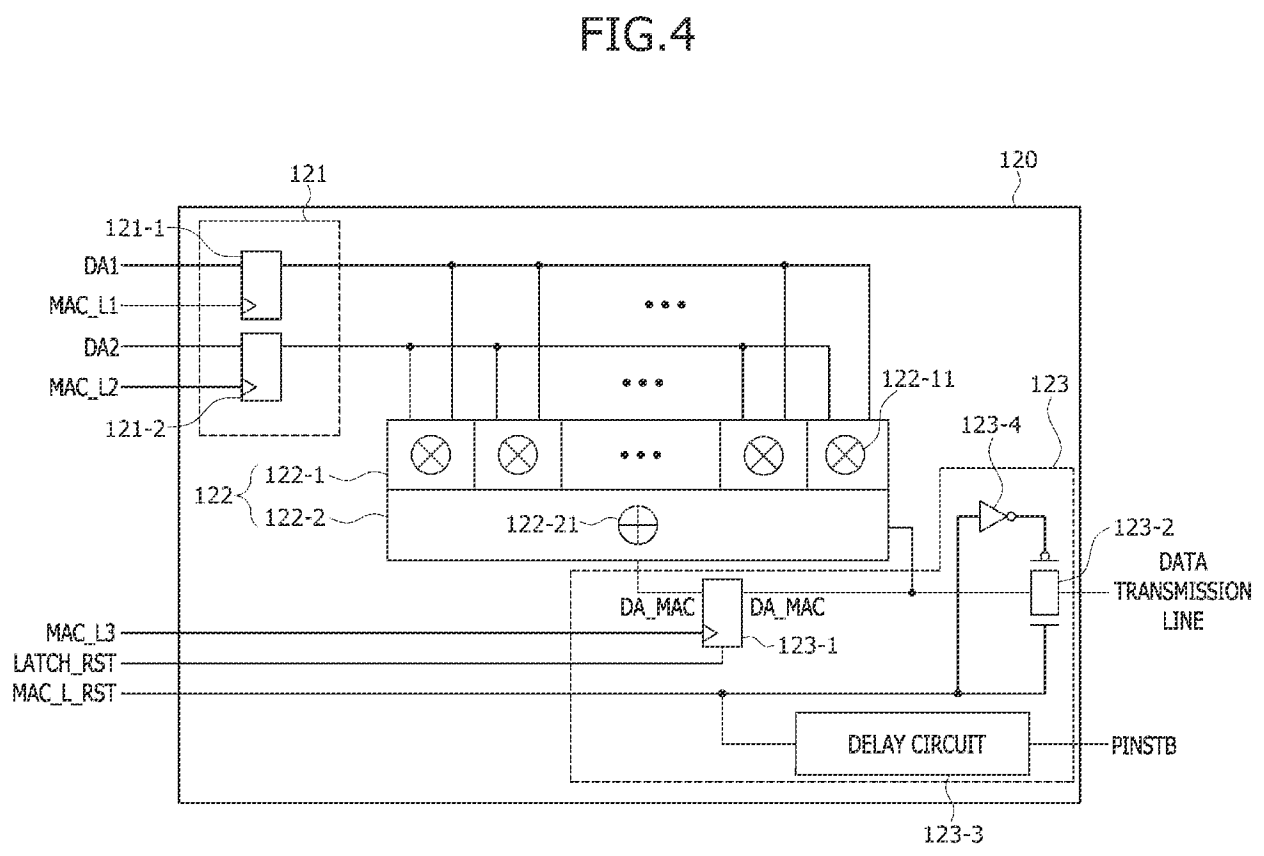

120
121
121-1
121-2
122
122-1
122-2
122-11
122-21
123
123-1
123-2
123-3
123-4
DA1
MAC_L1
DA2
MAC_L2
MAC_L3
LATCH_RST
MAC_L_RST
DA_MAC
DA_MAC
DELAY CIRCUIT
PINSTB
DATA TRANSMISSION LINE

FIG.9

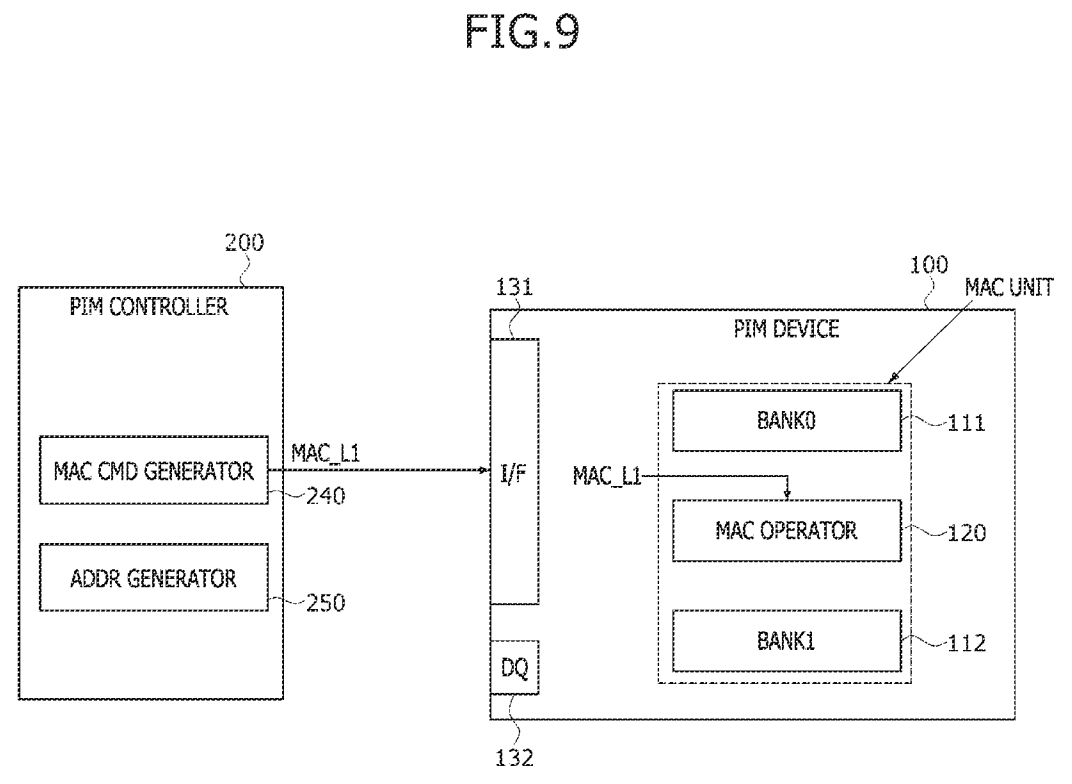

PIM CONTROLLER
200
MAC CMD GENERATOR
240
ADDR GENERATOR
250
MAC_L1
PIM DEVICE
100
MAC UNIT
BANK0
111
MAC OPERATOR
120
BANK1
112
MAC_L1
I/F
131
DQ
132

PIM CONTROLLER
200
MAC CMD GENERATOR
240
ADDR GENERATOR
250
MAC_L3
PIM DEVICE
100
MAC UNIT
BANK0
111
MAC OPERATOR
120
BANK1
112
I/F
131
DQ
132

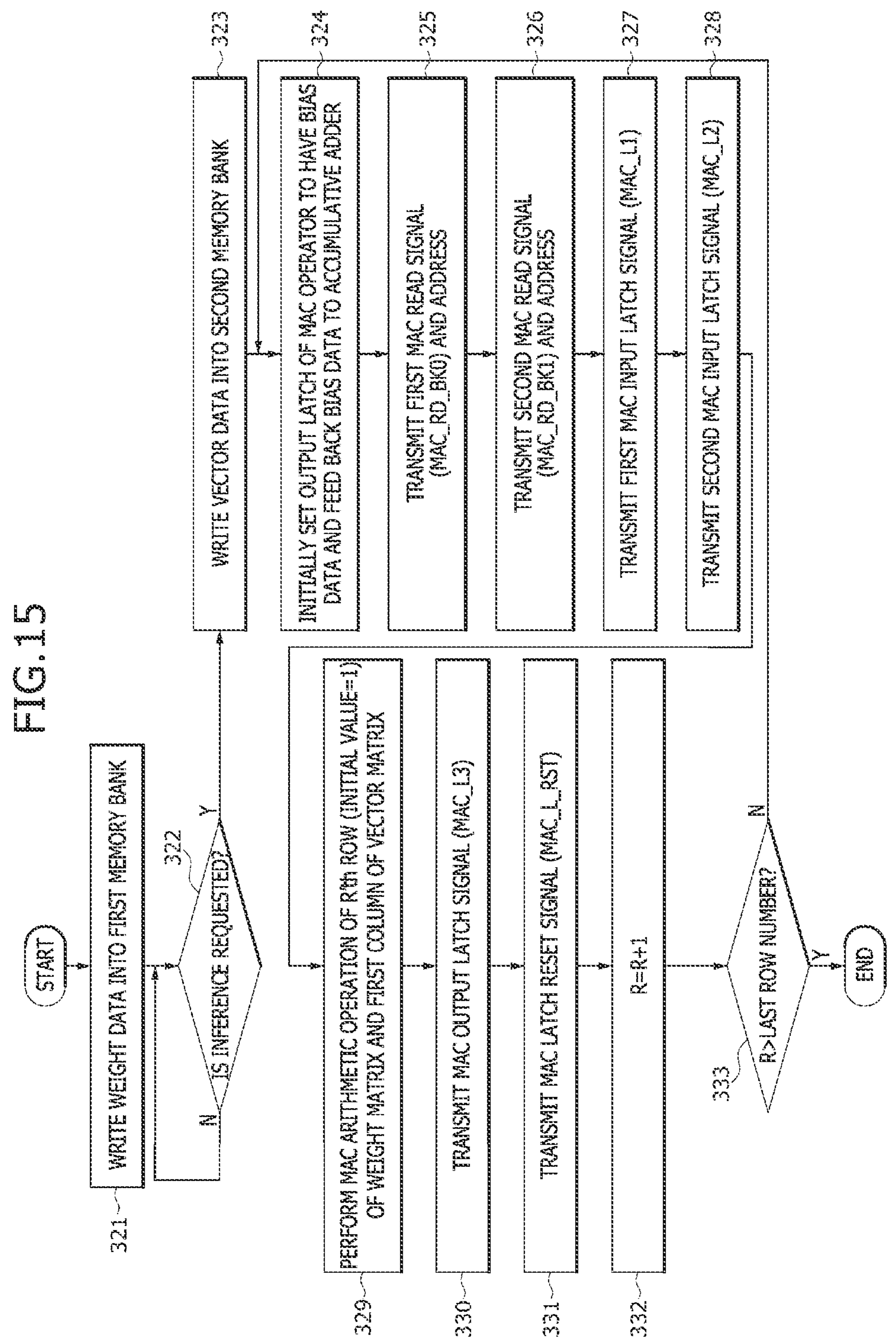
FIG.15
START
WRITE WEIGHT DATA INTO FIRST MEMORY BANK
321
IS INFERENCE REQUESTED?
322
N
Y
WRITE VECTOR DATA INTO SECOND MEMORY BANK
323
INITIALLY SET OUTPUT LATCH OF MAC OPERATOR TO HAVE BIAS DATA AND FEED BACK BIAS DATA TO ACCUMULATIVE ADDER
324
TRANSMIT FIRST MAC READ SIGNAL (MAC_RD_BK0) AND ADDRESS
325
TRANSMIT SECOND MAC READ SIGNAL (MAC_RD_BK1) AND ADDRESS
326
TRANSMIT FIRST MAC INPUT LATCH SIGNAL (MAC_L1)
327
TRANSMIT SECOND MAC INPUT LATCH SIGNAL (MAC_L2)
328
PERFORM MAC ARITHMETIC OPERATION OF R'th ROW (INITIAL VALUE=1) OF WEIGHT MATRIX AND FIRST COLUMN OF VECTOR MATRIX
329
TRANSMIT MAC OUTPUT LATCH SIGNAL (MAC_L3)
330
TRANSMIT MAC LATCH RESET SIGNAL (MAC_L_RST)
331
R=R+1
332
R>LAST ROW NUMBER?
333
N
Y
END

FIG. 16

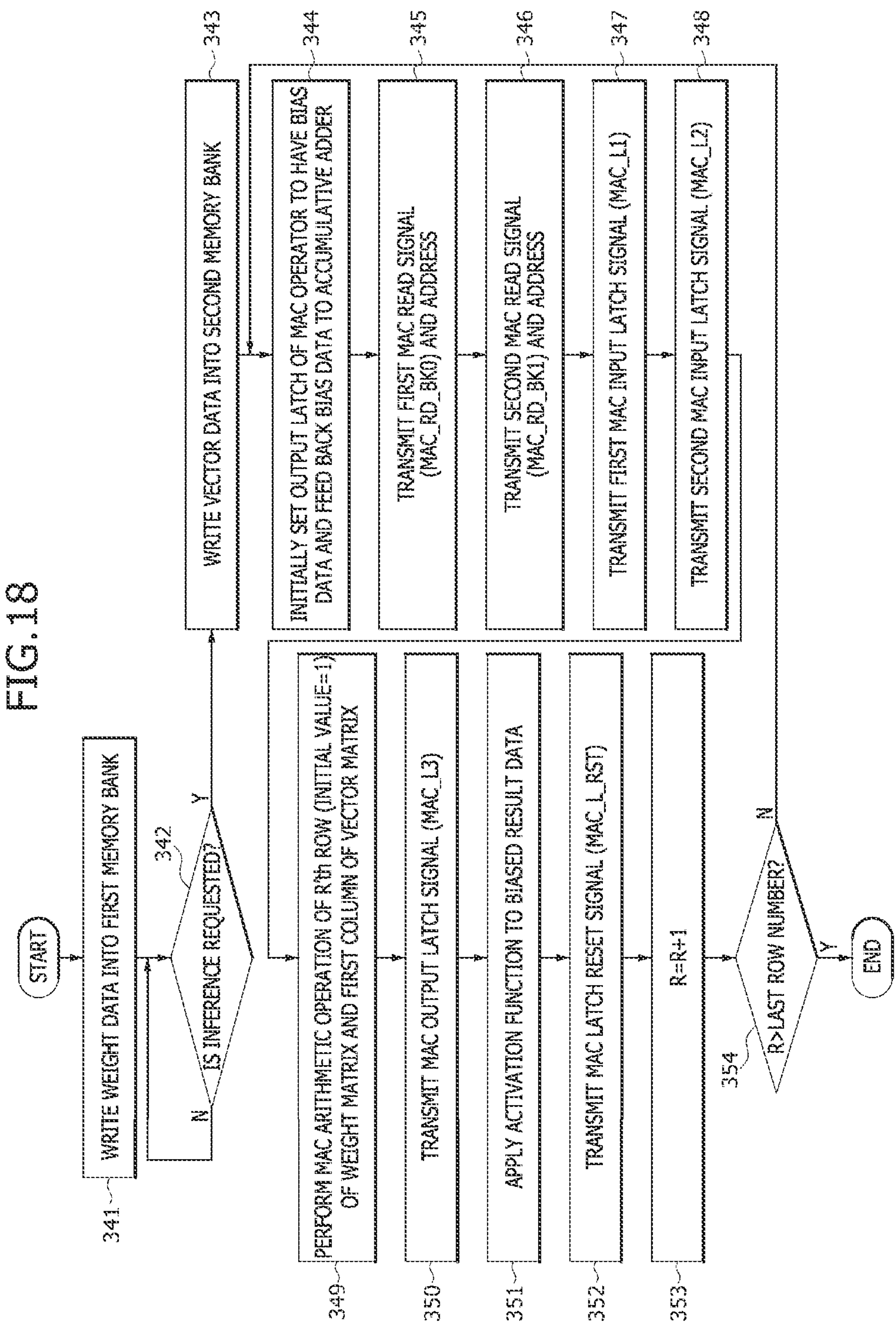
FIG.18
START
WRITE WEIGHT DATA INTO FIRST MEMORY BANK
341
IS INFERENCE REQUESTED?
342
N
Y
WRITE VECTOR DATA INTO SECOND MEMORY BANK
343
INITIALLY SET OUTPUT LATCH OF MAC OPERATOR TO HAVE BIAS DATA AND FEED BACK BIAS DATA TO ACCUMULATIVE ADDER
344
TRANSMIT FIRST MAC READ SIGNAL (MAC_RD_BK0) AND ADDRESS
345
TRANSMIT SECOND MAC READ SIGNAL (MAC_RD_BK1) AND ADDRESS
346
TRANSMIT FIRST MAC INPUT LATCH SIGNAL (MAC_L1)
347
TRANSMIT SECOND MAC INPUT LATCH SIGNAL (MAC_L2)
348
PERFORM MAC ARITHMETIC OPERATION OF R'th ROW (INITIAL VALUE=1) OF WEIGHT MATRIX AND FIRST COLUMN OF VECTOR MATRIX
349
TRANSMIT MAC OUTPUT LATCH SIGNAL (MAC_L3)
350
APPLY ACTIVATION FUNCTION TO BIASED RESULT DATA
351
TRANSMIT MAC LATCH RESET SIGNAL (MAC_L_RST)
352
R=R+1
353
R>LAST ROW NUMBER?
354
N
Y
END

Figure 19:
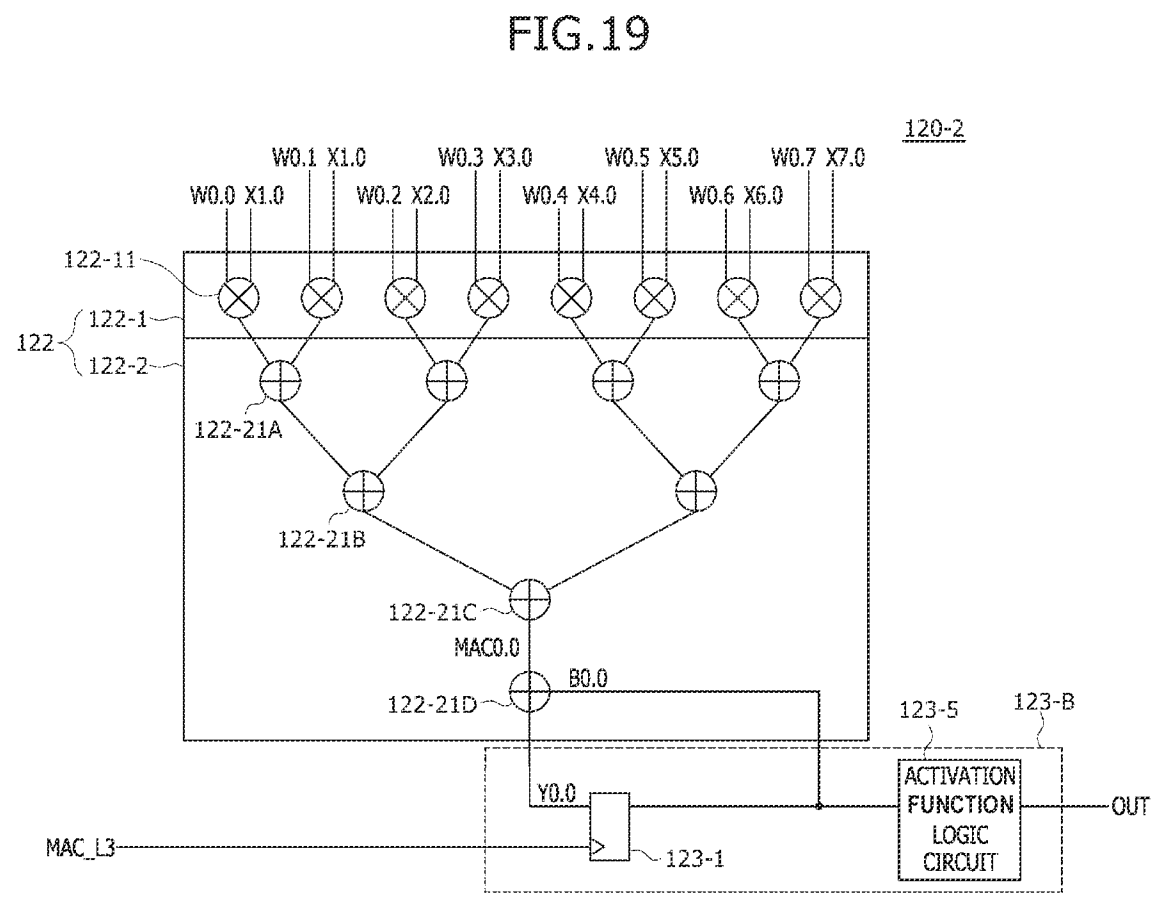

W0.0 X1.0
W0.1 X1.0
W0.2 X2.0
W0.3 X3.0
W0.4 X4.0
W0.5 X5.0
W0.6 X6.0
W0.7 X7.0
122-11
122-1
122-2
122
122-21A
122-21B
122-21C
MAC0.0
122-21D
B0.0
Y0.0
123-1
123-B
123-5
ACTIVATION FUNCTION LOGIC CIRCUIT
OUT
MAC_L3

Figure 20:
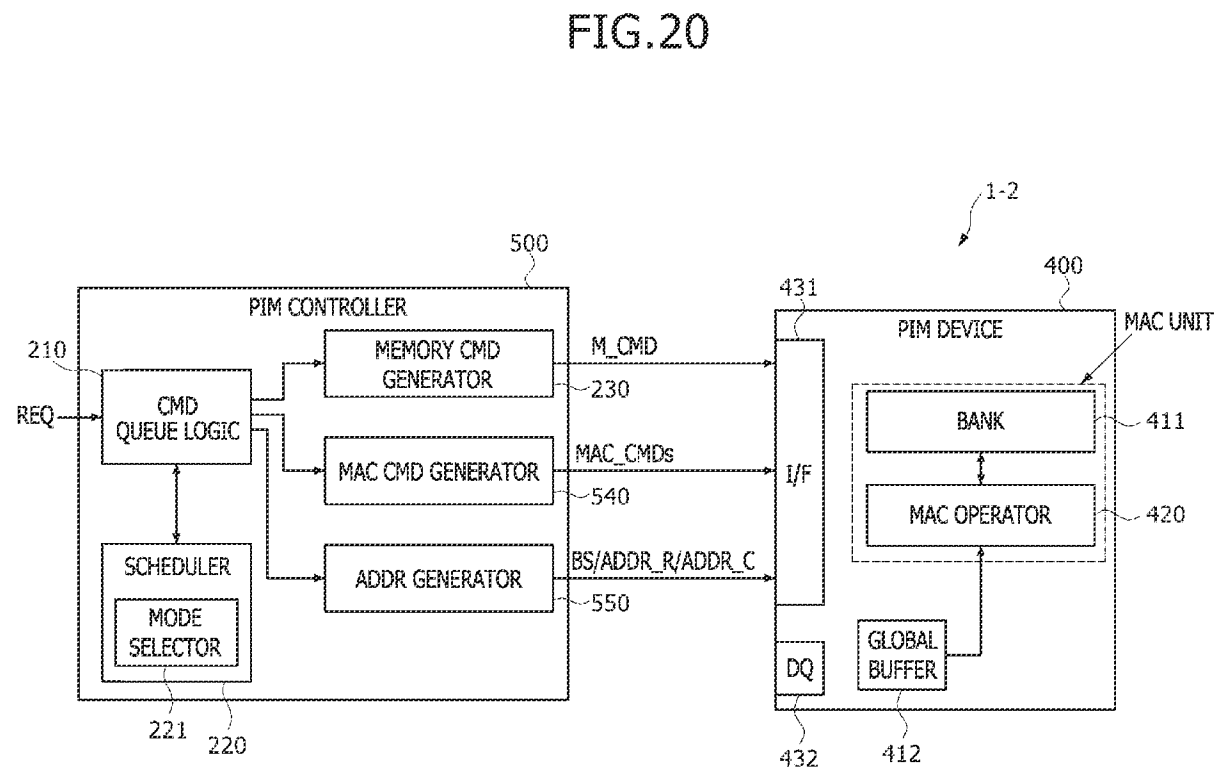

PIM CONTROLLER
500
CMD QUEUE LOGIC
210
REQ
SCHEDULER
MODE SELECTOR
221
220
MEMORY CMD GENERATOR
230
MAC CMD GENERATOR
540
ADDR GENERATOR
550
M_CMD
MAC_CMDs
BS/ADDR_R/ADDR_C

PIM DEVICE
400
I/F
431
DQ
432
MAC UNIT
BANK
411
MAC OPERATOR
420
GLOBAL BUFFER
412

FIG.25

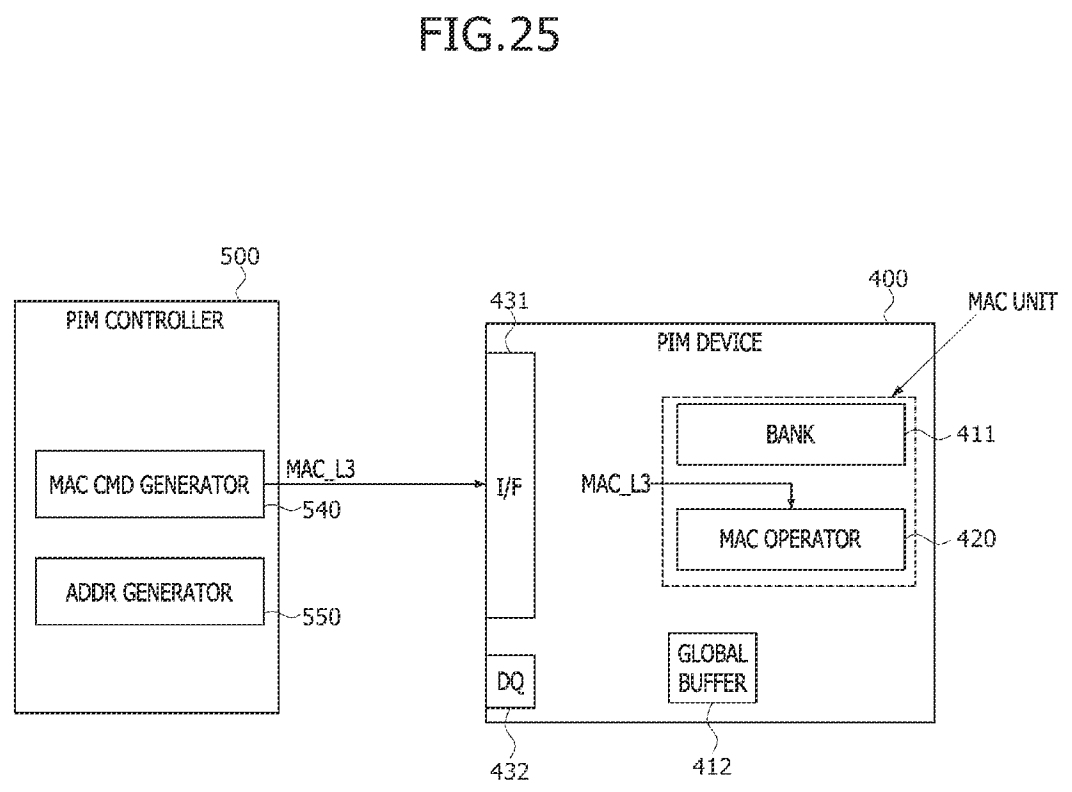

MAC UNIT
411
420
400
PIM DEVICE
BANK
MAC OPERATOR
GLOBAL BUFFER
412
MAC_L3
431
I/F
DQ
432
MAC_L3
540
550
500
PIM CONTROLLER
MAC CMD GENERATOR
ADDR GENERATOR

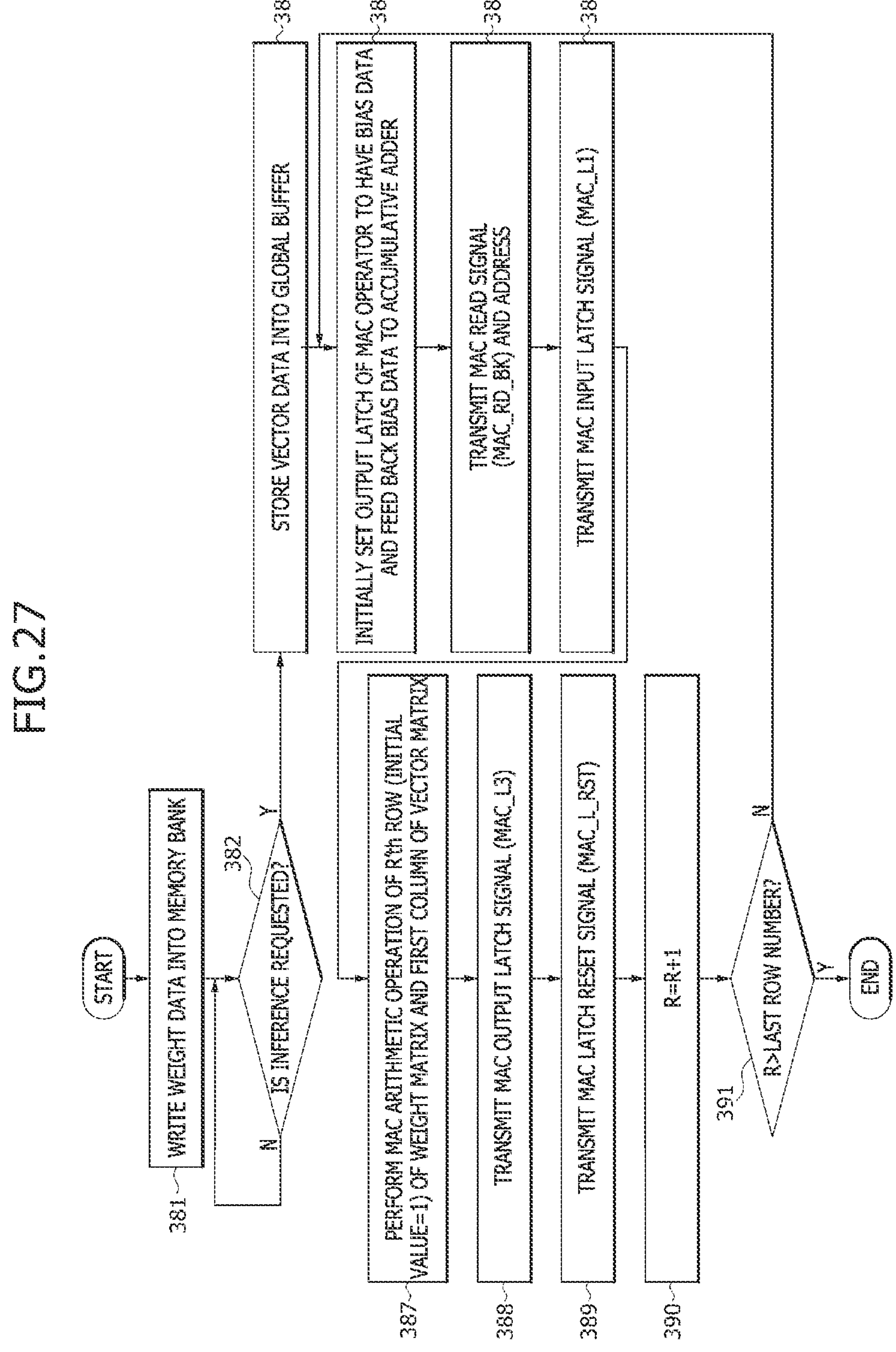
FIG.27
START
WRITE WEIGHT DATA INTO MEMORY BANK
381
IS INFERENCE REQUESTED?
382
N
Y
STORE VECTOR DATA INTO GLOBAL BUFFER
383
INITIALLY SET OUTPUT LATCH OF MAC OPERATOR TO HAVE BIAS DATA AND FEED BACK BIAS DATA TO ACCUMULATIVE ADDER
384
TRANSMIT MAC READ SIGNAL (MAC_RD_BK) AND ADDRESS
385
TRANSMIT MAC INPUT LATCH SIGNAL (MAC_L1)
386
PERFORM MAC ARITHMETIC OPERATION OF R'th ROW (INITIAL VALUE=1) OF WEIGHT MATRIX AND FIRST COLUMN OF VECTOR MATRIX
387
TRANSMIT MAC OUTPUT LATCH SIGNAL (MAC_L3)
388
TRANSMIT MAC LATCH RESET SIGNAL (MAC_L_RST)
389
R=R+1
390
R>LAST ROW NUMBER?
391
N
Y
END

Figure 29:
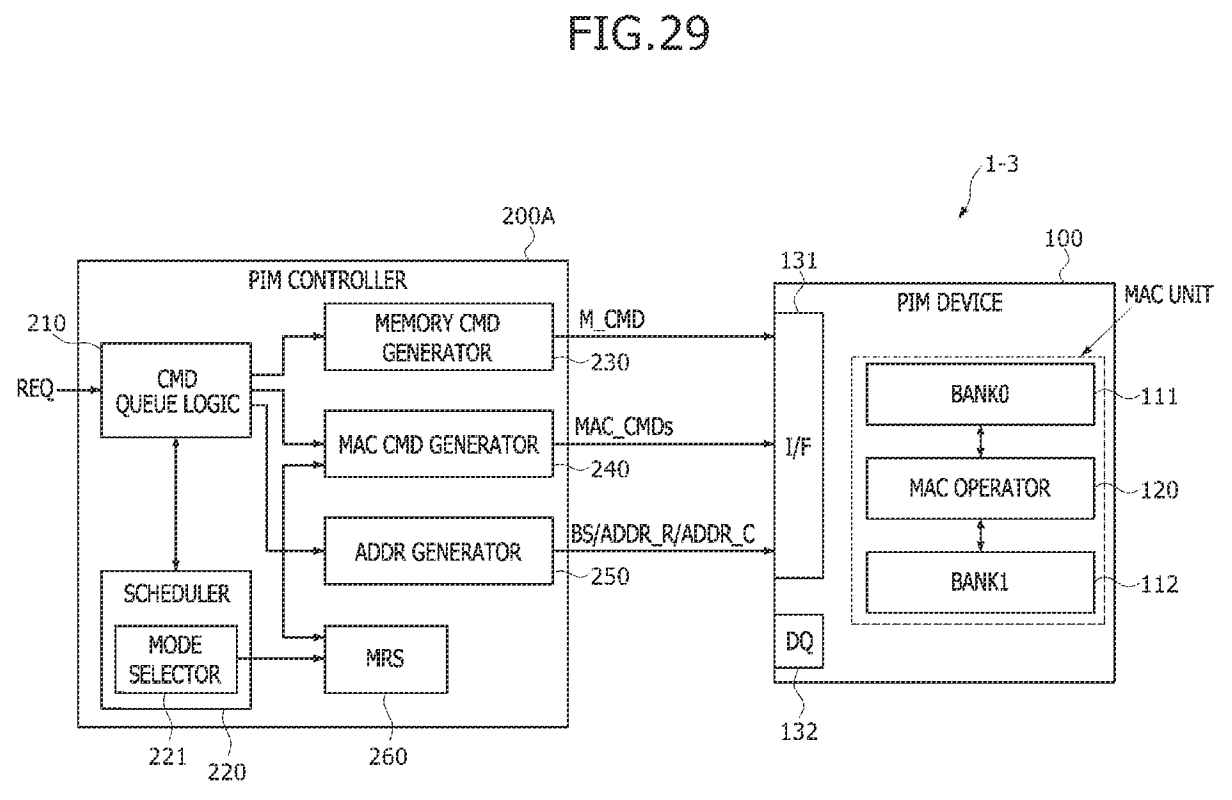

PIM DEVICE

MAC UNIT

111

120

112

BANK0

MAC OPERATOR

BANK1

131

I/F

DQ

132

M_CMD

MAC_CMDs

BS/ADDR_R/ADDR_C

200A

PIM CONTROLLER

230

240

250

MEMORY CMD GENERATOR

MAC CMD GENERATOR

ADDR GENERATOR

MRS

260

CMD QUEUE LOGIC

SCHEDULER

MODE SELECTOR

220

221

210

REQ

Figure 30:
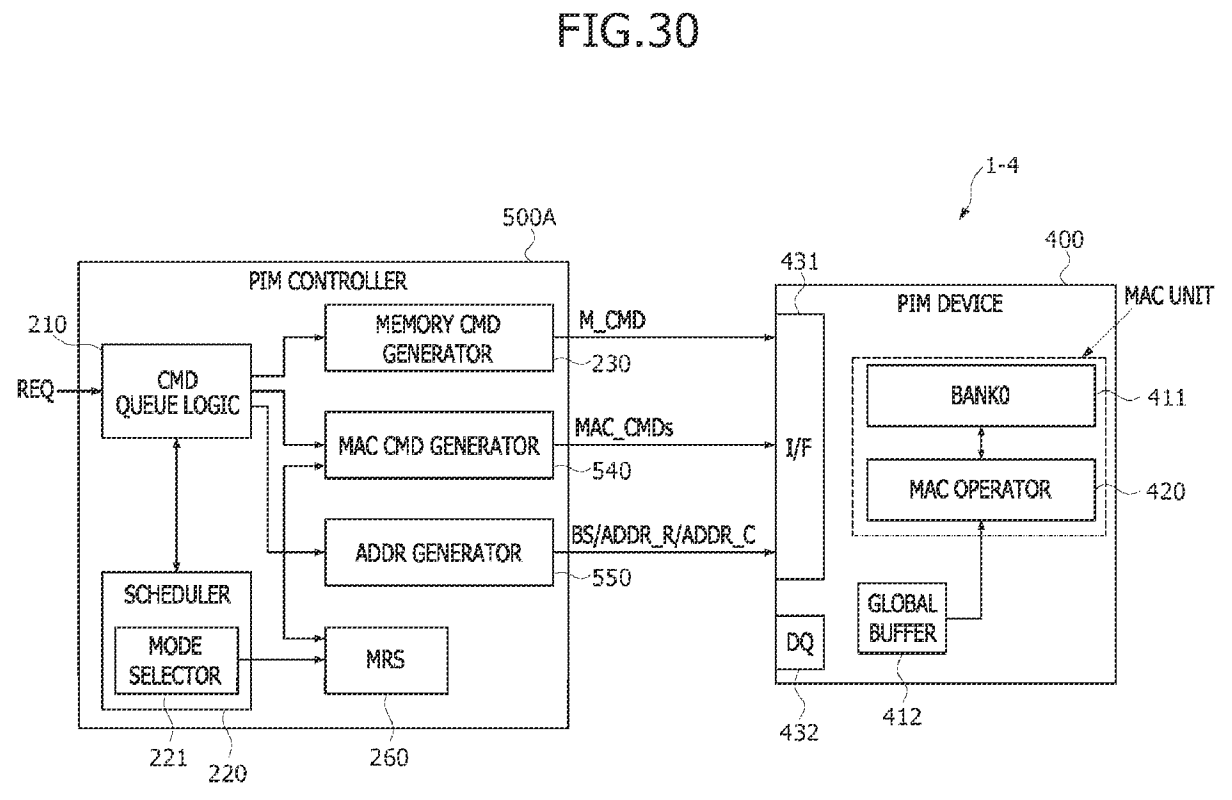

400
PIM DEVICE
MAC UNIT
411
420
BANK0
MAC OPERATOR
GLOBAL BUFFER
412
431
I/F
DQ
432

M_CMD
MAC_CMDs
BS/ADDR_R/ADDR_C

500A
PIM CONTROLLER
MEMORY CMD GENERATOR
230
MAC CMD GENERATOR
540
ADDR GENERATOR
550
MRS
260
CMD QUEUE LOGIC
SCHEDULER
MODE SELECTOR
220
221
210
REQ

FIG.31

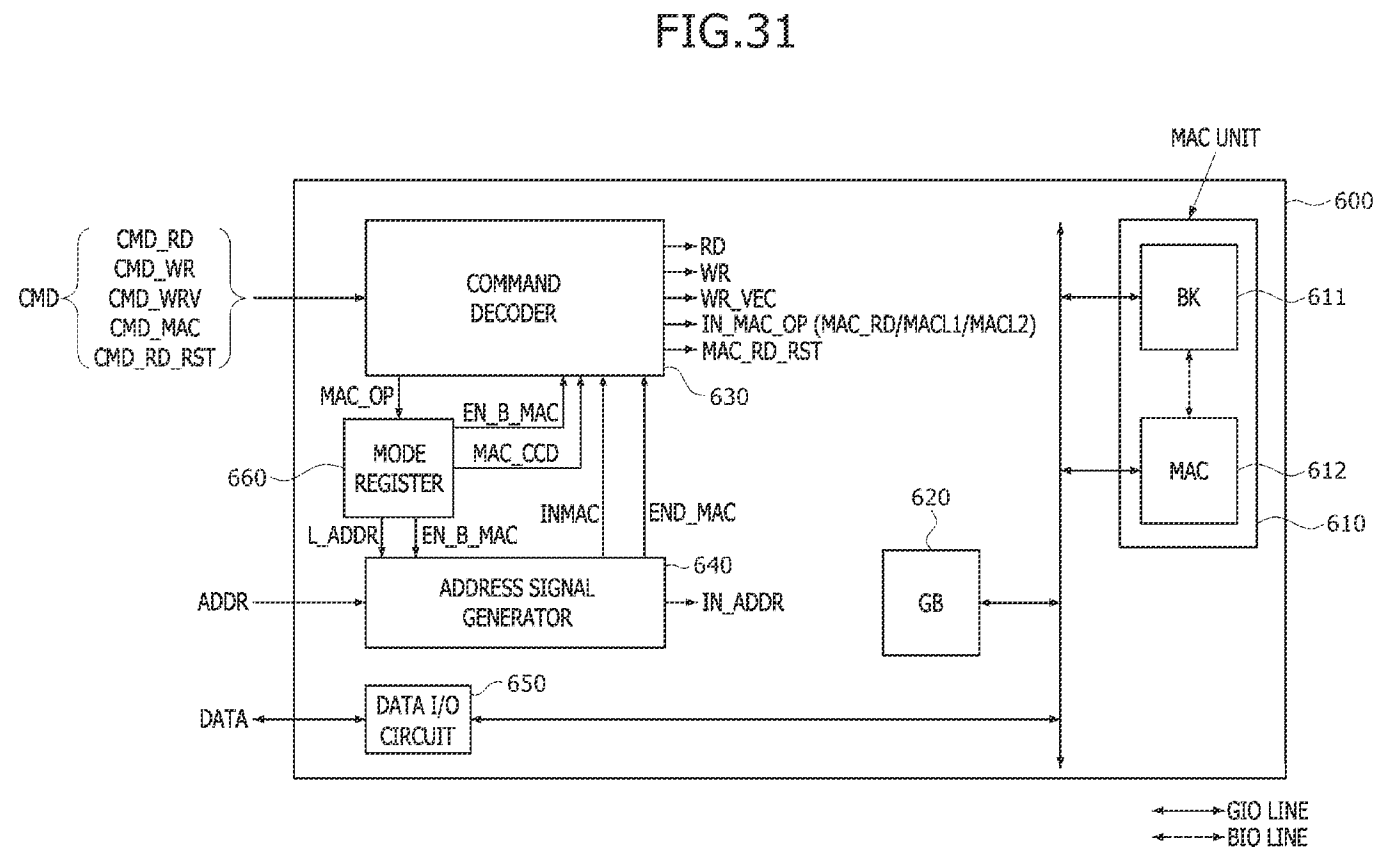

600
MAC UNIT
611
612
610
BK
MAC
GIO LINE
BIO LINE
620
GB
RD
WR
WR_VEC
IN_MAC_OP (MAC_RD/MACL1/MACL2)
MAC_RD_RST
630
COMMAND DECODER
END_MAC
640
IN_ADDR
INMAC
EN_B_MAC
MAC_CCD
MAC_OP
MODE REGISTER
EN_B_MAC
L_ADDR
ADDRESS SIGNAL GENERATOR
650
DATA I/O CIRCUIT
660
CMD
CMD_RD
CMD_WR
CMD_WRV
CMD_MAC
CMD_RD_RST
ADDR
DATA

FIG.36

635
S1
I12
I11
O1
633(1)
633(2)
633(3)
633(4)
D Q RS
"L"
"H"
2ND PULSE OF CLOCK SIGNAL

635
S1
I12
I11
O1
"L"
"H"
633(1)
633(2)
633(3)
633(4)
D Q RS
"L"
"H"
"L"
"H"
"L"
4TH PULSE OF CLOCK SIGNAL

= [ MAC_RST ]

WEIGHT MATRIX (701)

VECTOR MATRIX (702)

MAC RESULT MATRIX (703)

612
MAC OPERATOR

CLK
CMD
ADDR
MAC_OP
INMAC
IN_ADDR
MAC_RD
MACL1
MACL2
CMD_MAC
CA1
CA1
CA9
CA17
CA25
1ST MAC OPERATION
2ND MAC OPERATION
3RD MAC OPERATION
4TH MAC OPERATION
T1
T2
T3
T4
T5

FIG.44

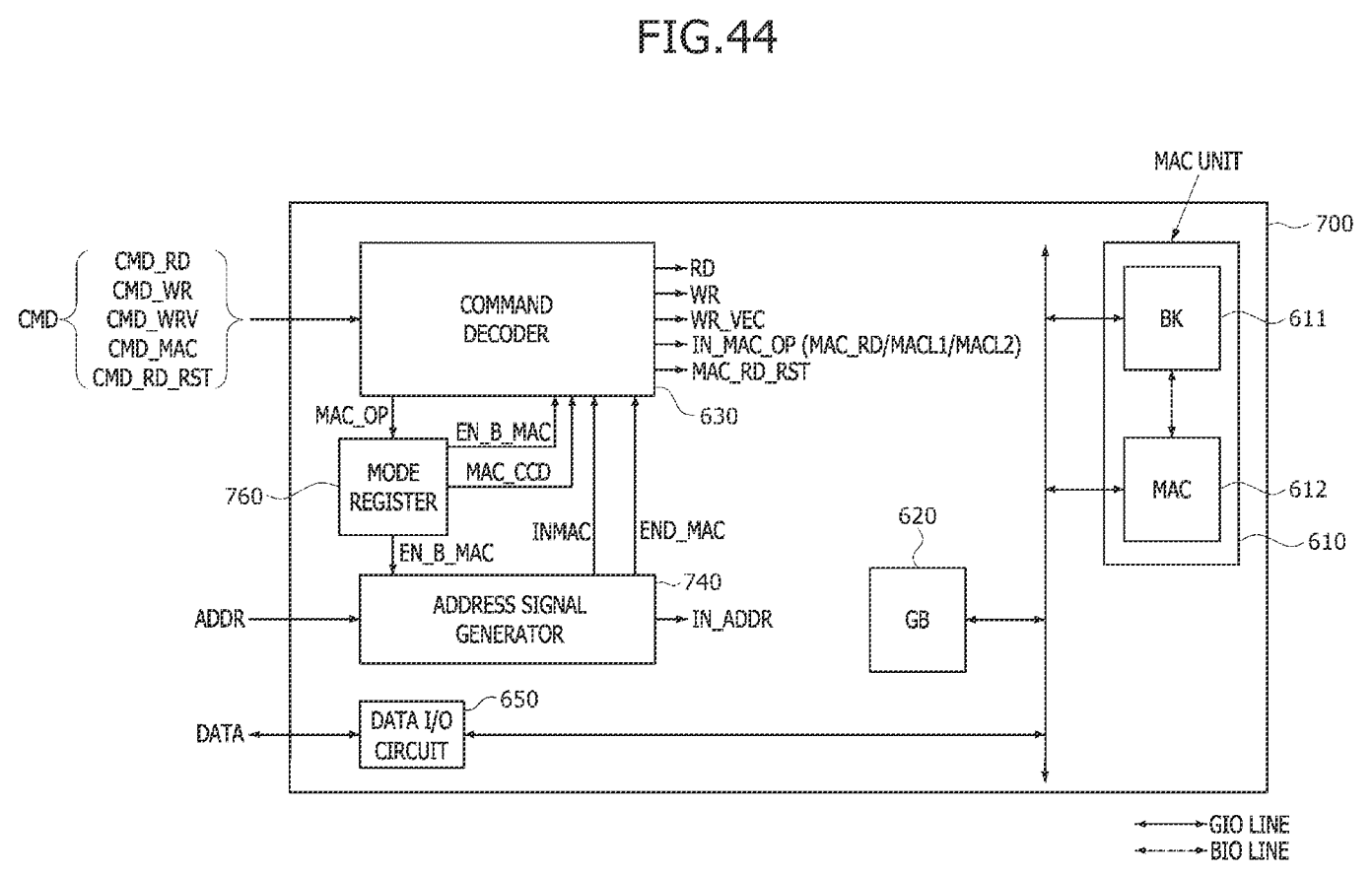

700
MAC UNIT
611
612
610
BK
MAC
620
GB
RD
WR
WR_VEC
IN_MAC_OP (MAC_RD/MACL1/MACL2)
MAC_RD_RST
630
COMMAND DECODER
END_MAC
740
IN_ADDR
INMAC
EN_B_MAC
MAC_CCD
MODE REGISTER
EN_B_MAC
ADDRESS SIGNAL GENERATOR
650
DATA I/O CIRCUIT
MAC_OP
760
CMD
CMD_RD
CMD_WR
CMD_WRV
CMD_MAC
CMD_RD_RST
ADDR
DATA
GIO LINE
BIO LINE

CLK
CMD
ADDR
MAC_OP
INMAC
IN_ADDR
MAC_RD1
MACL1
MACL2
CMD_MAC
CA4
CA1
CA9
CA17
CA25
1ST MAC OPERATION
2ND MAC OPERATION
3RD MAC OPERATION
4TH MAC OPERATION
T1
T2
T3
T4
T5

PROCESSING-IN-MEMORY (PIM) DEVICE FOR PERFORMING A BURST MULTIPLICATION AND ACCUMULATION (MAC) OPERATION

CROSS-REFERENCE TO RELATED APPLICATIONS

This is a continuation-in-part of U.S. patent application Ser. No. 17/090,462, filed Nov. 5, 2020, which claims the benefit of U.S. Provisional Application No. 62/958,223, filed on Jan. 7, 2020, and claims priority to Korean Application No. 10-2020-0006902, filed on Jan. 17, 2020, which are incorporated herein by reference in their entirety.

BACKGROUND

1. Technical Field

Various embodiments of the present disclosure relate to processing-in-memory (PIM) systems and, more particularly, to PIM systems including a MAC circuit.

2. Related Art

Recently, interest in artificial intelligence (AI) has been increasing not only in the information technology industry but also in the financial and medical industries. Accordingly, in various fields, artificial intelligence, more precisely, the introduction of deep learning, is considered and prototyped. In general, techniques for effectively learning deep neural networks (DNNs) or deep networks with increased layers as compared with general neural networks to utilize the deep neural networks (DNNs) or the deep networks in pattern recognition or inference are commonly referred to as deep learning.

One cause of this widespread interest may be the improved performance of processors performing arithmetic operations. To improve the performance of artificial intelligence, it may be necessary to increase the number of layers constituting a neural network in the artificial intelligence to educate the artificial intelligence. This trend has continued in recent years, which has led to an exponential increase in the amount of computation required for the hardware that actually does the computation. Moreover, if the artificial intelligence employs a general hardware system including memory and a processor which are separated from each other, the performance of the artificial intelligence may be degraded due to limitation of the amount of data communication between the memory and the processor. In order to solve this problem, a PIM device in which a processor and memory are integrated in one semiconductor chip has been used as a neural network computing device. Because the PIM device directly performs arithmetic operations internally, data processing speed in the neural network may be improved.

SUMMARY

A processing-in-memory (PIM) device according to an embodiment of the present disclosure may include a command decoder configured to repeatedly output internal multiplication and accumulation (MAC) operation control signals at a predetermined cycle in response to a MAC operation command received from outside the PIM device, a MAC unit configured to perform MAC operations in response to the internal MAC operation control signals, and an address signal generator configured to repeatedly transmit internal address signals designating storage positions of weight data and vector data that are used for the MAC operations to the MAC unit at the predetermined cycle, based on an address signal received from outside the PIM device.

BRIEF DESCRIPTION OF THE DRAWINGS

Certain features of the disclosed technology are illustrated in various embodiments with reference to the attached drawings.

FIG. 1 is a block diagram illustrating a PIM system according to an embodiment of the present disclosure.

FIG. 2 is a block diagram illustrating a PIM system according to a first embodiment of the present disclosure.

FIG. 4 is a block diagram illustrating an example of a configuration of a MAC operator of a PIM device included in a PIM system according to a first embodiment of the present disclosure.

FIGS. 7 to 13 are block diagrams illustrating processes of the MAC arithmetic operation illustrated in FIG. 5 in a PIM system according to a first embodiment of the present disclosure.

FIG. 15 is a flowchart illustrating processes of the MAC arithmetic operation illustrated in FIG. 14 in a PIM system according to a first embodiment of the present disclosure.

FIG. 16 illustrates an example of a configuration of a MAC operator for performing the MAC arithmetic operation of FIG. 14 in a PIM system according to a first embodiment of the present disclosure.

FIG. 18 is a flowchart illustrating processes of the MAC arithmetic operation illustrated in FIG. 17 in a PIM system according to a first embodiment of the present disclosure.

FIG. 19 illustrates an example of a configuration of a MAC operator for performing the MAC arithmetic operation of FIG. 17 in a PIM system according to a first embodiment of the present disclosure.

FIG. 20 is a block diagram illustrating a PIM system according to a second embodiment of the present disclosure.

FIGS. 23 to 26 are block diagrams illustrating processes of the MAC arithmetic operation illustrated in FIG. 5 in a PIM system according to a second embodiment of the present disclosure.

FIG. 27 is a flowchart illustrating processes of the MAC arithmetic operation illustrated in FIG. 14 in a PIM system according to a second embodiment of the present disclosure.

FIG. 29 is a block diagram illustrating a PIM system according to yet another embodiment of the present disclosure.

FIG. 30 is a block diagram illustrating a PIM system according to still another embodiment of the present disclosure.

FIG. 31 is a block diagram illustrating a PIM device according to another embodiment of the present disclosure.

FIGS. 35 to 38 are diagrams illustrating an example of a process in which an output signal of a first flip-flop is generated in the internal MAC operation signal generating circuit of FIG. 34.

FIG. 41 is a diagram illustrating an example of matrix multiplication performed by a MAC operation of the PIM device of FIG. 31.

FIG. 42 is a diagram illustrating a state in which weight data and vector data constituting weight matrix and vector matrix of FIG. 41 are stored in a memory bank and a global buffer, respectively.

FIG. 44 is a block diagram illustrating a PIM device according to still another embodiment of the present disclosure.

DETAILED DESCRIPTION OF THE EMBODIMENTS

Figure 3:
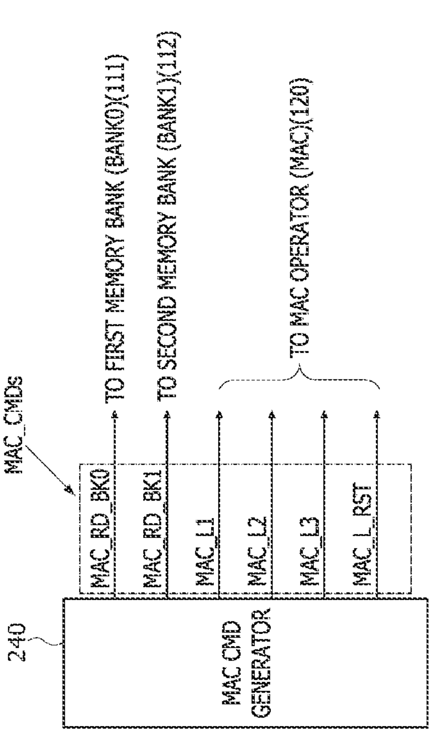
FIG. 3 illustrates MAC commands that are output from a MAC command generator of a PIM controller included in a PIM system according to a first embodiment of the present disclosure.

In the following description of embodiments, it will be understood that the terms "first" and "second" are intended to identify elements, but not used to define a particular number or sequence of elements. In addition, when an element is referred to as being located "on," "over," "above," "under," or "beneath" another element, it is intended to mean a relative positional relationship, but not used to limit certain cases in which the element directly contacts the other element, or at least one intervening element is present therebetween. Accordingly, the terms such as "on," "over," "above," "under," "beneath," "below," and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may be electrically or mechanically connected or coupled to the other element indirectly with one or more additional elements therebetween. A high level and a low level, as used herein with respect to signals, refer to logic levels of the signals. A signal having a low level distinguishes from the signal when it has a high level. For example, the high level may correspond to the signal having a first voltage, and the low level may correspond to the signal having a second voltage. For some embodiments, the first voltage is greater than the second voltage. In other embodiments, different characteristics of a signal, such as frequency or amplitude, determine whether the signal has a high level or a low level. For some cases, the high and low levels of a signal represent logical binary states.

Various embodiments are directed to PIM systems and methods of operating the PIM systems.

FIG. 1 is a block diagram illustrating a PIM system according to an embodiment of the present disclosure. As illustrated in FIG. 1, the PIM system 1 may include a PIM device 10 and a PIM controller 20. The PIM device 10 may include a data storage region 11, an arithmetic circuit 12, an interface (I/F) 13-1, and a data (DQ) input/output (I/O) pad 13-2. The data storage region 11 may include a first storage region and a second storage region. In an embodiment, the first storage region and the second storage region may be a first memory bank and a second memory bank, respectively. In another embodiment, the first data storage region and the second storage region may be a memory bank and buffer memory, respectively. The data storage region 11 may include a volatile memory element or a non-volatile memory element. For an embodiment, the data storage region 11 may include both a volatile memory element and a non-volatile memory element.

The arithmetic circuit 12 may perform an arithmetic operation on the data transferred from the data storage region 11. In an embodiment, the arithmetic circuit 12 may include a multiplying-and-accumulating (MAC) operator. The MAC operator may perform a multiplying calculation on the data transferred from the data storage region 11 and perform an accumulating calculation on the multiplication result data. After MAC operations, the MAC operator may output MAC result data. The MAC result data may be stored in the data storage region 11 or output from the PIM device 10 through the data I/O pad 13-2.

The interface 13-1 of the PIM device 10 may receive a command signal CMD and address signal ADDR from the PIM controller 20. The interface 13-1 may output the command signal CMD to the data storage region 11 or the arithmetic circuit 12 in the PIM device 10. The interface 13-1 may output the address signal ADDR to the data storage region 11 in the PIM device 10. The data I/O pad 13-2 of the PIM device 10 may function as a data communication terminal between a device external to the PIM device 10, for example the PIM controller 20, and the data storage region 11 included in the PIM device 10. The external device to the PIM device 10 may correspond to the PIM controller 20 of the PIM system 1 or a host located outside the PIM system 1. Accordingly, data that is output from the host or the PIM controller 20 may be input into the PIM device 10 through the data I/O pad 13-2.

The PIM controller 20 may control operations of the PIM device 10. In an embodiment, the PIM controller 20 may control the PIM device 10 such that the PIM device 10 operates in a memory mode or an arithmetic mode. In the event that the PIM controller 20 controls the PIM device 10 such that the PIM device 10 operates in the memory mode, the PIM device 10 may perform a data read operation or a data write operation for the data storage region 11. In the event that the PIM controller 20 controls the PIM device 10 such that the PIM device 10 operates in the arithmetic mode, the arithmetic circuit 12 of the PIM device 10 may receive first data and second data from the data storage region 11 to perform an arithmetic operation. In the event that the PIM controller 20 controls the PIM device 10 such that the PIM device 10 operates in the arithmetic mode, the PIM device 10 may also perform the data read operation and the data write operation for the data storage region 11 to execute the arithmetic operation. The arithmetic operation may be a deterministic arithmetic operation performed during a predetermined fixed time. The word "predetermined" as used herein with respect to a parameter, such as a predetermined fixed time or time period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The PIM controller 20 may be configured to include command queue logic 21, a scheduler 22, a command (CMD) generator 23, and an address (ADDR) generator 25. The command queue logic 21 may receive a request REQ from an external device (e.g., a host of the PIM system 1) and store the command queue corresponding to the request REQ in the command queue logic 21. The command queue logic 21 may transmit information on a storage status of the command queue to the scheduler 22 whenever the command queue logic 21 stores the command queue. The command queue stored in the command queue logic 21 may be transmitted to the command generator 23 according to a sequence determined by the scheduler 22. The command queue logic 21, and also the command queue logic 210 of FIGS. 2 and 20, may be implemented as hardware, software, or a combination of hardware and software. For example, the command queue logic 21 and/or 210 may be a command queue logic circuit operating in accordance with an algorithm and/or a processor executing command queue logic code.

The scheduler 22 may adjust a sequence of the command queue when the command queue stored in the command queue logic 21 is output from the command queue logic 21. In order to adjust the output sequence of the command queue stored in the command queue logic 21, the scheduler 22 may analyze the information on the storage status of the command queue provided by the command queue logic 21 and may readjust a process sequence of the command queue so that the command queue is processed according to a proper sequence.

The command generator 23 may receive the command queue related to the memory mode of the PIM device 10 and the MAC mode of the PIM device 10 from the command queue logic 21. The command generator 23 may decode the command queue to generate and output the command signal CMD. The command signal CMD may include a memory command for the memory mode or an arithmetic command for the arithmetic mode. The command signal CMD that is output from the command generator 23 may be transmitted to the PIM device 10.

The command generator 23 may be configured to generate and transmit the memory command to the PIM device 10 in the memory mode. The command generator 23 may be configured to generate and transmit a plurality of arithmetic commands to the PIM device 10 in the arithmetic mode. In one example, the command generator 23 may be configured to generate and output first to fifth arithmetic commands with predetermined time intervals in the arithmetic mode. The first arithmetic command may be a control signal for reading the first data out of the data storage region 11. The second arithmetic command may be a control signal for reading the second data out of the data storage region 11. The third arithmetic command may be a control signal for latching the first data in the arithmetic circuit 12. The fourth arithmetic command may be a control signal for latching the second data in the arithmetic circuit 12. And the fifth MAC command may be a control signal for latching arithmetic result data of the arithmetic circuit 12.

The address generator 25 may receive address information from the command queue logic 21 and generate the address signal ADDR for accessing a region in the data storage region 11. In an embodiment, the address signal ADDR may include a bank address, a row address, and a column address. The address signal ADDR that is output from the address generator 25 may be input to the data storage region 11 through the interface (I/F) 13-1.

FIG. 2 is a block diagram illustrating a PIM system 1-1 according to a first embodiment of the present disclosure. As illustrated in FIG. 2, the PIM system 1-1 may include a PIM device 100 and a PIM controller 200. The PIM device 100 may include a first memory bank (BAN KO) 111, a second memory bank (BANK1) 112, a MAC operator 120, an interface (I/F) 131, and a data input/output (I/O) pad 132. For an embodiment, the MAC operator 120 represents a MAC operator circuit. The first memory bank (BANK0) 111, the second memory bank (BANK1) 112, and the MAC operator 120 included in the PIM device 100 may constitute one MAC unit. In another embodiment, the PIM device 100 may include a plurality of MAC units. The first memory bank (BANK0) 111 and the second memory bank (BANK1) 112 may represent a memory region for storing data, for example, a DRAM device. Each of the first memory bank (BANK0) 111 and the second memory bank (BANK1) 112 may be a component unit which is independently activated and may be configured to have the same data bus width as data I/O lines in the PIM device 100. In an embodiment, the first and second memory banks 111 and 112 may operate through interleaving such that an active operation of the first and second memory banks 111 and 112 is performed in parallel while another memory bank is selected. Each of the first and second memory banks 111 and 112 may include at least one cell array which includes memory unit cells located at cross points of a plurality of rows and a plurality of columns.

Although not shown in the drawings, a core circuit may be disposed adjacent to the first and second memory banks 111 and 112. The core circuit may include X-decoders XDECs and Y-decoders/IO circuits YDEC/IOs. An X-decoder XDEC may also be referred to as a word line decoder or a row decoder. The X-decoder XDEC may receive a row address ADD_R from the PIM controller 200 and may decode the row address ADD_R to select and enable one of the rows (i.e., word lines) coupled to the selected memory bank. Each of the Y-decoders/IO circuits YDEC/IOs may include a Y-decoder YDEC and an I/O circuit IO. The Y-decoder YDEC may also be referred to as a bit line decoder or a column decoder. The Y-decoder YDEC may receive a column address ADDR_C from the PIM controller 200 and may decode the column address ADDR_C to select and enable at least one of the columns (i.e., bit lines) coupled to the selected memory bank. Each of the I/O circuits may include an I/O sense amplifier for sensing and amplifying a level of a read datum that is output from the corresponding memory bank during a read operation for the first and second memory banks 111 and 112. In addition, the I/O circuit may include a write driver for driving a write datum during a write operation for the first and second memory banks 111 and 112.

The interface 131 of the PIM device 100 may receive a memory command signal M_CMD, a MAC command signals MAC_CMDs, a bank selection signal BS, and the row/column addresses ADDR_R/ADDR_C signal from the PIM controller 200. The interface 131 may output the memory command signal M_CMD, together with the bank selection signal BS and the row/column addresses ADDR_R/ADDR_C signal, to the first memory bank 111 or the second memory bank 112. The interface 131 may output the MAC command signals MAC_CMDs to the first memory bank 111, the second memory bank 112, and the MAC operator 120. In such a case, the interface 131 may output the bank selection signal BS and the row/column addresses ADDR_R/ADDR_C signal to both of the first memory bank 111 and the second memory bank 112. The data I/O pad 132 of the PIM device 100 may function as a data communication terminal between a device external to the PIM device 100 and the MAC unit (which includes the first and second memory banks 111 and 112 and the MAC operator 120) included in the PIM device 100. The external device to the PIM device 100 may correspond to the PIM controller 200 of the PIM system 1-1 or a host located outside the PIM system 1-1. Accordingly, data that is output from the host or the PIM controller 200 may be input into the PIM device 100 through the data I/O pad 132.

The PIM controller 200 may control operations of the PIM device 100. In an embodiment, the PIM controller 200 may control the PIM device 100 such that the PIM device 100 operates in a memory mode or a MAC mode. In the event that the PIM controller 200 controls the PIM device 100 such that the PIM device 100 operates in the memory mode, the PIM device 100 may perform a data read operation or a data write operation for the first memory bank 111 and the second memory bank 112. In the event that the PIM controller 200 controls the PIM device 100 such that the PIM device 100 operates in the MAC mode, the PIM device 100 may perform a MAC arithmetic operation for the MAC operator 120. In the event that the PIM controller 200 controls the PIM device 100 such that the PIM device 100 operates in the MAC mode, the PIM device 100 may also perform the data read operation and the data write operation for the first and second memory banks 111 and 112 to execute the MAC arithmetic operation.

The PIM controller 200 may be configured to include command queue logic 210, a scheduler 220, a memory command generator 230, a MAC command generator 240, and an address generator 250. The command queue logic 210 may receive a request REQ from an external device (e.g., a host of the PIM system 1-1) and store a command queue corresponding to the request REQ in the command queue logic 210. The command queue logic 210 may transmit information on a storage status of the command queue to the scheduler 220 whenever the command queue logic 210 stores the command queue. The command queue stored in the command queue logic 210 may be transmitted to the memory command generator 230 or the MAC command generator 240 according to a sequence determined by the scheduler 220. When the command queue that is output from the command queue logic 210 includes command information requesting an operation in the memory mode of the PIM device 100, the command queue logic 210 may transmit the command queue to the memory command generator 230. On the other hand, when the command queue that is output from the command queue logic 210 is command information requesting an operation in the MAC mode of the PIM device 100, the command queue logic 210 may transmit the command queue to the MAC command generator 240. Information on whether the command queue relates to the memory mode or the MAC mode may be provided by the scheduler 220.

The scheduler 220 may adjust a timing of the command queue when the command queue stored in the command queue logic 210 is output from the command queue logic 210. In order to adjust the output timing of the command queue stored in the command queue logic 210, the scheduler 220 may analyze the information on the storage status of the command queue provided by the command queue logic 210 and may readjust a process sequence of the command queue such that the command queue is processed according to a proper sequence. The scheduler 220 may output and transmit to the command queue logic 210 information on whether the command queue that is output from the command queue logic 210 relates to the memory mode of the PIM device 100 or relates to the MAC mode of the PIM device 100. In order to obtain the information on whether the command queue that is output from the command queue logic 210 relates to the memory mode or the MAC mode, the scheduler 220 may include a mode selector 221. The mode selector 221 may generate a mode selection signal including information on whether the command queue stored in the command queue logic 210 relates to the memory mode or the MAC mode, and the scheduler 220 may transmit the mode selection signal to the command queue logic 210.

The memory command generator 230 may receive the command queue related to the memory mode of the PIM device 100 from the command queue logic 210. The memory command generator 230 may decode the command queue to generate and output the memory command signal M_CMD. The memory command signal M_CMD that is output from the memory command generator 230 may be transmitted to the PIM device 100. In an embodiment, the memory command signal M_CMD may include a memory read command signal and a memory write command signal. When the memory read command signal is output from the memory command generator 230, the PIM device 100 may perform the data read operation for the first memory bank 111 or the second memory bank 112. Data which are read out of the PIM device 100 may be transmitted to an external device through the data I/O pad 132. The read data that is output from the PIM device 100 may be transmitted to a host through the PIM controller 200. When the memory write command signal is output from the memory command generator 230, the PIM device 100 may perform the data write operation for the first memory bank 111 or the second memory bank 112. In such a case, data to be written into the PIM device 100 may be transmitted from the host to the PIM device 100 through the PIM controller 200. The write data that is input to the PIM device 100 may be transmitted to the first memory bank 111 or the second memory bank 112 through the data I/O pad 132.

The MAC command generator 240 may receive the command queue related to the MAC mode of the PIM device 100 from the command queue logic 210. The MAC command generator 240 may decode the command queue to generate and output the MAC command signals MAC_CMDs. The MAC command signals MAC_CMDs that is output from the MAC command generator 240 may be transmitted to the PIM device 100. The data read operation for the first memory bank 111 and the second memory bank 112 of the PIM device 100 may be performed by the MAC command signals MAC_CMDs that is output from the MAC command generator 240, and the MAC arithmetic operation of the MAC operator 120 may also be performed by the MAC command signals MAC_CMDs that is output from the MAC command generator 240. The MAC command signals MAC_CMDs and the MAC arithmetic operation of the PIM device 100 according to the MAC command signals MAC_CMDs will be described in detail with reference to FIG. 3.

The address generator 250 may receive address information from the command queue logic 210. The address generator 250 may generate the bank selection signal BS for selecting one of the first and second memory banks 111 and 112 and may transmit the bank selection signal BS to the PIM device 100. In addition, the address generator 250 may generate the row address signal ADDR_R and the column address signal ADDR_C for accessing a region (e.g., memory cells) in the first or second memory bank 111 or 112 and may transmit the row address signal ADDR_R and the column address signal ADDR_C to the PIM device 100.

FIG. 3 illustrates the MAC command MAC_CMDs signals that are output from the MAC command generator 240 included in the PIM system 1-1 according to the first embodiment of the present disclosure. As illustrated in FIG. 3, the MAC command signals MAC_CMDs may include first to sixth MAC command signals. In an embodiment, the first MAC command signal may be a first MAC read signal MAC_RD_BK0, the second MAC command signal may be a second MAC read signal MAC_RD_BK1, the third MAC command signal may be a first MAC input latch signal MAC_L1, the fourth MAC command signal may be a second MAC input latch signal MAC_L2, the fifth MAC command signal may be a MAC output latch signal MAC_L3, and the sixth MAC command signal may be a MAC latch reset signal MAC_L_RST.

The first MAC read signal MAC_RD_BK0 may control an operation for reading first data (e.g., weight data) out of the first memory bank 111 to transmit the first data to the MAC operator 120. The second MAC read signal MAC_RD_BK1 may control an operation for reading second data (e.g., vector data) out of the second memory bank 112 to transmit the second data to the MAC operator 120. The first MAC input latch signal MAC_L1 may control an input latch operation of the weight data transmitted from the first memory bank 111 to the MAC operator 120. The second MAC input latch signal MAC_L2 may control an input latch operation of the vector data transmitted from the second memory bank 112 to the MAC operator 120. If the input latch operations of the weight data and the vector data are performed, the MAC operator 120 may perform the MAC arithmetic operation to generate MAC result data corresponding to the result of the MAC arithmetic operation. The MAC output latch signal MAC_L3 may control an output latch operation of the MAC result data generated by the MAC operator 120. And, the MAC latch reset signal MAC_L_RST may control an output operation of the MAC result data generated by the MAC operator 120 and a reset operation of an output latch included in the MAC operator 120.

The PIM system 1-1 according to the present embodiment may be configured to perform a deterministic MAC arithmetic operation. The term "deterministic MAC arithmetic operation" used in the present disclosure may be defined as the MAC arithmetic operation performed in the PIM system 1-1 during a predetermined fixed time. Thus, the MAC commands MAC_CMDs transmitted from the PIM controller 200 to the PIM device 100 may be sequentially generated with fixed time intervals. Accordingly, the PIM controller 200 does not require any extra end signals of various operations executed for the MAC arithmetic operation to generate the MAC commands MAC_CMDs for controlling the MAC arithmetic operation. In an embodiment, latencies of the various operations executed by MAC command signals MAC_CMDs for controlling the MAC arithmetic operation may be set to have fixed values in order to perform the deterministic MAC arithmetic operation. In such a case, the MAC command signals MAC_CMDs may be sequentially output from the PIM controller 200 with fixed time intervals corresponding to the fixed latencies.

For example, the MAC command generator 240 is configured to output the first MAC command signal at a first point in time. The MAC command generator 240 is configured to output the second MAC command signal at a second point in time when a first latency elapses from the first point in time. The first latency is set as the time it takes to read the first data out of the first storage region based on the first MAC command and to output the first data to the MAC operator. The MAC command generator 240 is configured to output the third MAC command signal at a third point in time when a second latency elapses from the second point in time. The second latency is set as the time it takes to read the second data out of the second storage region based on the second MAC command signal and to output the MAC operator based on the third MAC command signal. The MAC command generator 240 is configured to output the fifth MAC command second data to the MAC operator. The MAC command generator 240 is configured to output the fourth MAC command signal at a fourth point in time when a third latency elapses from the third point in time. The third latency is set as the time it takes to latch the first data at a fifth point in time when a fourth latency elapses from the fourth point in time. The fourth latency is set as the time it takes to latch the second data in the MAC operator based on the fourth MAC command signal and to perform the MAC arithmetic operation of the first and second data which are latched in the MAC operator. The MAC command generator 240 is configured to output the sixth MAC command signal at a sixth point in time when a fifth latency elapses from the fifth point in time. The fifth latency is set as the time it takes to perform an output latch operation of MAC result data generated by the MAC arithmetic operation.

FIG. 4 illustrates an example of the MAC operator 120 of the PIM device 100 included in the PIM system 1-1 according to the first embodiment of the present disclosure. Referring to FIG. 4, MAC operator 120 may be configured to include a data input circuit 121, a MAC circuit 122, and a data output circuit 123. The data input circuit 121 may include a first input latch 121-1 and a second input latch 121-2. The MAC circuit 122 may include a multiplication logic circuit 122-1 and an addition logic circuit 122-2. The data output circuit 123 may include an output latch 123-1, a transfer gate 123-2, a delay circuit 123-3, and an inverter 123-4. In an embodiment, the first input latch 121-1, the second input latch 121-2, and the output latch 123-1 may be realized using flip-flops.

The data input circuit 121 of the MAC operator 120 may be synchronized with the first MAC input latch signal MAC_L1 to latch first data DA1 transferred from the first memory bank 111 to the MAC circuit 122 through an internal data transmission line. In addition, the data input circuit 121 of the MAC operator 120 may be synchronized with the second MAC input latch signal MAC_L2 to latch second data DA2 transferred from the second memory bank 112 to the MAC circuit 122 through another internal data transmission line. Because the first MAC input latch signal MAC_L1 and the second MAC input latch signal MAC_L2 are sequentially transmitted from the MAC command generator 240 of the PIM controller 200 to the MAC operator 120 of the PIM device 100 with a predetermined time interval, the second data DA2 may be input to the MAC circuit 122 of the MAC operator 120 after the first data DA1 is input to the MAC circuit 122 of the MAC operator 120.

The MAC circuit 122 may perform the MAC arithmetic operation of the first data DA1 and the second data DA2, input through the data input circuit 121. The multiplication logic circuit 122-1 of the MAC circuit 122 may include a plurality of multipliers 122-11. Each of the multipliers 122-11 may perform a multiplying calculation of the first data DA1 that is output from the first input latch 121-1 and the second data DA2 that is output from the second input latch 121-2 and may output the result of the multiplying calculation. Bit values constituting the first data DA1 may be separately input to the multipliers 122-11. Similarly, bit values constituting the second data DA2 may also be separately input to the multipliers 122-11. For example, if the first data DA1 is represented by an 'N'-bit binary stream, the second data DA2 is represented by an 'N'-bit binary stream, and the number of the multipliers 122-11 is 'M', then 'N/M'-bit portions of the first data DA1 and 'N/M'-bit portions of the second data DA2 may be input to each of the multipliers 122-11.

The addition logic circuit 122-2 of the MAC circuit 122 may include a plurality of adders 122-21. Although not shown in the drawings, the plurality of adders 122-21 may be disposed to provide a tree structure including a plurality of stages. Each of the adders 122-21 disposed at a first stage may receive two sets of multiplication result data from two of the multipliers 122-11 included in the multiplication logic circuit 122-1 and may perform an adding calculation of the two sets of multiplication result data to output the addition result data. Each of the adders 122-21 disposed at a second stage may receive two sets of addition result data from two of the adders 122-21 disposed at the first stage and may perform an adding calculation of the two sets of addition result data to output the addition result data. The adder 122-21 disposed at a last stage may receive two sets of addition result data from two adders 122-21 disposed at the previous stage and may perform an adding calculation of the two sets of addition result data to output the addition result data. Although not shown in the drawings, the addition logic circuit 122-2 may further include an additional adder for performing an accumulative adding calculation of MAC result data DA_MAC that is output from the adder 122-21 disposed at the last stage and previous MAC result data DA_MAC stored in the output latch 123-1 of the data output circuit 123.

The data output circuit 123 may output the MAC result data DA_MAC that is output from the MAC circuit 122 to a data transmission line. Specifically, the output latch 123-1 of the data output circuit 123 may be synchronized with the MAC output latch signal MAC_L3 to latch the MAC result data DA_MAC that is output from the MAC circuit 122 and to output the latched data of the MAC result data DA_MAC. The MAC result data DA_MAC that is output from the output latch 123-1 may be fed back to the MAC circuit 122 for the accumulative adding calculation. In addition, the MAC result data DA_MAC may be input to the transfer gate 123-2. The output latch 123-1 may be initialized if a latch reset signal LATCH_RST is input to the output latch 123-1. In such a case, all of data latched by the output latch 123-1 may be removed. In an embodiment, the latch reset signal LATCH_RST may be activated by generation of the MAC latch reset signal MAC_L_RST and may be input to the output latch 123-1.

The MAC latch reset signal MAC_L_RST that is output from the MAC command generator 240 may be input to the transfer gate 123-2, the delay circuit 123-3, and the inverter 123-4. The inverter 123-4 may inversely buffer the MAC latch reset signal MAC_L_RST to output the inversely buffered signal of the MAC latch reset signal MAC_L_RST to the transfer gate 123-2. The transfer gate 123-2 may transfer the MAC result data DA_MAC from the output latch 123-1 to the data transmission line in response to the MAC latch reset signal MAC_L_RST. The delay circuit 123-3 may delay the MAC latch reset signal MAC_L_RST by a certain time to generate and output a latch control signal PINSTB.

Figure 5:
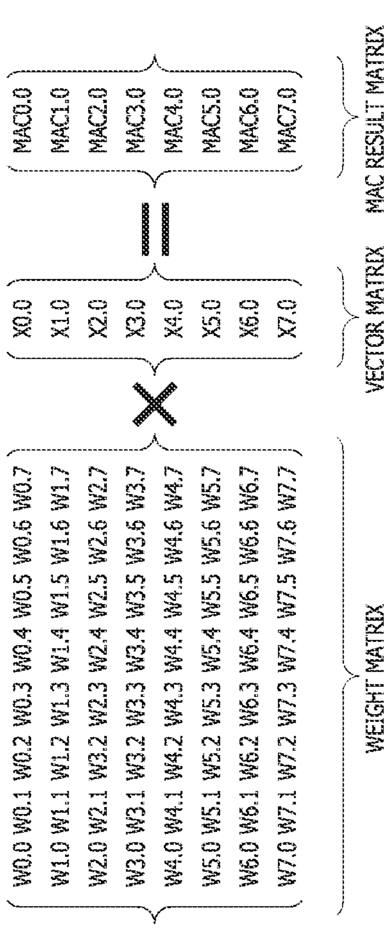
FIG. 5 illustrates an example of a MAC arithmetic operation performed in a PIM system according to a first embodiment of the present disclosure.

FIG. 5 illustrates an example of the MAC arithmetic operation performed in the PIM system 1-1 according to the first embodiment of the present disclosure. As illustrated in FIG. 5, the MAC arithmetic operation performed by the PIM system 1-1 may be executed though a matrix calculation. Specifically, the PIM device 100 may execute a matrix multiplying calculation of an 'M×N' weight matrix (e.g., '8×8' weight matrix) and a 'N×1' vector matrix (e.g., '8×1' vector matrix) according to control of the PIM controller 200 (where, 'M' and 'N' are natural numbers). Elements W0.0, . . . , and W7.7 constituting the weight matrix may correspond to the first data DA1 that is input to the MAC operator 120 from the first memory bank 111. Elements X0.0, . . . , and X7.0 constituting the vector matrix may correspond to the second data DA2 that is input to the MAC operator 120 from the second memory bank 112. Each of the elements W0.0, . . . , and W7.7 constituting the weight matrix may be represented by a binary stream with a plurality of bit values. In addition, each of the elements X0.0, . . . , and X7.0 constituting the vector matrix may also be represented by a binary stream with a plurality of bit values. The number of bits included in each of the elements W0.0, . . . , and W7.7 constituting the weight matrix may be equal to the number of bits included in each of the elements X0.0, . . . , and X7.0 constituting the vector matrix.

The matrix multiplying calculation of the weight matrix and the vector matrix may be appropriate for a multilayer perceptron-type neural network structure (hereinafter, referred to as an 'MLP-type neural network'). In general, the MLP-type neural network for executing deep learning may include an input layer, a plurality of hidden layers (e.g., at least three hidden layers), and an output layer. The matrix multiplying calculation (i.e., the MAC arithmetic operation) of the weight matrix and the vector matrix illustrated in FIG. 5 may be performed in one of the hidden layers. In a first hidden layer of the plurality of hidden layers, the MAC arithmetic operation may be performed using vector data that is input to the first hidden layer. However, in each of second to last hidden layers among the plurality of hidden layers, the MAC arithmetic operation may be performed using a calculation result of the previous hidden layer as the vector data.

Figure 6:
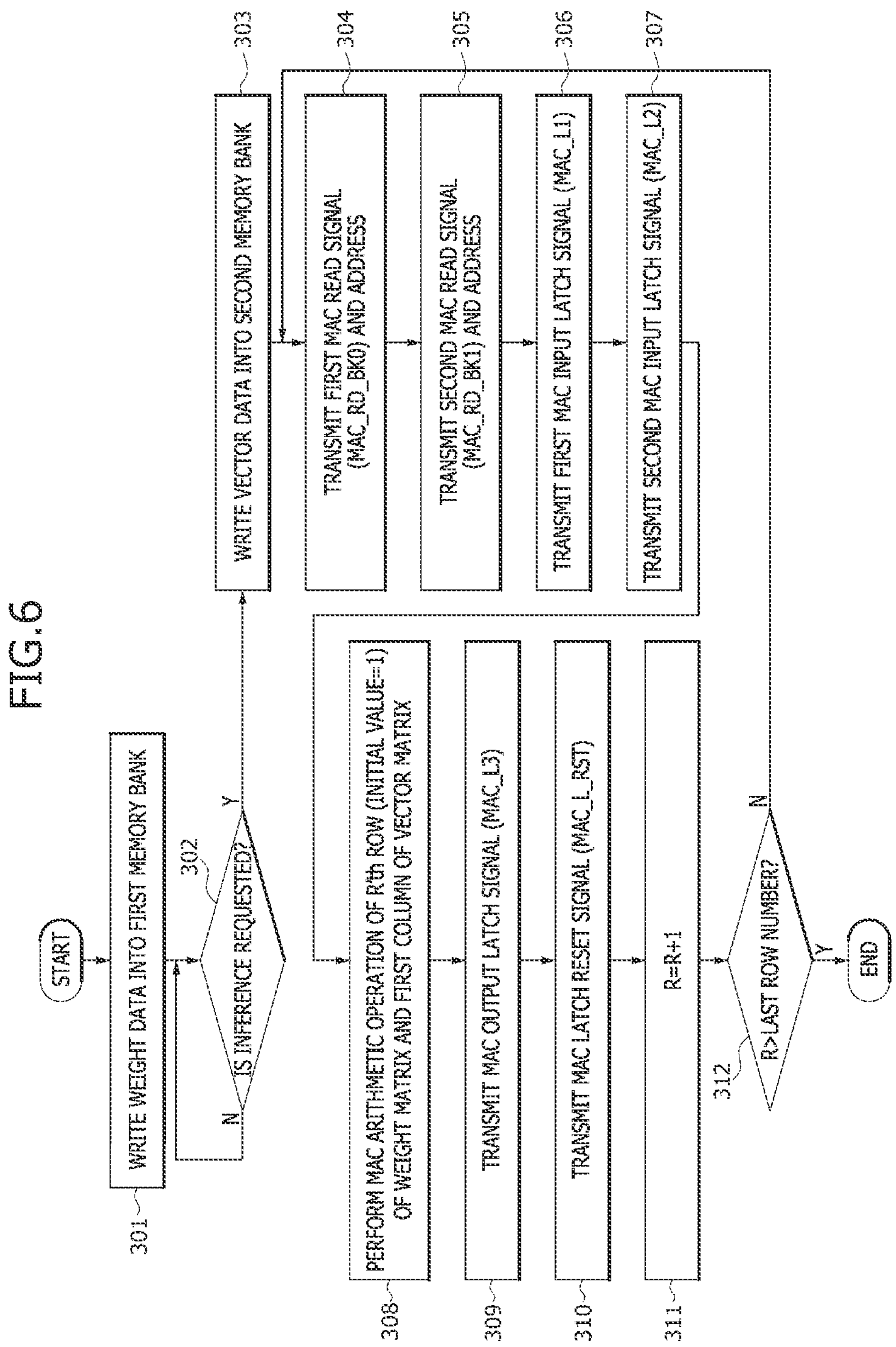
FIG. 6 is a flowchart illustrating processes of the MAC arithmetic operation illustrated in FIG. 5 in a PIM system according to a first embodiment of the present disclosure.

FIG. 6 is a flowchart illustrating processes of the MAC arithmetic operation described with reference to FIG. 5, which are performed in the PIM system 1-1 according to the first embodiment of the present disclosure. In addition, FIGS. 7 to 13 are block diagrams illustrating the processes of the MAC arithmetic operation illustrated in FIG. 5, which are performed in the PIM system 1-1 according to the first embodiment of the present disclosure. Referring to FIGS. 6 to 13, before the MAC arithmetic operation is performed, the first data (i.e., the weight data) may be written into the first memory bank 111 at a step 301. Thus, the weight data may be stored in the first memory bank 111 of the PIM device 100. In the present embodiment, it may be assumed that the weight data are the elements W0.0, . . . , and W7.7 constituting the weight matrix of FIG. 5. The integer before the decimal point is one less than a row number, and the integer after the decimal point is one less than a column number. Thus, for example, the weight W0.0 represents the element of the first row and the first column of the weight matrix.

At a step 302, whether an inference is requested may be determined. An inference request signal may be transmitted from an external device located outside of the PIM system 1-1 to the PIM controller 200 of the PIM system 1-1. An inference request, in some instances, may be based on user input. An inference request may initiate a calculation performed by the PIM system 1-1 to reach a determination based on input data. In an embodiment, if no inference request signal is transmitted to the PIM controller 200, the PIM system 1-1 may be in a standby mode until the inference request signal is transmitted to the PIM controller 200. Alternatively, if no inference request signal is transmitted to the PIM controller 200, the PIM system 1-1 may perform operations (e.g., data read/write operations) other than the MAC arithmetic operation in the memory mode until the inference request signal is transmitted to the PIM controller 200. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 5. If the inference request signal is transmitted to the PIM controller 200 at the step 302, then the PIM controller 200 may write the vector data transmitted with the inference request signal into the second memory bank 112 at a step 303. Accordingly, the vector data may be stored in the second memory bank 112 of the PIM device 100.

Figure 7:
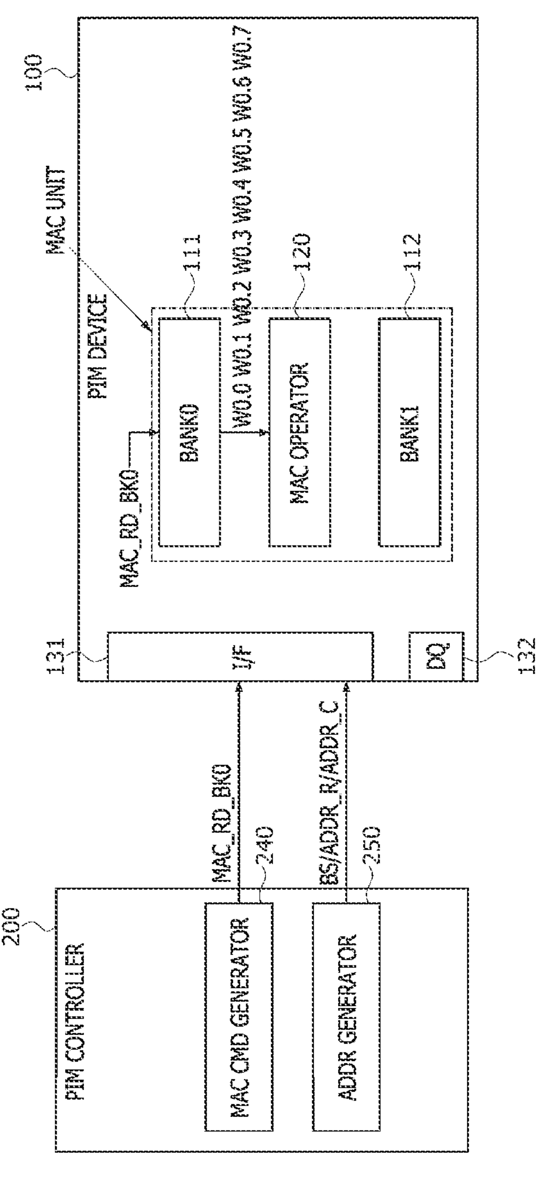

At a step 304, the MAC command generator 240 of the PIM controller 200 may generate and transmit the first MAC read signal MAC_RD_BK0 to the PIM device 100, as illustrated in FIG. 7. In such a case, the address generator 250 of the PIM controller 200 may generate and transmit the bank selection signal BS and the row/column address ADDR_R/ADDR_C to the PIM device 100. The bank selection signal BS may be generated to select the first memory bank 111 of the first and second memory banks 111 and 112. Thus, the first MAC read signal MAC_RD_BK0 may control the data read operation for the first memory bank 111 of the PIM device 100. The first memory bank 111 may output and transmit the elements W0.0, . . . , and W0.7 in the first row of the weight matrix of the weight data stored in a region of the first memory bank 111, which is selected by the row/column address ADDR_R/ADDR_C, to the MAC operator 120 in response to the first MAC read signal MAC_RD_BK0. In an embodiment, the data transmission from the first memory bank 111 to the MAC operator 120 may be executed through a global input/output (hereinafter, referred to as 'GIO') line which is provided as a data transmission path in the PIM device 100. Alternatively, the data transmission from the first memory bank 111 to the MAC operator 120 may be executed through a first bank input/output (hereinafter, referred to as 'BIO') line which is provided specifically for data transmission between the first memory bank 111 and the MAC operator 120.

Figure 8:
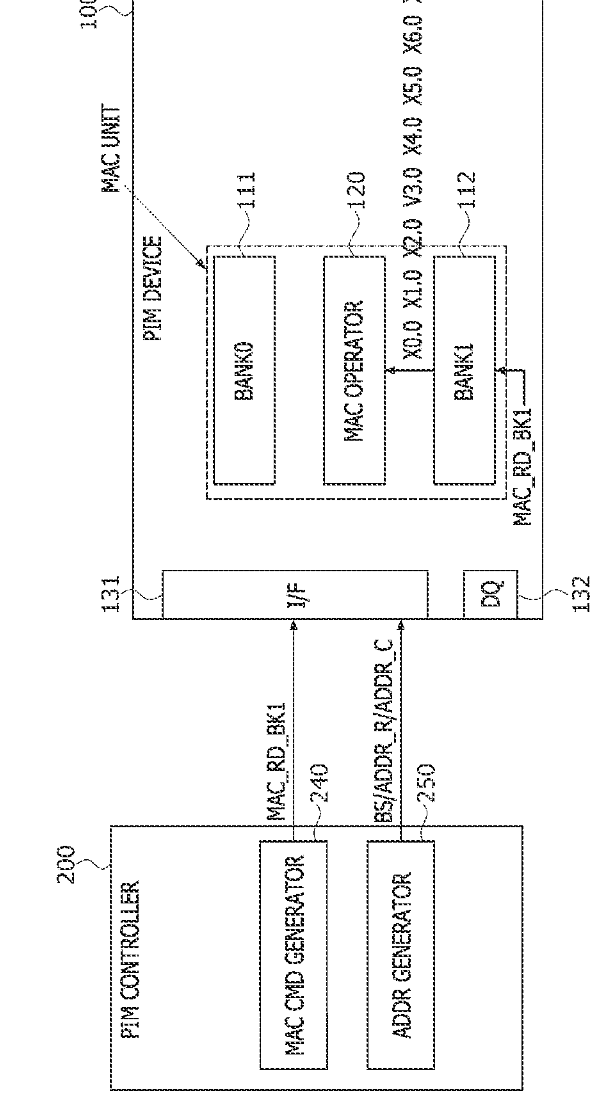

At a step 305, the MAC command generator 240 of the PIM controller 200 may generate and transmit the second MAC read signal MAC_RD_BK1 to the PIM device 100, as illustrated in FIG. 8. In such a case, the address generator 250 of the PIM controller 200 may generate and transmit the bank selection signal BS for selecting the second memory bank 112 and the row/column address ADDR_R/ADDR_C to the PIM device 100. The second MAC read signal MAC_RD_BK1 may control the data read operation for the second memory bank 112 of the PIM device 100. The second memory bank 112 may output and transmit the elements X0.0, . . . , and X7.0 in the first column of the vector matrix corresponding to the vector data stored in a region of the second memory bank 112, which is selected by the row/column address ADDR_R/ADDR_C, to the MAC operator 120 in response to the second MAC read signal MAC_RD_BK1. In an embodiment, the data transmission from the second memory bank 112 to the MAC operator 120 may be executed through the GIO line in the PIM device 100. Alternatively, the data transmission from the second memory bank 112 to the MAC operator 120 may be executed through a second BIO line which is provided specifically for data transmission between the second memory bank 112 and the MAC operator 120.

Figure 11:
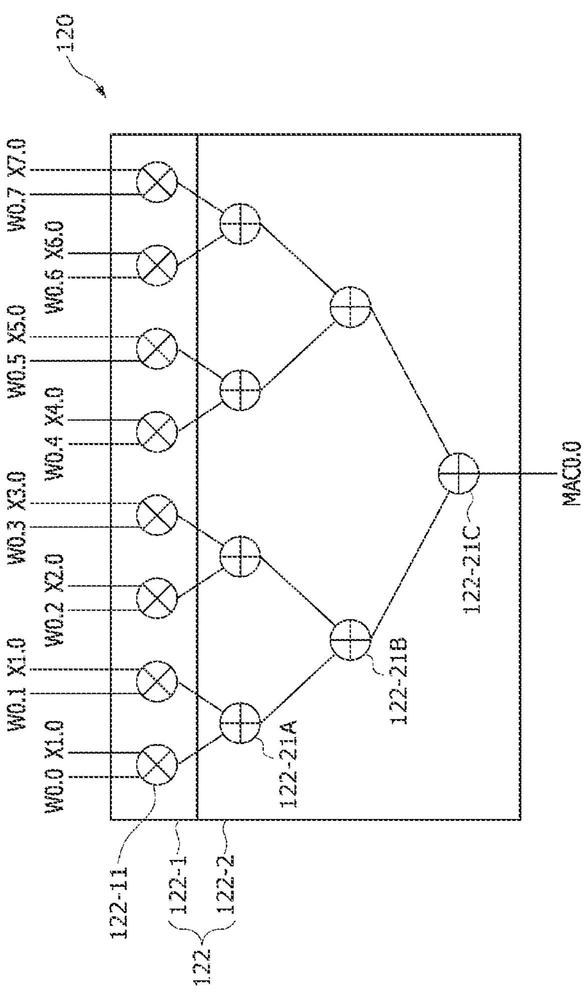

At a step 306, the MAC command generator 240 of the PIM controller 200 may generate and transmit the first MAC input latch signal MAC_L1 to the PIM device 100, as illustrated in FIG. 9. The first MAC input latch signal MAC_L1 may control the input latch operation of the first data for the MAC operator 120 of the PIM device 100. The elements W0.0, . . . , and W0.7 in the first row of the weight matrix may be input to the MAC circuit 122 of the MAC operator 120 by the input latch operation, as illustrated in FIG. 11. The MAC circuit 122 may include the plurality of multipliers 122-11 (e.g., eight multipliers 122-11), the number of which is equal to the number of columns of the weight matrix. In such a case, the elements W0.0, . . . , and W0.7 in the first row of the weight matrix may be input to the eight multipliers 122-11, respectively.

Figure 10:
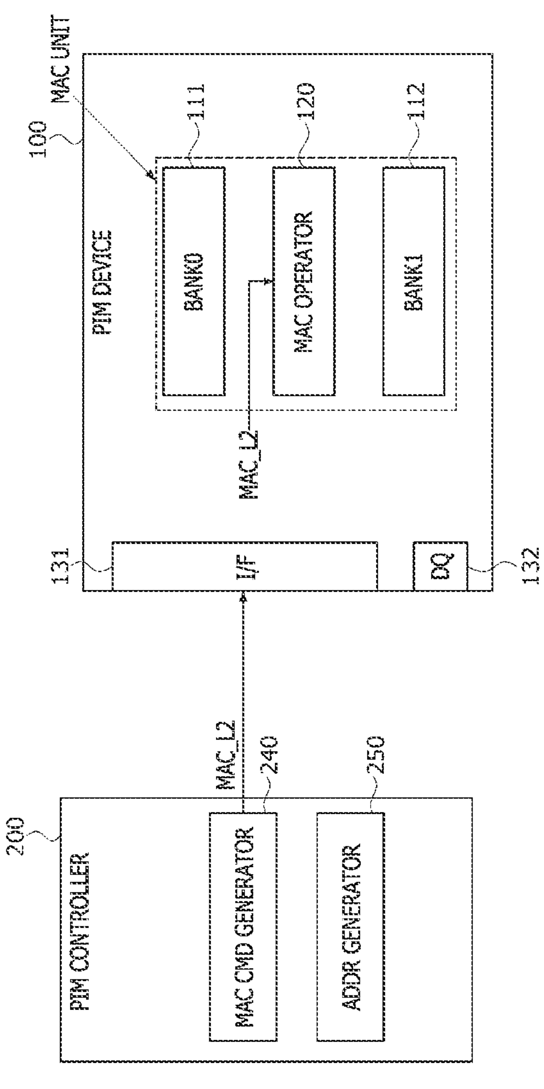

At a step 307, the MAC command generator 240 of the PIM controller 200 may generate and transmit the second MAC input latch signal MAC_L2 to the PIM device 100, as illustrated in FIG. 10. The second MAC input latch signal MAC_L2 may control the input latch operation of the second data for the MAC operator 120 of the PIM device 100. The elements X0.0, . . . , and X7.0 in the first column of the vector matrix may be input to the MAC circuit 122 of the MAC operator 120 by the input latch operation, as illustrated in FIG. 11. In such a case, the elements X0.0, . . . , and X7.0 in the first column of the vector matrix may be input to the eight multipliers 122-11, respectively.

At a step 308, the MAC circuit 122 of the MAC operator 120 may perform the MAC arithmetic operation of an $R^{th}$ row of the weight matrix and the first column of the vector matrix, which are input to the MAC circuit 122. An initial value of 'R' may be set as '1'. Thus, the MAC arithmetic operation of the first row of the weight matrix and the first column of the vector matrix may be performed a first time. For example, the scalar product is calculated of the Rth '1×N' row vector of the 'M×N' weight matrix and the 'N×1' vector matrix as an 'R×1' element of the 'M×1' MAC result matrix. For R=1, the scalar product of the first row of the weight matrix and the first column of the vector matrix shown in FIG. 5 is W0.0*X0.0+W0.1*X1.0+W0.2*X2.0+

W0.3*X3.0+W0.4*X4.0+W0.5*X5.0+W0.6*X6.0+W0.7*X7.0. Specifically, each of the multipliers 122-11 of the multiplication logic circuit 122-1 may perform a multiplying calculation of the inputted data, and the result data of the multiplying calculation may be input to the addition logic circuit 122-2. The addition logic circuit 122-2, as illustrated in FIG. 11, may include four adders 122-21A disposed at a first stage, two adders 122-218 disposed at a second stage, and an adder 122-21C disposed at a third stage.

Each of the adders 122-21A disposed at the first stage may receive output data of two of the multipliers 122-11 and may perform an adding calculation of the output data of the two multipliers 122-11 to output the result of the adding calculation. Each of the adders 122-21B disposed at the second stage may receive output data of two of the adders 122-21A disposed at the first stage and may perform an adding calculation of the output data of the two adders 122-21A to output the result of the adding calculation. The adder 122-21C disposed at the third stage may receive output data of two of the adders 122-21B disposed at the second stage and may perform an adding calculation of the output data of the two adders 122-21B to output the result of the adding calculation. The output data of the addition logic circuit 122-2 may correspond to result data (i.e., MAC result data) of the MAC arithmetic operation of the first row included in the weight matrix and the column included in the vector matrix. Thus, the output data of the addition logic circuit 122-2 may correspond to an element MAC0.0 located at a first row of an '8×1' MAC result matrix with eight elements of MAC0.0, . . . , and MAC7.0, as illustrated in FIG. 5. The output data MAC0.0 of the addition logic circuit 122-2 may be input to the output latch 123-1 disposed in the data output circuit 123 of the MAC operator 120, as described with reference to FIG. 4.

Figure 12:
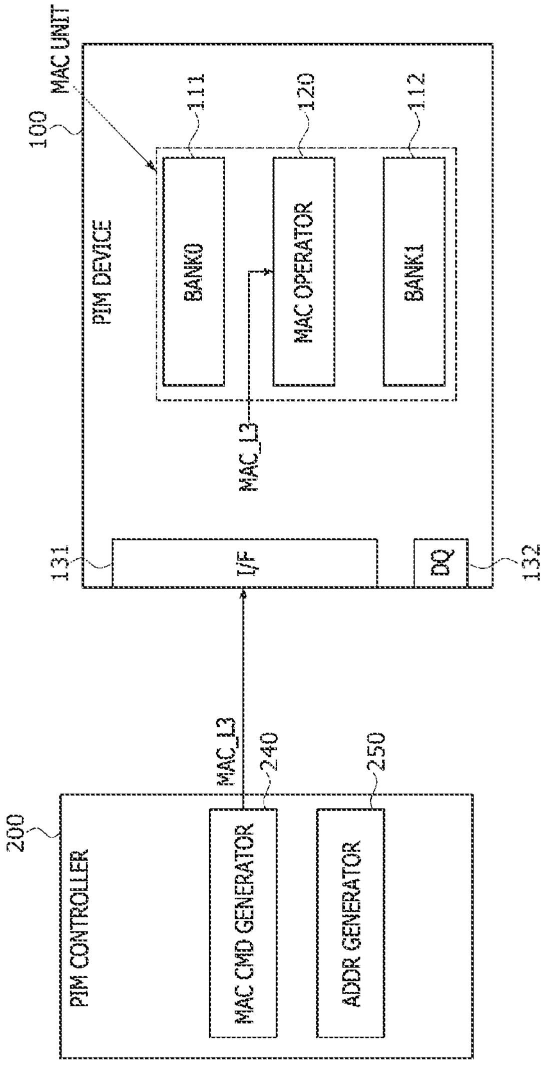

At a step 309, the MAC command generator 240 of the PIM controller 200 may generate and transmit the MAC output latch signal MAC_L3 to the PIM device 100, as illustrated in FIG. 12. The MAC output latch signal MAC_L3 may control the output latch operation of the MAC result data MAC0.0 performed by the MAC operator 120 of the PIM device 100. The MAC result data MAC0.0 that is input from the MAC circuit 122 of the MAC operator 120 may be output from the output latch 123-1 in synchronization with the MAC output latch signal MAC_L3, as described with reference to FIG. 4. The MAC result data MAC0.0 that is output from the output latch 123-1 may be input to the transfer gate 123-2 of the data output circuit 123.

Figure 13:
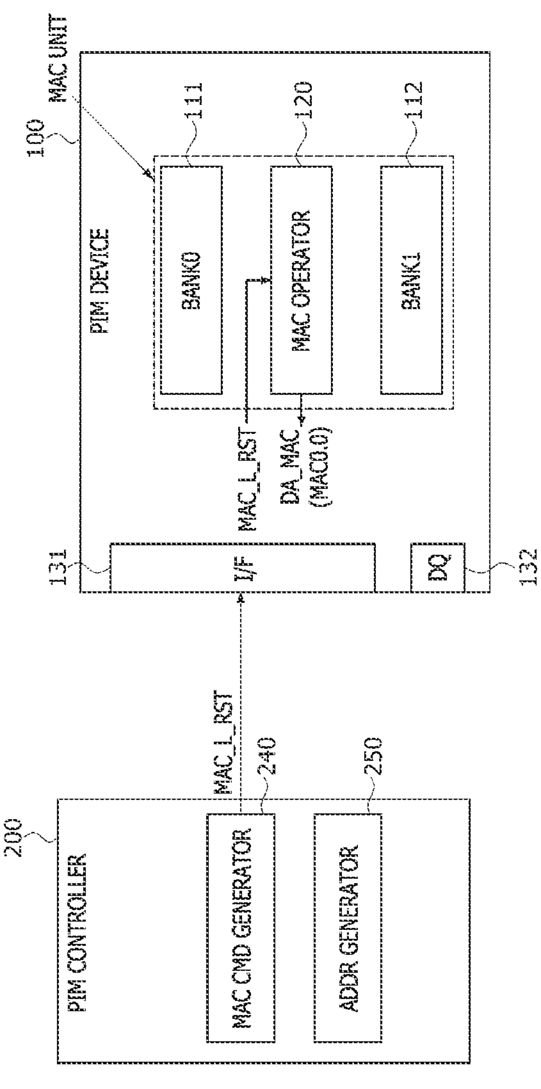

At a step 310, the MAC command generator 240 of the PIM controller 200 may generate and transmit the MAC latch reset signal MAC_L_RST to the PIM device 100, as illustrated in FIG. 13. The MAC latch reset signal MAC_L_RST may control an output operation of the MAC result data MAC0.0 generated by the MAC operator 120 and a reset operation of the output latch included in the MAC operator 120. As described with reference to FIG. 4, the transfer gate 123-2 receiving the MAC result data MAC0.0 from the output latch 123-1 of the MAC operator 120 may be synchronized with the MAC latch reset signal MAC_L_RST to output the MAC result data MAC0.0. In an embodiment, the MAC result data MAC0.0 that is output from the MAC operator 120 may be stored into the first memory bank 111 or the second memory bank 112 through the first BIO line or the second BIO line in the PIM device 100.

At a step 311, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 311. At a step 312, whether the row number changed at the step 311 is greater than the row number of the last row (i.e., the eighth row of the current example) of the weight matrix may be determined. Because the row number of the weight matrix is changed to '2' at the step 311, a process of the MAC arithmetic operation may be fed back to the step 304.

If the process of the MAC arithmetic operation is fed back to the step 304 from the step 312, then the same processes as described with reference to the steps 304 to 310 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix. If the process of the MAC arithmetic operation is fed back to the step 304 at the step 312, then the processes from the step 304 to the step 311 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 311, the MAC arithmetic operation may terminate because the row number of '9' is greater than the last row number of '8' at the step 312.

Figure 14:
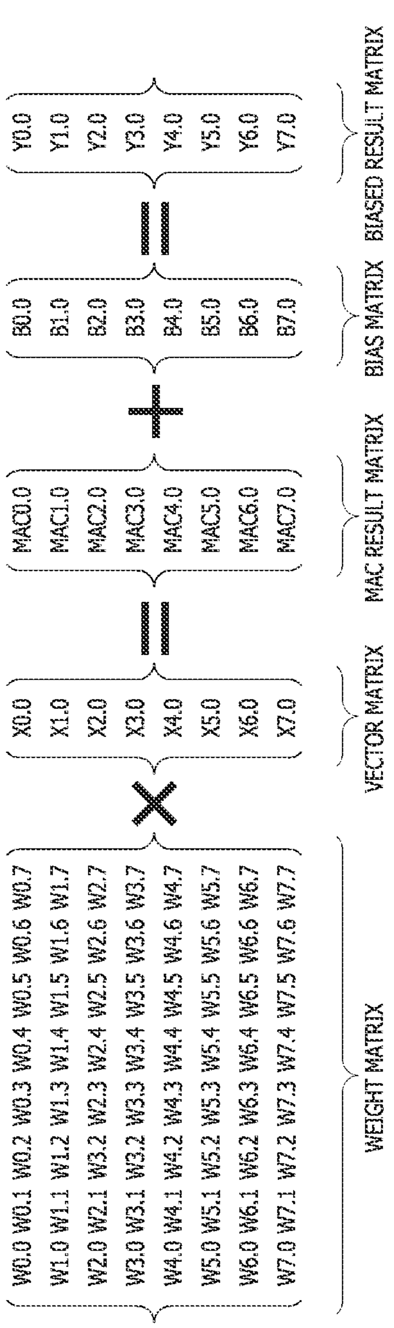
FIG. 14 illustrates another example of a MAC arithmetic operation performed in a PIM system according to a first embodiment of the present disclosure.

FIG. 14 illustrates another example of a MAC arithmetic operation performed in the PIM system 1-1 according to the first embodiment of the present disclosure. As illustrated in FIG. 14, the MAC arithmetic operation performed by the PIM system 1-1 may further include an adding calculation of the MAC result matrix and a bias matrix. Specifically, as described with reference to FIG. 5, the PIM device 100 may execute the matrix multiplying calculation of the '8×8' weight matrix and the '8×1' vector matrix according to control of the PIM controller 200. As a result of the matrix multiplying calculation of the '8×8' weight matrix and the '8×1' vector matrix, the '8×1' MAC result matrix with the eight elements MAC0.0, . . . , and MAC7.0 may be generated. The '8×1' MAC result matrix may be added to a '8×1' bias matrix. The '8×1' bias matrix may have elements B0.0, . . . , and B7.0 corresponding to bias data. The bias data may be set to reduce an error of the MAC result matrix. As a result of the adding calculation of the MAC result matrix and the bias matrix, a '8×1' biased result matrix with eight elements Y0.0, . . . , and Y7.0 may be generated.

Figure 16:
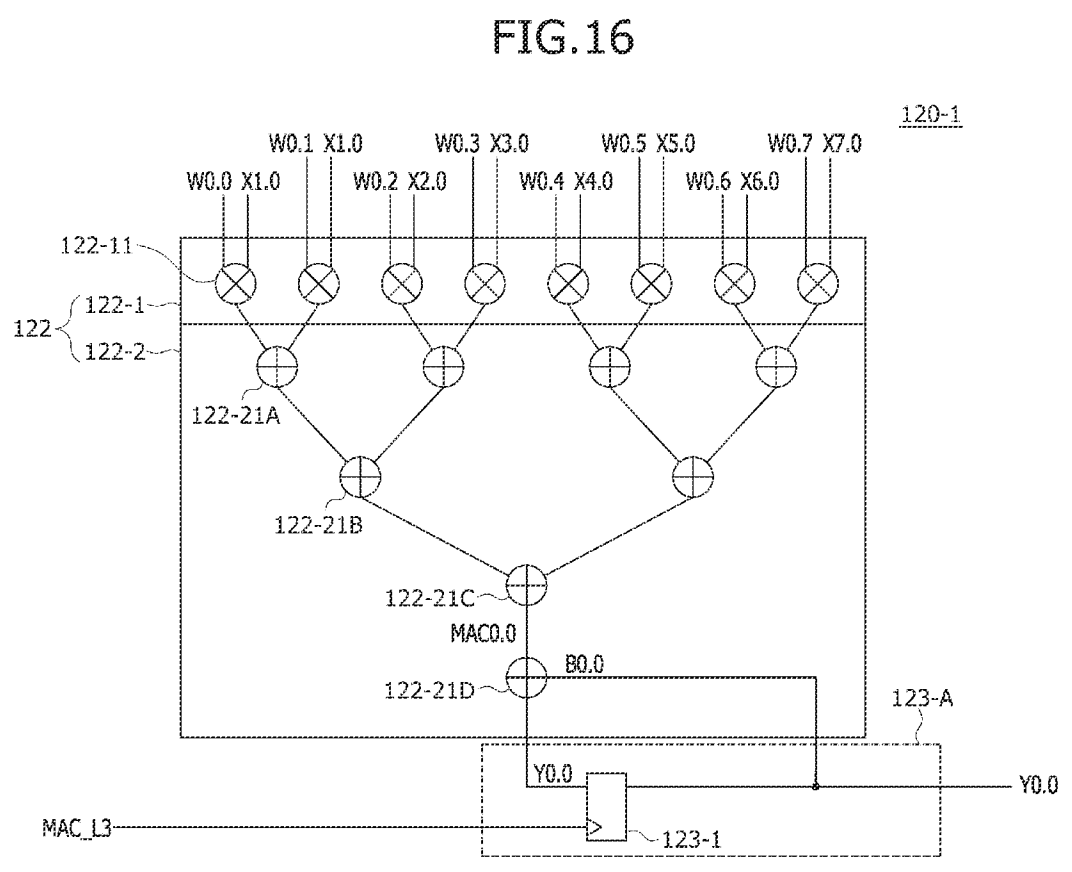

FIG. 15 is a flowchart illustrating processes of the MAC arithmetic operation described with reference to FIG. 14 in the PIM system 1-1 according to the first embodiment of the present disclosure. Moreover, FIG. 16 illustrates an example of a configuration of a MAC operator 120-1 for performing the MAC arithmetic operation of FIG. 14 in the PIM system 1-1 according to the first embodiment of the present disclosure. In FIG. 16, the same reference numerals or the same reference symbols as used in FIG. 4 denote the same elements, and the detailed descriptions of the same elements as indicated in the previous embodiment will be omitted hereinafter. Referring to FIG. 15, the first data (i.e., the weight data) may be written into the first memory bank 111 at a step 321 to perform the MAC arithmetic operation in the PIM device 100. Thus, the weight data may be stored in the first memory bank 111 of the PIM device 100. In the present embodiment, it may be assumed that the weight data are the elements W0.0, . . . , and W7.7 constituting the weight matrix of FIG. 14.

At a step 322, whether an inference is requested may be determined. An inference request signal may be transmitted from an external device located outside of the PIM system 1-1 to the PIM controller 200 of the PIM system 1-1. In an embodiment, if no inference request signal is transmitted to the PIM controller 200, the PIM system 1-1 may be in a standby mode until the inference request signal is transmitted to the PIM controller 200. Alternatively, if no inference request signal is transmitted to the PIM controller 200, the PIM system 1-1 may perform operations (e.g., data read/write operations) other than the MAC arithmetic operation in the memory mode until the inference request signal is transmitted to the PIM controller 200. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 14. If the inference request signal is transmitted to the PIM controller 200 at the step 322, the PIM controller 200 may write the vector data transmitted with the inference request signal into the second memory bank 112 at a step 323. Accordingly, the vector data may be stored in the second memory bank 112 of the PIM device 100.

At a step 324, the output latch of the MAC operator may be initially set to have the bias data and the initially set bias data may be fed back to an accumulative adder of the MAC operator. This process is executed to perform the matrix adding calculation of the MAC result matrix and the bias matrix, which is described with reference to FIG. 14. In other words, the output latch 123-1 in the data output circuit 123-A of the MAC operator (120-1) is set to have the bias data. Because the matrix multiplying calculation is executed for the first row of the weight matrix, the output latch 123-1 may be initially set to have the element B0.0 located at a cross point of the first row and the first column of the bias matrix as the bias data. The output latch 123-1 may output the bias data B0.0, and the bias data B0.0 that is output from the output latch 123-1 may be input to the accumulative adder 122-21D of the addition logic circuit 122-2, as illustrated in FIG. 16.

In an embodiment, in order to output the bias data B0.0 out of the output latch 123-1 and to feed back the bias data B0.0 to the accumulative adder 122-21D, the MAC command generator 240 of the PIM controller 200 may transmit the MAC output latch signal MAC_L3 to the MAC operator 120-1 of the PIM device 100. When a subsequent MAC arithmetic operation is performed, the accumulative adder 122-21D of the MAC operator 120-1 may add the MAC result data MAC0.0 that is output from the adder 122-21C disposed at the last stage to the bias data B0.0 which is fed back from the output latch 123-1 to generate the biased result data Y0.0 and may output the biased result data Y0.0 to the output latch 123-1. The biased result data Y0.0 may be output from the output latch 123-1 in synchronization with the MAC output latch signal MAC_L3 transmitted in a subsequent process.

In a step 325, the MAC command generator 240 of the PIM controller 200 may generate and transmit the first MAC read signal MAC_RD_BK0 to the PIM device 100. In addition, the address generator 250 of the PIM controller 200 may generate and transmit the bank selection signal BS and the row/column address ADDR_R/ADDR_C to the PIM device 100. The step 325 may be executed in the same way as described with reference to FIG. 7. In a step 326, the MAC command generator 240 of the PIM controller 200 may generate and transmit the second MAC read signal MAC_RD_BK1 to the PIM device 100. In addition, the address generator 250 of the PIM controller 200 may generate and transmit the bank selection signal BS for selecting the second memory bank 112 and the row/column address ADDR_R/ADDR_C to the PIM device 100. The step 326 may be executed in the same way as described with reference to FIG. 8.

At a step 327, the MAC command generator 240 of the PIM controller 200 may generate and transmit the first MAC input latch signal MAC_L1 to the PIM device 100. The step 327 may be executed in the same way as described with reference to FIG. 9. The first MAC input latch signal MAC_L1 may control the input latch operation of the first data for the MAC operator 120 of the PIM device 100. The input latch operation of the first data may be performed in the same way as described with reference to FIG. 11. At a step 328, the MAC command generator 240 of the PIM controller 200 may generate and transmit the second MAC input latch signal MAC_L2 to the PIM device 100. The step 328 may be executed in the same way as described with reference to FIG. 10. The second MAC input latch signal MAC_L2 may control the input latch operation of the second data for the MAC operator 120 of the PIM device 100. The input latch operation of the second data may be performed in the same way as described with reference to FIG. 11.

At a step 329, the MAC circuit 122 of the MAC operator 120 may perform the MAC arithmetic operation of an $R^{th}$ row of the weight matrix and the first column of the vector matrix, which are input to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the inputted data, and the result data of the multiplying calculation may be input to the addition logic circuit 122-2. The addition logic circuit 122-2 may include the four adders 122-21A disposed at the first stage, the two adders 122-21B disposed at the second stage, the adder 122-21C disposed at the third stage, and the accumulative adder 122-21D, as illustrated in FIG. 16. The accumulative adder 122-21D may add output data of the adder 122-21C to feedback data fed back from the output latch 123-1 to output the result of the adding calculation. The output data of the adder 122-21C may be the matrix multiplying result MAC0.0, which corresponds to the result of the matrix multiplying calculation of the first row of the weight matrix and the first column of the vector matrix. The accumulative adder 122-21D may add the output data MAC0.0 of the adder 122-21C to the bias data B0.0 fed back from the output latch 123-1 to output the result of the adding calculation. The output data Y0.0 of the accumulative adder 122-21D may be input to the output latch 123 disposed in a data output circuit 123-A of the MAC operator 120-1.

At a step 330, the MAC command generator 240 of the PIM controller 200 may generate and transmit the MAC output latch signal MAC_L3 to the PIM device 100. The step 330 may be executed in the same way as described with reference to FIG. 12. The MAC output latch signal MAC_L3 may control the output latch operation of the MAC result data MAC0.0, which is performed by the MAC operator 120-1 of the PIM device 100. The biased result data Y0.0 transmitted from the MAC circuit 122 of the MAC operator 120 to the output latch 123-1 may be output from the output latch 123-1 in synchronization with the MAC output latch signal MAC_L3. The biased result data Y0.0 that is output from the output latch 123 may be input to the transfer gate 123-2.

At a step 331, the MAC command generator 240 of the PIM controller 200 may generate and transmit the MAC latch reset signal MAC_L_RST to the PIM device 100. The step 331 may be executed in the same way as described with reference to FIG. 13. The MAC latch reset signal MAC_L_RST may control an output operation of the biased result data Y0.0 generated by the MAC operator 120 and a reset operation of the output latch 123-1 included in the MAC operator 120. The transfer gate 123-2 receiving the biased result data Y0.0 from the output latch 123-1 of the data output circuit 123-A included in the MAC operator 120 may be synchronized with the MAC latch reset signal MAC_L_RST to output the biased result data Y0.0. In an embodiment, the biased result data Y0.0 that is output from the MAC operator 120 may be stored into the first memory bank 111 or the second memory bank 112 through the first BIO line or the second BIO line in the PIM device 100.

At a step 332, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 332. At a step 333, whether the row number changed at the step 332 is greater than the row number of the last row (i.e., the eighth row of the current example) of the weight matrix may be determined. Because the row number of the weight matrix is changed to '2' at the step 332, a process of the MAC arithmetic operation may be fed back to the step 324.

If the process of the MAC arithmetic operation is fed back to the step 324 from the step 333, then the same processes as described with reference to the steps 324 to 331 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix and the bias data B0.0 in the output latch 123-1 initially set at the step 324 may be changed into the bias data B1.0. If the process of the MAC arithmetic operation is fed back to the step 324 at the step 333, the processes from the step 324 to the step 332 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 332, the MAC arithmetic operation may terminate because the row number of '9' is greater than the last row number of '8' at the step 333.

Figure 17:
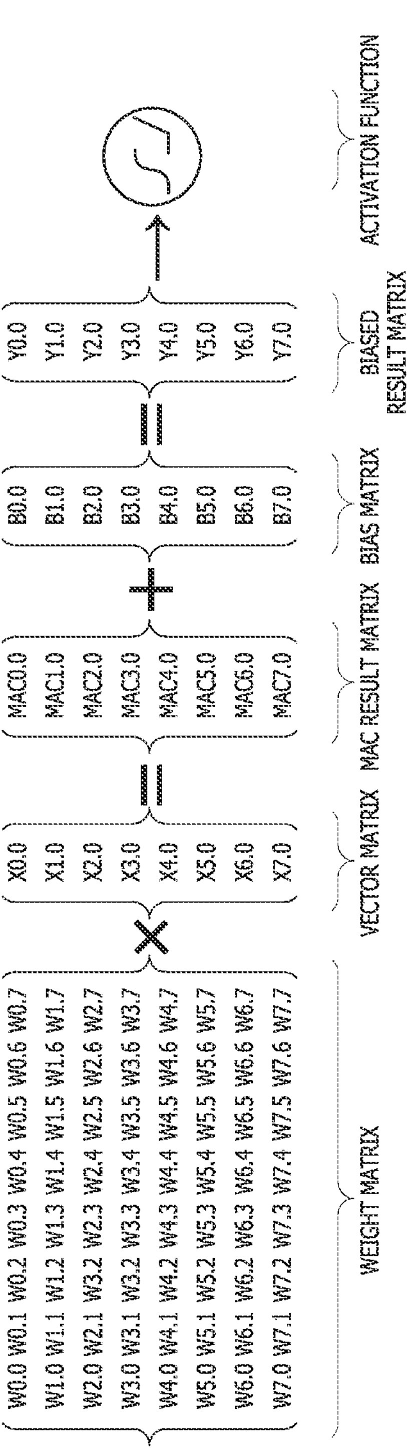
FIG. 17 illustrates yet another example of a MAC arithmetic operation performed in a PIM system according to a first embodiment of the present disclosure.

FIG. 17 illustrates yet another example of a MAC arithmetic operation performed in the PIM system 1-1 according to the first embodiment of the present disclosure. As illustrated in FIG. 17, the MAC arithmetic operation performed by the PIM system 1-1 may further include a process for applying the biased result matrix to an activation function. Specifically, as described with reference to FIG. 14, the PIM device 100 may execute the matrix multiplying calculation of the '8×8' weight matrix and the '8×1' vector matrix according to control of the PIM controller 200 to generate the MAC result matrix. In addition, the MAC result matrix may be added to the bias matrix to generate biased result matrix.

The biased result matrix may be applied to the activation function. The activation function means a function which is used to calculate a unique output value by comparing a MAC calculation value with a critical value in an MLP-type neural network. In an embodiment, the activation function may be a unipolar activation function which generates only positive output values or a bipolar activation function which generates negative output values as well as positive output values. In different embodiments, the activation function may include a sigmoid function, a hyperbolic tangent (Tanh) function, a rectified linear unit (ReLU) function, a leaky ReLU function, an identity function, and a maxout function.

FIG. 18 is a flowchart illustrating processes of the MAC arithmetic operation described with reference to FIG. 17 in the PIM system 1-1 according to the first embodiment of the present disclosure. Moreover, FIG. 19 illustrates an example of a configuration of a MAC operator 120-2 for performing the MAC arithmetic operation of FIG. 17 in the PIM system 1-1 according to the first embodiment of the present disclosure. In FIG. 19, the same reference numerals or the same reference symbols as used in FIG. 4 denote the same elements, and the detailed descriptions of the same elements as mentioned in the previous embodiment will be omitted hereinafter. Referring to FIG. 18, the first data (i.e., the weight data) may be written into the first memory bank 111 at a step 341 to perform the MAC arithmetic operation in the PIM device 100. Thus, the weight data may be stored in the first memory bank 111 of the PIM device 100. In the present embodiment, it may be assumed that the weight data are the elements W0.0, . . . , and W7.7 constituting the weight matrix of FIG. 17.

At a step 342, whether an inference is requested may be determined. An inference request signal may be transmitted from an external device located outside of the PIM system 1-1 to the PIM controller 200 of the PIM system 1-1. In an embodiment, if no inference request signal is transmitted to the PIM controller 200, the PIM system 1-1 may be in a standby mode until the inference request signal is transmitted to the PIM controller 200. Alternatively, if no inference request signal is transmitted to the PIM controller 200, the PIM system 1-1 may perform operations (e.g., the data read/write operations) other than the MAC arithmetic operation in the memory mode until the inference request signal is transmitted to the PIM controller 200. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 17. If the inference request signal is transmitted to the PIM controller 200 at the step 342, then the PIM controller 200 may write the vector data transmitted with the inference request signal into the second memory bank 112 at a step 343. Accordingly, the vector data may be stored in the second memory bank 112 of the PIM device 100.

At a step 344, an output latch of a MAC operator may be initially set to have bias data and the initially set bias data may be fed back to an accumulative adder of the MAC operator. This process is executed to perform the matrix adding calculation of the MAC result matrix and the bias matrix, which is described with reference to FIG. 17. That is, as illustrated in FIG. 19, the output latch 123-1 of the MAC operator (120-2 of FIG. 19) may be initially set to have the bias data of the bias matrix. Because the matrix multiplying calculation is executed for the first row of the weight matrix, the element B0.0 located at first row and the first column of the bias matrix may be initially set as the bias data in the output latch 123-1. The output latch 123-1 may output the bias data B0.0, and the bias data B0.0 that is output from the output latch 123-1 may be input to the accumulative adder 122-21D of the MAC operator 120-2.

In an embodiment, in order to output the bias data B0.0 out of the output latch 123-1 and to feed back the bias data B0.0 to the accumulative adder 122-21D, the MAC command generator 240 of the PIM controller 200 may transmit the MAC output latch signal MAC_L3 to the MAC operator 120-2 of the PIM device 100. When a subsequent MAC arithmetic operation is performed, the accumulative adder 122-21D of the MAC operator 120-2 may add the MAC result data MAC0.0 that is output from the adder 122-21C disposed at the last stage to the bias data B0.0 which is fed back from the output latch 123-1 to generate the biased result data Y0.0 and may output the biased result data Y0.0 to the output latch 123-1. As illustrated in FIG. 19, the biased result data Y0.0 may be transmitted from the output latch 123-1 to an activation function logic circuit 123-5 disposed in a data output circuit 123-B of the MAC operator 120-2 in synchronization with the MAC output latch signal MAC_L3 transmitted in a subsequent process.

In a step 345, the MAC command generator 240 of the PIM controller 200 may generate and transmit the first MAC read signal MAC_RD_BK0 to the PIM device 100. In addition, the address generator 250 of the PIM controller 200 may generate and transmit the bank selection signal BS and the row/column address ADDR_R/ADDR_C to the PIM device 100. The step 345 may be executed in the same way as described with reference to FIG. 7. In a step 346, the MAC command generator 240 of the PIM controller 200 may generate and transmit the second MAC read signal MAC_RD_BK1 to the PIM device 100. In addition, the address generator 250 of the PIM controller 200 may generate and transmit the bank selection signal BS for selecting the second memory bank 112 and the row/column address ADDR_R/ADDR_C to the PIM device 100. The step 346 may be executed in the same way as described with reference to FIG. 8.

At a step 347, the MAC command generator 240 of the PIM controller 200 may generate and transmit the first MAC input latch signal MAC_L1 to the PIM device 100. The step 347 may be executed in the same way as described with reference to FIG. 9. The first MAC input latch signal MAC_L1 may control the input latch operation of the first data for the MAC operator 120 of the PIM device 100. The input latch operation of the first data may be performed in the same way as described with reference to FIG. 11. At a step 348, the MAC command generator 240 of the PIM controller 200 may generate and transmit the second MAC input latch signal MAC_L2 to the PIM device 100. The step 348 may be executed in the same way as described with reference to FIG. 10. The second MAC input latch signal MAC_L2 may control the input latch operation of the second data for the MAC operator 120 of the PIM device 100. The input latch operation of the second data may be performed in the same way as described with reference to FIG. 11.

At a step 349, the MAC circuit 122 of the MAC operator 120 may perform the MAC arithmetic operation of an $R^{th}$ row of the weight matrix and the first column of the vector matrix, which are input to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the inputted data, and the result data of the multiplying calculation may be input to the addition logic circuit 122-2. The addition logic circuit 122-2 may include the four adders 122-21A disposed at the first stage, the two adders 122-21B disposed at the second stage, the adder 122-21C disposed at the third stage, and the accumulative adder 122-21D, as illustrated in FIG. 19. The accumulative adder 122-21D may add output data of the adder 122-21C to feedback data fed back from the output latch 123-1 to output the result of the adding calculation. The output data of the adder 122-21C may be the element MAC0.0 of the '8×1' MAC result matrix, which corresponds to the result of the matrix multiplying calculation of the first row of the weight matrix and the first column of the vector matrix. The accumulative adder 122-21D may add the output data MAC0.0 of the adder 122-21C to the bias data B0.0 fed back from the output latch 123-1 to output the result of the adding calculation. The output data Y0.0 of the accumulative adder 122-21D may be input to the output latch 123-1 disposed in the data output circuit 123-A of the MAC operator 120.

At a step 350, the MAC command generator 240 of the PIM controller 200 may generate and transmit the MAC output latch signal MAC_L3 to the PIM device 100. The step 350 may be executed in the same way as described with reference to FIG. 12. The MAC output latch signal MAC_L3 may control the output latch operation of the output latch 123-1 included in the MAC operator 120 of the PIM device 100. The biased result data Y0.0 transmitted from the MAC circuit 122 of the MAC operator 120 to the output latch 123-1 may be output from the output latch 123-1 in synchronization with the MAC output latch signal MAC_L3. The biased result data Y0.0 that is output from the output latch 123-1 may be input to the activation function logic circuit 123-5. At a step 351, the activation function logic circuit 123-5 may apply an activation function to the biased result data Y0.0 to generate a final output value, and the final output value may be input to the transfer gate (123-2 of FIG. 4). This, for example, is the final output value for the current of R which is incremented in step 354.

At a step 352, the MAC command generator 240 of the PIM controller 200 may generate and transmit the MAC latch reset signal MAC_L_RST to the PIM device 100. The step 352 may be executed in the same way as described with reference to FIG. 13. The MAC latch reset signal MAC_L_RST may control an output operation of the final output value generated by the MAC operator 120 and a reset operation of the output latch 123-1 included in the MAC operator 120. The transfer gate 123-2 receiving the final output value from the activation function logic circuit 123-5 of the data output circuit 123-B included in the MAC operator 120 may be synchronized with the MAC latch reset signal MAC_L_RST to output the final output value. In an embodiment, the final output value that is output from the MAC operator 120 may be stored into the first memory bank 111 or the second memory bank 112 through the first BIO line or the second BIO line in the PIM device 100.

At a step 353, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 353. At a step 354, whether the row number changed at the step 353 is greater than the row number of the last row (i.e., the eighth row) of the weight matrix may be determined. Because the row number of the weight matrix is changed to '2' at the step 353, a process of the MAC arithmetic operation may be fed back to the step 344.

If the process of the MAC arithmetic operation is fed back to the step 344 from the step 354, the same processes as described with reference to the steps 344 to 354 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix, and the bias data B0.0 in the output latch 123-1 initially set at the step 344 may be changed to the bias data B1.0. If the process of the MAC arithmetic operation is fed back to the step 344 from the step 354, the processes from the step 344 to the step 354 may be iteratively performed until the MAC arithmetic operation is performed for all of the rows of the weight matrix with the vector matrix. For an embodiment, a plurality of final output values, namely, one final output value for each incremented value of R, represents an 'N×1' final result matrix. If the MAC arithmetic operation for the eighth row of the weight matrix terminates and the row number of the weight matrix changes from '8' to '9' at the step 354, the MAC arithmetic operation may terminate because the row number of '9' is greater than the last row number of '8' at the step 354.

FIG. 20 is a block diagram illustrating a PIM system 1-2 according to a second embodiment of the present disclosure. In FIG. 20, the same reference numerals or the same reference symbols as used in FIG. 2 denote the same elements. As illustrated in FIG. 20, the PIM system 1-2 may be configured to include a PIM device 400 and a PIM controller 500. The PIM device 400 may be configured to include a memory bank (BANK) 411 corresponding to a storage region, a global buffer 412, a MAC operator 420, an interface (I/F) 431, and a data input/output (I/O) pad 432. For an embodiment, the MAC operator 420 represents a MAC operator circuit. The memory bank (BANK) 411 and the MAC operator 420 included in the PIM device 400 may constitute one MAC unit. In another embodiment, the PIM device 400 may include a plurality of MAC units. The memory bank (BANK) 411 may represent a memory region for storing data, for example, a DRAM device. The global buffer 412 may also represent a memory region for storing data, for example, a DRAM device or an SRAM device. The memory bank (BANK) 411 may be a component unit which is independently activated and may be configured to have the same data bus width as data I/O lines in the PIM device 400. In an embodiment, the memory bank 411 may operate through interleaving such that an active operation of the memory bank 411 is performed in parallel while another memory bank is selected. The memory bank 411 may include at least one cell array which includes memory unit cells located at cross points of a plurality of rows and a plurality of columns.

Although not shown in the drawings, a core circuit may be disposed adjacent to the memory bank 411. The core circuit may include X-decoders XDECs and Y-decoders/IO circuits YDEC/IOs. An X-decoder XDEC may also be referred to as a word line decoder or a row decoder. The X-decoder XDEC may receive a row address ADDR_R from the PIM controller 500 and may decode the row address ADDR_R to select and enable one of the rows (i.e., word lines) coupled to the selected memory bank. Each of the Y-decoders/IO circuits YDEC/IOs may include a Y-decoder YDEC and an I/O circuit IO. The Y-decoder YDEC may also be referred to as a bit line decoder or a column decoder. The Y-decoder YDEC may receive a column address ADD_C from the PIM controller 500 and may decode the column address ADD_C to select and enable at least one of the columns (i.e., bit lines) coupled to the selected memory bank. Each of the I/O circuits may include an I/O sense amplifier for sensing and amplifying a level of a read datum that is output from the corresponding memory bank during a read operation for the memory bank 411. In addition, the I/O circuit may include a write driver for driving a write datum during a write operation for the memory bank 411.

The MAC operator 420 of the PIM device 400 may have mostly the same configuration as the MAC operator 120 described with reference to FIG. 4. That is, the MAC operator 420 may be configured to include the data input circuit 121, the MAC circuit 122, and the data output circuit 123, as described with reference to FIG. 4. The data input circuit 121 may be configured to include the first input latch 121-1 and the second input latch 121-2. The MAC circuit 122 may be configured to include the multiplication logic circuit 122-1 and the addition logic circuit 122-2. The data output circuit 123 may be configured to include the output latch 123-1, the transfer gate 123-2, the delay circuit 123-3, and the inverter 123-4. In an embodiment, the first input latch 121-1, the second input latch 121-2, and the output latch 123-1 may be realized using flip-flops.

The MAC operator 420 may be different from the MAC operator 120 in that a MAC input latch signal MAC_L1 is simultaneously input to both of clock terminals of the first and second input latches 121-1 and 121-2. As indicated in the following descriptions, the weight data and the vector data may be simultaneously transmitted to the MAC operator 420 of the PIM device 400 included in the PIM system 1-2 according to the present embodiment. That is, the first data DA1 (i.e., the weight data) and the second data DA2 (i.e., the vector data) may be simultaneously input to both of the first input latch 121-1 and the second input latch 121-2 constituting the data input circuit 121, respectively. Accordingly, it may be unnecessary to apply an extra control signal to the clock terminals of the first and second input latches 121-1 and 121-2, and thus the MAC input latch signal MAC_L1 may be simultaneously input to both of the clock terminals of the first and second input latches 121-1 and 121-2 included in the MAC operator 420.

In another embodiment, the MAC operator 420 may be realized to have the same configuration as the MAC operator 120-1 described with reference to FIG. 16 to perform the operation illustrated in FIG. 14. Even in such a case, the MAC operator 420 may have the same configuration as described with reference to FIG. 16 except that the MAC input latch signal MAC_L1 is simultaneously input to both of the clock terminals of the first and second input latches 121-1 and 121-2 constituting the data input circuit 121. In yet another embodiment, the MAC operator 420 may be realized to have the same configuration as the MAC operator 120-2 described with reference to FIG. 19 to perform the operation illustrated in FIG. 17. Even in such a case, the MAC operator 420 may have the same configuration as described with reference to FIG. 19 except that the MAC input latch signal MAC_L1 is simultaneously input to both of the clock terminals of the first and second input latches 121-1 and 121-2 constituting the data input circuit 121.

The interface 431 of the PIM device 400 may receive the memory command M_CMD, the MAC commands MAC_CMDs, the bank selection signal BS, and the row/column addresses ADDR_R/ADDR_C from the PIM controller 500. The interface 431 may output the memory command M_CMD, together with the bank selection signal BS and the row/column addresses ADDR_R/ADDR_C, to the memory bank 411. The interface 431 may output the MAC commands MAC_CMDs to the memory bank 411 and the MAC operator 420. In such a case, the interface 431 may output the bank selection signal BS and the row/column addresses ADDR_R/ADDR_C to the memory bank 411. The data I/O pad 432 of the PIM device 400 may function as a data communication terminal between a device external to the PIM device 400, the global buffer 412, and the MAC unit (which includes the memory bank 411 and the MAC operator 420) included in the PIM device 400. The external device to the PIM device 400 may correspond to the PIM controller 500 of the PIM system 1-2 or a host located outside the PIM system 1-2. Accordingly, data that is output from the host or the PIM controller 500 may be input into the PIM device 400 through the data I/O pad 432. In addition, data generated by the PIM device 400 may be transmitted to the external device to the PIM device 400 through the data I/O pad 432.

The PIM controller 500 may control operations of the PIM device 400. In an embodiment, the PIM controller 500 may control the PIM device 400 such that the PIM device 400 operates in the memory mode or the MAC mode. In the event that the PIM controller 500 controls the PIM device 500 such that the PIM device 400 operates in the memory mode, the PIM device 400 may perform a data read operation or a data write operation for the memory bank 411. In the event that the PIM controller 500 controls the PIM device 400 such that the PIM device 400 operates in the MAC mode, the PIM device 400 may perform the MAC arithmetic operation for the MAC operator 420. In the event that the PIM controller 500 controls the PIM device 400 such that the PIM device 400 operates in the MAC mode, the PIM device 400 may also perform the data read operation and the data write operation for the memory bank 411 and the global buffer 412 to execute the MAC arithmetic operation.

The PIM controller 500 may be configured to include the command queue logic 210, the scheduler 220, the memory command generator 230, a MAC command generator 540, and an address generator 550. The scheduler 220 may include the mode selector 221. The command queue logic 210 may receive the request REQ from an external device (e.g., a host of the PIM system 1-2) and store a command queue corresponding the request REQ in the command queue logic 210. The command queue stored in the command queue logic 210 may be transmitted to the memory command generator 230 or the MAC command generator 540 according to a sequence determined by the scheduler 220. The scheduler 220 may adjust a timing of the command queue when the command queue stored in the command queue logic 210 is output from the command queue logic 210. The scheduler 210 may include the mode selector 221 that generates a mode selection signal including information on whether command queue stored in the command queue logic 210 relates to the memory mode or the MAC mode. The memory command generator 230 may receive the command queue related to the memory mode of the PIM device 400 from the command queue logic 210 to generate and output the memory command M_CMD. The command queue logic 210, the scheduler 220, the mode selector 221, and the memory command generator 230 may have the same function as described with reference to FIG. 2.

The MAC command generator 540 may receive the command queue related to the MAC mode of the PIM device 400 from the command queue logic 210. The MAC command generator 540 may decode the command queue to generate and output the MAC command signals MAC_CMDs. The MAC command signals MAC_CMDs output from the MAC command generator 540 may be transmitted to the PIM device 400. The data read operation for the memory bank 411 of the PIM device 400 may be performed by the MAC command signals MAC_CMDs that are output from the MAC command generator 540, and the MAC arithmetic operation of the MAC operator 420 may also be performed by the MAC command signals MAC_CMDs that are output from the MAC command generator 540. The MAC command signals MAC_CMDs and the MAC arithmetic operation of the PIM device 400 according to the MAC command signals MAC_CMDs will be described in detail with reference to FIG. 21.

The address generator 550 may receive address information from the command queue logic 210. The address generator 550 may generate the bank selection signal BS for selecting a memory bank where, for example, the memory bank 411 represents multiple memory banks. The address generator 550 may transmit the bank selection signal BS to the PIM device 400. In addition, the address generator 550 may generate the row address ADDR_R and the column address ADDR_C for accessing a region (e.g., memory cells) in the memory bank 411 and may transmit the row address ADDR_R and the column address ADDR_C to the PIM device 400.

Figure 21:
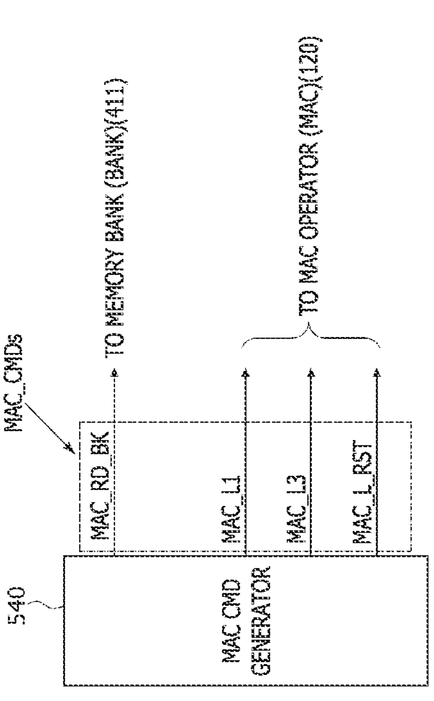
FIG. 21 illustrates MAC commands that are output from a MAC command generator of a PIM controller included in a PIM system according to a second embodiment of the present disclosure.

FIG. 21 illustrates the MAC command signals MAC_CMDs that are output from the MAC command generator 540 included in the PIM system 1-2 according to the second embodiment of the present disclosure. As illustrated in FIG. 21, the MAC command signals MAC_CMDs may include first to fourth MAC command signals. In an embodiment, the first MAC command signal may be a MAC read signal MAC_RD_BK, the second MAC command signal may be a MAC input latch signal MAC_L1, the third MAC command signal may be a MAC output latch signal MAC_L3, and the fourth MAC command signal may be a MAC latch reset signal MAC_L_RST.

The MAC read signal MAC_RD_BK may control an operation for reading the first data (e.g., the weight data) out of the memory bank 411 to transmit the first data to the MAC operator 420. The MAC input latch signal MAC_L1 may control an input latch operation of the weight data transmitted from the first memory bank 411 to the MAC operator 420. The MAC output latch signal MAC_L3 may control an output latch operation of the MAC result data generated by the MAC operator 420. And, the MAC latch reset signal MAC_L_RST may control an output operation of the MAC result data generated by the MAC operator 420 and a reset operation of an output latch included in the MAC operator 420.

The PIM system 1-2 according to the present embodiment may also be configured to perform the deterministic MAC arithmetic operation. Thus, the MAC command signals MAC_CMDs transmitted from the PIM controller 500 to the PIM device 400 may be sequentially generated with fixed time intervals. Accordingly, the PIM controller 500 does not require any extra end signals of various operations executed for the MAC arithmetic operation to generate the MAC command signals MAC_CMDs for controlling the MAC arithmetic operation. In an embodiment, latencies of the various operations executed by MAC command signals MAC_CMDs for controlling the MAC arithmetic operation may be set to have fixed values in order to perform the deterministic MAC arithmetic operation. In such a case, the MAC command signals MAC_CMDs may be sequentially output from the PIM controller 500 with fixed time intervals corresponding to the fixed latencies.

Figure 22:
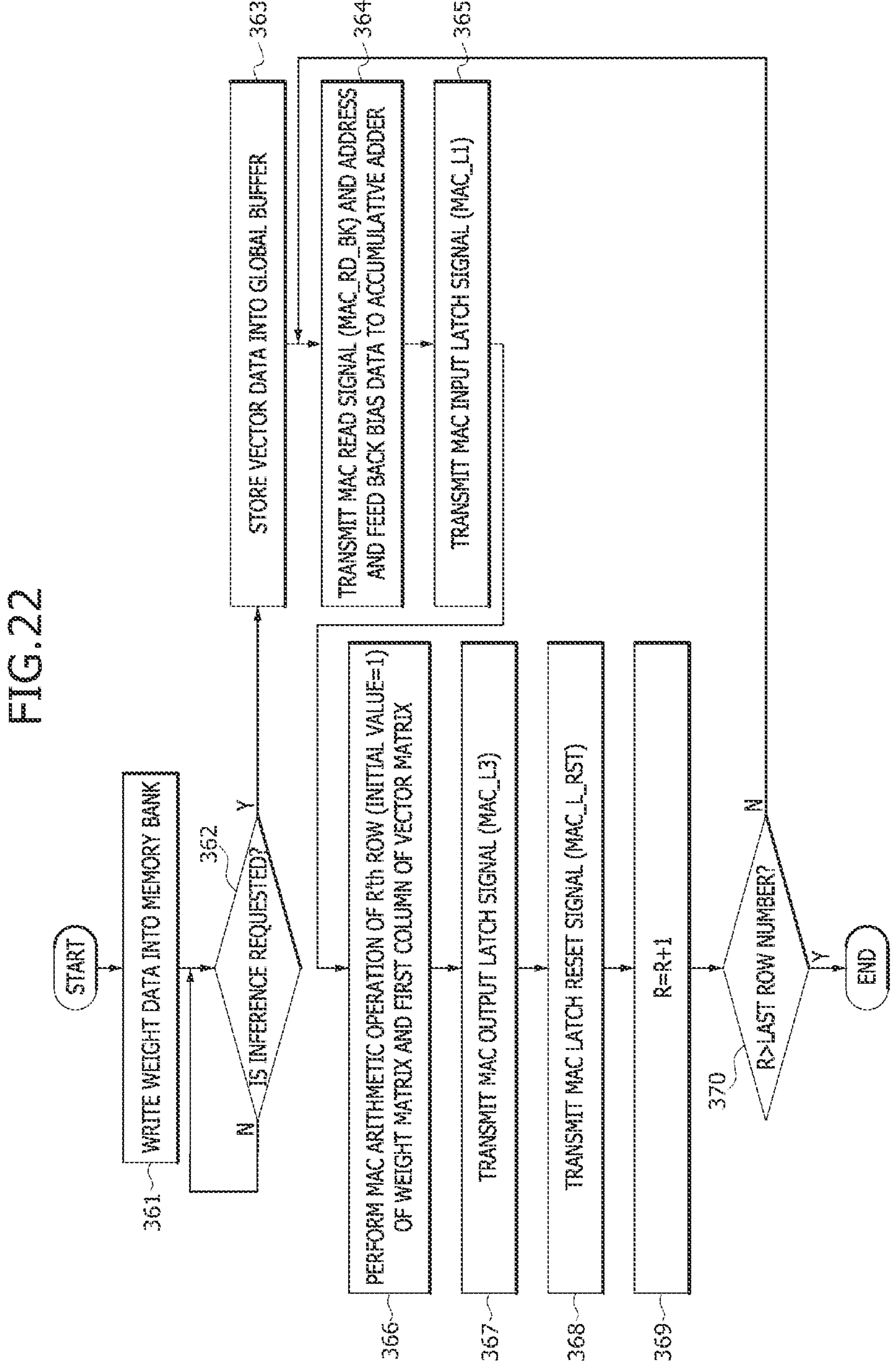
FIG. 22 is a flowchart illustrating processes of the MAC arithmetic operation illustrated in FIG. 5 in a PIM system according to a second embodiment of the present disclosure.

FIG. 22 is a flowchart illustrating processes of the MAC arithmetic operation described with reference to FIG. 5, which are performed in the PIM system 1-2 according to the second embodiment of the present disclosure. In addition, FIGS. 23 to 26 are block diagrams illustrating the processes of the MAC arithmetic operation illustrated in FIG. 5, which are performed in the PIM system 1-2 according to the second embodiment of the present disclosure. Referring to FIGS. 22 to 26, the first data (i.e., the weight data) may be written into the memory bank 411 at a step 361 to perform the MAC arithmetic operation. Thus, the weight data may be stored in the memory bank 411 of the PIM device 400. In the present embodiment, it may be assumed that the weight data are the elements W0.0, . . . , and W7.7 constituting the weight matrix of FIG. 5.

At a step 362, whether an inference is requested may be determined. An inference request signal may be transmitted from an external device located outside of the PIM system 1-2 to the PIM controller 500 of the PIM system 1-2. In an embodiment, if no inference request signal is transmitted to the PIM controller 500, the PIM system 1-2 may be in a standby mode until the inference request signal is transmitted to the PIM controller 500. Alternatively, if no inference request signal is transmitted to the PIM controller 500, the PIM system 1-2 may perform operations (e.g., data read/write operations) other than the MAC arithmetic operation in the memory mode until the inference request signal is transmitted to the PIM controller 500. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 5. If the inference request signal is transmitted to the PIM controller 500 at the step 362, then the PIM controller 500 may write the vector data transmitted with the inference request signal into the global buffer 412 at a step 363. Accordingly, the vector data may be stored in the global buffer 412 of the PIM device 400.

Figure 23:
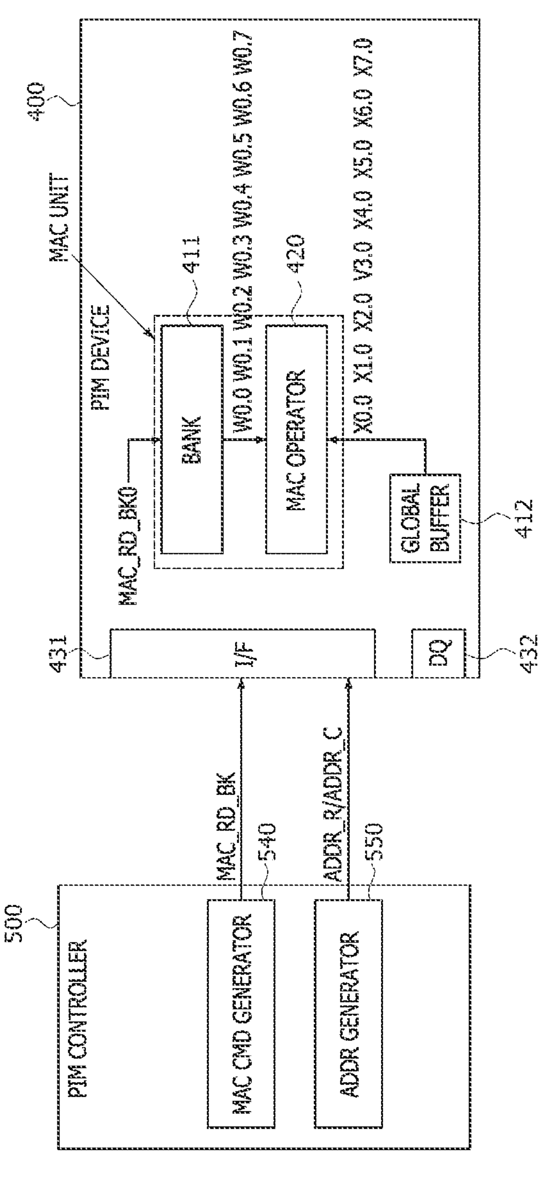

At a step 364, the MAC command generator 540 of the PIM controller 500 may generate and transmit the MAC read signal MAC_RD_BK to the PIM device 400, as illustrated in FIG. 23. In such a case, the address generator 550 of the PIM controller 500 may generate and transmit the row/column address ADDR_R/ADDR_C to the PIM device 400. Although not shown in the drawings, if a plurality of memory banks are disposed in the PIM device 400, the address generator 550 may transmit a bank selection signal for selecting the memory bank 411 among the plurality of memory banks as well as the row/column address ADDR_R/ADDR_C to the PIM device 400. The MAC read signal MAC_RD_BK that is input to the PIM device 400 may control the data read operation for the memory bank 411 of the PIM device 400. The memory bank 411 may output and transmit the elements W0.0, . . . , and W0.7 in the first row of the weight matrix of the weight data stored in a region of the memory bank 411, which is designated by the row/column address ADDR_R/ADDR_C, to the MAC operator 420 in response to the MAC read signal MAC_RD_BK. In an embodiment, the data transmission from the memory bank 411 to the MAC operator 420 may be executed through a BIO line which is provided specifically for data transmission between the memory bank 411 and the MAC operator 420.

Meanwhile, the vector data X0.0, . . . , and X7.0 stored in the global buffer 412 may also be transmitted to the MAC operator 420 in synchronization with a point in time when the weight data are transmitted from the memory bank 411 to the MAC operator 420. In order to transmit the vector data X0.0, . . . , and X7.0 from the global buffer 412 to the MAC operator 420, a control signal for controlling the read operation for the global buffer 412 may be generated in synchronization with the MAC read signal MAC_RD_BK that is output from the MAC command generator 540 of the PIM controller 500. The data transmission between the global buffer 412 and the MAC operator 420 may be executed through a GIO line. Thus, the weight data and the vector data may be independently transmitted to the MAC operator 420 through two separate transmission lines, respectively. In an embodiment, the weight data and the vector data may be simultaneously transmitted to the MAC operator 420 through the BIO line and the GIO line, respectively.

Figure 24:
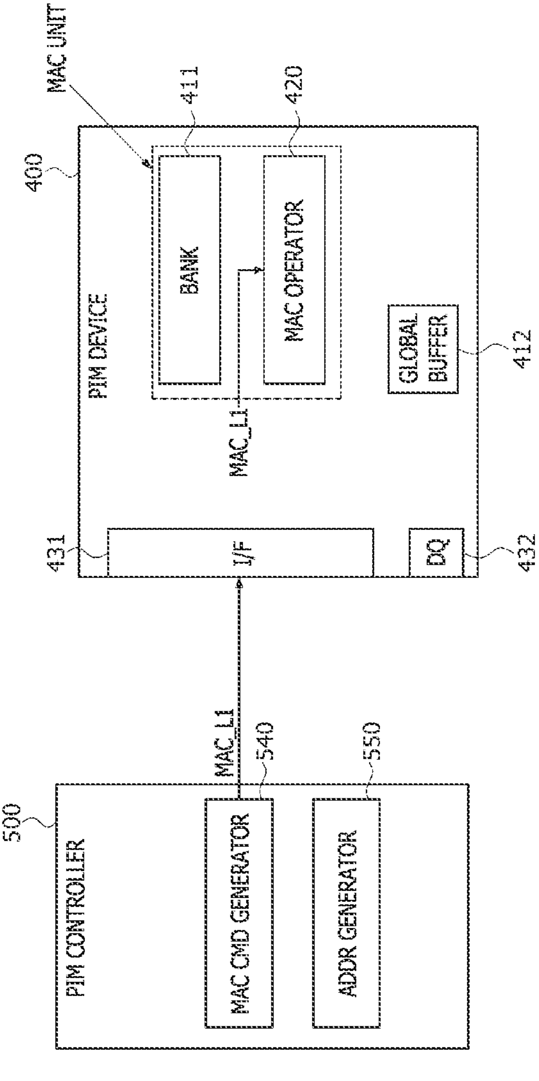

At a step 365, the MAC command generator 540 of the PIM controller 500 may generate and transmit the MAC input latch signal MAC_L1 to the PIM device 400, as illustrated in FIG. 24. The MAC input latch signal MAC_L1 may control the input latch operation of the weight data and the vector data for the MAC operator 420 of the PIM device 400. The elements W0.0, . . . , and W0.7 in the first row of the weight matrix and the elements X0.0, . . . , and X7.0 in the first column of the vector matrix may be input to the MAC circuit 122 of the MAC operator 420 by the input latch operation. The MAC circuit 122 may include the plurality of multipliers (e.g., the eight multipliers 122-11), the number of which is equal to the number of columns of the weight matrix and the number of rows of the vector matrix. The elements W0.0, . . . , and W0.7 in the first row of the weight matrix may be input to the first to eighth multipliers 122-11, respectively, and the elements X0.0, . . . , and X7.0 in the first column of the vector matrix may also be input to the first to eighth multipliers 122-11, respectively.

At a step 366, the MAC circuit 122 of the MAC operator 420 may perform the MAC arithmetic operation of an $R^{th}$ row of the weight matrix and the first column of the vector matrix, which are input to the MAC circuit 122. An initial value of 'R' may be set as '1'. Thus, the MAC arithmetic operation of the first row of the weight matrix and the first column of the vector matrix may be performed a first time. Specifically, as described with reference to FIG. 4, each of the multipliers 122-11 of the multiplication logic circuit 122-1 may perform a multiplying calculation of the inputted data, and the result data of the multiplying calculation may be input to the addition logic circuit 122-2. The addition logic circuit 122-2 may receive output data from the multipliers 122-11 and may perform the adding calculation of the output data of the multipliers 122-11 to output the result data of the adding calculation. The output data of the addition logic circuit 122-2 may correspond to result data (i.e., MAC result data) of the MAC arithmetic operation of the first row included in the weight matrix and the column included in the vector matrix. Thus, the output data of the addition logic circuit 122-2 may correspond to the element MAC0.0 located at the first row of the '8×1' MAC result matrix with the eight elements of MAC0.0, . . . , and MAC7.0 illustrated in FIG. 5. The output data MAC0.0 of the addition logic circuit 122-2 may be input to the output latch 123-1 disposed in the data output circuit 123 of the MAC operator 420, as described with reference to FIG. 4.

At a step 367, the MAC command generator 540 of the PIM controller 500 may generate and transmit the MAC output latch signal MAC_L3 to the PIM device 400, as illustrated in FIG. 25. The MAC output latch signal MAC_L3 may control the output latch operation of the MAC result data MAC0.0 performed by the MAC operator 420 of the PIM device 400. The MAC result data MAC0.0 transmitted from the MAC circuit 122 of the MAC operator 420 to the output latch 123-1 may be output from the output latch 123-1 by the output latch operation performed in synchronization with the MAC output latch signal MAC_L3, as described with reference to FIG. 4. The MAC result data MAC0.0 that is output from the output latch 123-1 may be input to the transfer gate 123-2 of the data output circuit 123.

Figure 26:
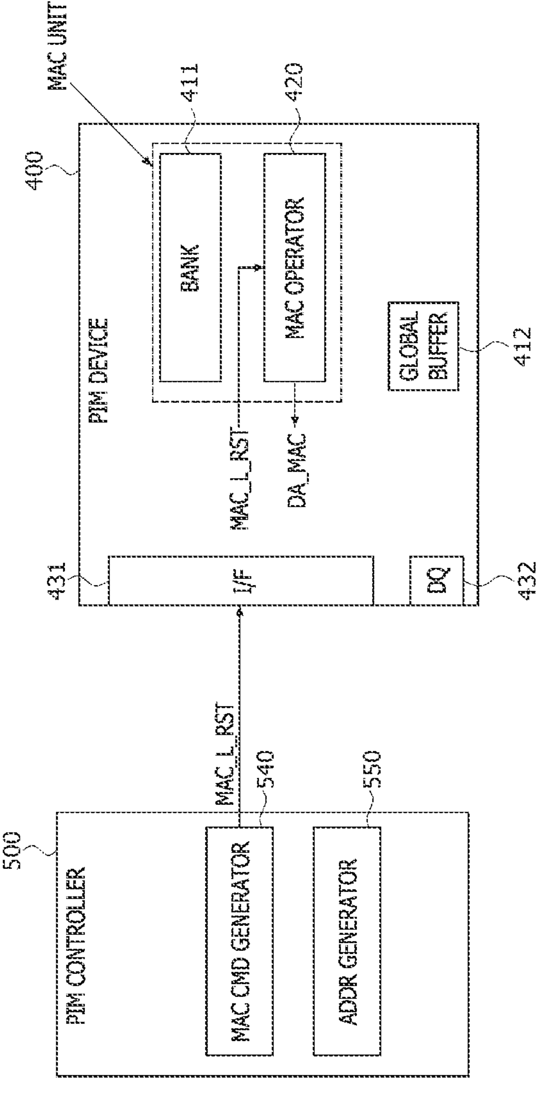

At a step 368, the MAC command generator 540 of the PIM controller 500 may generate and transmit the MAC latch reset signal MAC_L_RST to the PIM device 400, as illustrated in FIG. 26. The MAC latch reset signal MAC_L_RST may control an output operation of the MAC result data MAC0.0 generated by the MAC operator 420 and a reset operation of the output latch 123-1 included in the MAC operator 420. As described with reference to FIG. 4, the transfer gate 123-2 receiving the MAC result data MAC0.0 from the output latch 123-1 of the MAC operator 420 may be synchronized with the MAC latch reset signal MAC_L_RST to output the MAC result data MAC0.0. In an embodiment, the MAC result data MAC0.0 that is output from the MAC operator 420 may be stored into the memory bank 411 through the BIO line in the PIM device 400.

At a step 369, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 369. At a step 370, whether the row number changed at the step 369 is greater than the row number of the last row (i.e., the eighth row) of the weight matrix may be determined. Because the row number of the weight matrix is changed to '2' at the step 370, a process of the MAC arithmetic operation may be fed back to the step 364.

If the process of the MAC arithmetic operation is fed back to the step 364 from the step 370, the same processes as described with reference to the steps 364 to 370 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix. If the process of the MAC arithmetic operation is fed back to the step 364 from the step 370, the processes from the step 364 to the step 370 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 369, the MAC arithmetic operation may terminate because the row number of '9' is greater than the last row number of '8' at the step 370.

FIG. 27 is a flowchart illustrating processes of the MAC arithmetic operation described with reference to FIG. 14, which are performed in the PIM system 1-2 according to the second embodiment of the present disclosure. In order to perform the MAC arithmetic operation according to the present embodiment, the MAC operator 420 of the PIM device 400 may have the same configuration as the MAC operator 120-1 illustrated in FIG. 16. Referring to FIGS. 20 and 27, the first data (i.e., the weight data) may be written into the memory bank 411 at a step 381 to perform the MAC arithmetic operation. Thus, the weight data may be stored in the memory bank 411 of the PIM device 400. In the present embodiment, it may be assumed that the weight data are the elements W0.0, . . . , and W7.7 constituting the weight matrix of FIG. 14.

At a step 382, whether an inference is requested may be determined. An inference request signal may be transmitted from an external device located outside of the PIM system 1-2 to the PIM controller 500 of the PIM system 1-2. In an embodiment, if no inference request signal is transmitted to the PIM controller 500, the PIM system 1-2 may be in a standby mode until the inference request signal is transmitted to the PIM controller 500. Alternatively, if no inference request signal is transmitted to the PIM controller 500, the PIM system 1-2 may perform operations (e.g., data read/write operations) other than the MAC arithmetic operation in the memory mode until the inference request signal is transmitted to the PIM controller 500. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 14. If the inference request signal is transmitted to the PIM controller 500 at the step 382, then the PIM controller 500 may write the vector data transmitted with the inference request signal into the global buffer 412 at a step 383. Accordingly, the vector data may be stored in the global buffer 412 of the PIM device 400.

At a step 384, an output latch of a MAC operator 420 may be initially set to have bias data and the initially set bias data may be fed back to an accumulative adder of the MAC operator 420. This process is executed to perform the matrix adding calculation of the MAC result matrix and the bias matrix, which is described with reference to FIG. 14. That is, as illustrated in FIG. 16, the output latch 123-1 of the data output circuit 123-A included in the MAC operator 420 may be initially set to have the bias data of the bias matrix. Because the matrix multiplying calculation is executed for the first row of the weight matrix, the element B0.0 located at first row of the bias matrix may be initially set as the bias data in the output latch 123-1. The output latch 123-1 may output the bias data B0.0, and the bias data B0.0 that is output from the output latch 123-1 may be input to the accumulative adder 122-21D of the addition logic circuit 122-2 included in the MAC operator 420.

In an embodiment, in order to output the bias data B0.0 out of the output latch 123-1 and to feed back the bias data B0.0 to the accumulative adder 122-21D, the MAC command generator 540 of the PIM controller 500 may transmit the MAC output latch signal MAC_L3 to the MAC operator 420 of the PIM device 400. When a subsequent MAC arithmetic operation is performed, the accumulative adder 122-21D of the MAC operator 420 may add the MAC result data MAC0.0 that is output from the adder 122-21C disposed at the last stage to the bias data B0.0 which is fed back from the output latch 123-1 to generate the biased result data Y0.0 and may output the biased result data Y0.0 to the output latch 123-1. The biased result data Y0.0 may be output from the output latch 123-1 in synchronization with the MAC output latch signal MAC_L3 transmitted in a subsequent process.

At a step 385, the MAC command generator 540 of the PIM controller 500 may generate and transmit the MAC read signal MAC_RD_BK to the PIM device 400, as illustrated in FIG. 23. In such a case, the address generator 550 of the PIM controller 500 may generate and transmit the row/column address ADDR_R/ADDR_C to the PIM device 400. The MAC read signal MAC_RD_BK that is input to the PIM device 400 may control the data read operation for the memory bank 411 of the PIM device 400. The memory bank 411 may output and transmit the elements W0.0, . . . , and W0.7 in the first row of the weight matrix of the weight data stored in a region of the memory bank 411, which is designated by the row/column address ADDR_R/ADDR_C, to the MAC operator 420 in response to the MAC read signal MAC_RD_BK. In an embodiment, the data transmission from the memory bank 411 to the MAC operator 420 may be executed through a BIO line which is provided specifically for data transmission between the memory bank 411 and the MAC operator 420.

Meanwhile, the vector data X0.0, . . . , and X7.0 stored in the global buffer 412 may also be transmitted to the MAC operator 420 in synchronization with a point in time when the weight data are transmitted from the memory bank 411 to the MAC operator 420. In order to transmit the vector data X0.0, . . . , and X7.0 from the global buffer 412 to the MAC operator 420, a control signal for controlling the read operation for the global buffer 412 may be generated in synchronization with the MAC read signal MAC_RD_BK that is output from the MAC command generator 540 of the PIM controller 500. The data transmission between the global buffer 412 and the MAC operator 420 may be executed through a GIO line. Thus, the weight data and the vector data may be independently transmitted to the MAC operator 420 through two separate transmission lines, respectively. In an embodiment, the weight data and the vector data may be simultaneously transmitted to the MAC operator 420 through the BIO line and the GIO line, respectively.

At a step 386, the MAC command generator 540 of the PIM controller 500 may generate and transmit the MAC input latch signal MAC_L1 to the PIM device 400, as illustrated in FIG. 24. The MAC input latch signal MAC_L1 may control the input latch operation of the weight data and the vector data for the MAC operator 420 of the PIM device 400. The elements W0.0, . . . , and W0.7 in the first row of the weight matrix and the elements X0.0, . . . , and X7.0 in the first column of the vector matrix may be input to the MAC circuit 122 of the MAC operator 420 by the input latch operation. The MAC circuit 122 may include the plurality of multipliers (e.g., the eight multipliers 122-11), the number of which is equal to the number of columns of the weight matrix and the number of rows of the vector matrix. The elements W0.0, . . . , and W0.7 in the first row of the weight matrix may be input to the first to eighth multipliers 122-11, respectively, and the elements X0.0, . . . , and X7.0 in the first column of the vector matrix may also be input to the first to eighth multipliers 122-11, respectively.

At a step 387, the MAC circuit 122 of the MAC operator 420 may perform the MAC arithmetic operation of an $R^{th}$ row of the weight matrix and the first column of the vector matrix, which are input to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the inputted data, and the result data of the multiplying calculation may be input to the addition logic circuit 122-2. The addition logic circuit 122-2 may receive output data of the multipliers 122-11 and may perform the adding calculation of the output data of the multipliers 122-11 to output the result data of the adding calculation to the accumulative adder 122-21D. The output data of the adder 122-21C included in the addition logic circuit 122-2 may correspond to result data (i.e., MAC result data) of the MAC arithmetic operation of the first row included in the weight matrix and the column included in the vector matrix. The accumulative adder 122-21D may add the output data MAC0.0 of the adder 122-21C to the bias data B0.0 fed back from the output latch 123-1 and may output the result data of the adding calculation. The output data (i.e., the biased result data Y0.0) of the accumulative adder 122-21D may be input to the output latch 123-1 disposed in the data output circuit 123-A of the MAC operator 420.

At a step 388, the MAC command generator 540 of the PIM controller 500 may generate and transmit the MAC output latch signal MAC_L3 to the PIM device 400, as described with reference to FIG. 25. The MAC output latch signal MAC_L3 may control the output latch operation for the output latch 123-1 of the MAC operator 420 included in the PIM device 400. The output latch 123-1 of the MAC operator 420 may output the biased result data Y0.0 according to the output latch operation performed in synchronization with the MAC output latch signal MAC_L3. The biased result data Y0.0 that is output from the output latch 123-1 may be input to the transfer gate 123-2 of the data output circuit 123-A.

At a step 389, the MAC command generator 540 of the PIM controller 500 may generate and transmit the MAC latch reset signal MAC_L_RST to the PIM device 400, as illustrated in FIG. 26. The MAC latch reset signal MAC_L_RST may control an output operation of the biased result data Y0.0 generated by the MAC operator 420 and a reset operation of the output latch 123-1 included in the MAC operator 420. The transfer gate 123-2 receiving the biased result data Y0.0 from the output latch 123-1 of the MAC operator 420 may be synchronized with the MAC latch reset signal MAC_L_RST to output the biased result data Y0.0. In an embodiment, the biased result data Y0.0 that is output from the MAC operator 120 may be stored into the memory bank 411 through the BIO line in the PIM device 400.

At a step 390, the row number 'R' of the weight matrix for which the MAC arithmetic operation is performed may be increased by '1'. Because the MAC arithmetic operation for the first row among the first to eight rows of the weight matrix has been performed at the previous steps, the row number of the weight matrix may change from '1' to '2' at the step 390. At a step 391, whether the row number changed at the step 390 is greater than the row number of the last row (i.e., the eighth row) of the weight matrix may be determined. Because the row number of the weight matrix is changed to '2' at the step 390, a process of the MAC arithmetic operation may be fed back to the step 384.

If the process of the MAC arithmetic operation is fed back to the step 384 at the step 391, the same processes as described with reference to the steps 384 to 391 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix. If the process of the MAC arithmetic operation is fed back to the step 384 at the step 391, then the processes from the step 384 to the step 390 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 390, then the MAC arithmetic operation may terminate because the row number of '9' is greater than the last row number of '8' at the step 391.

Figure 28:
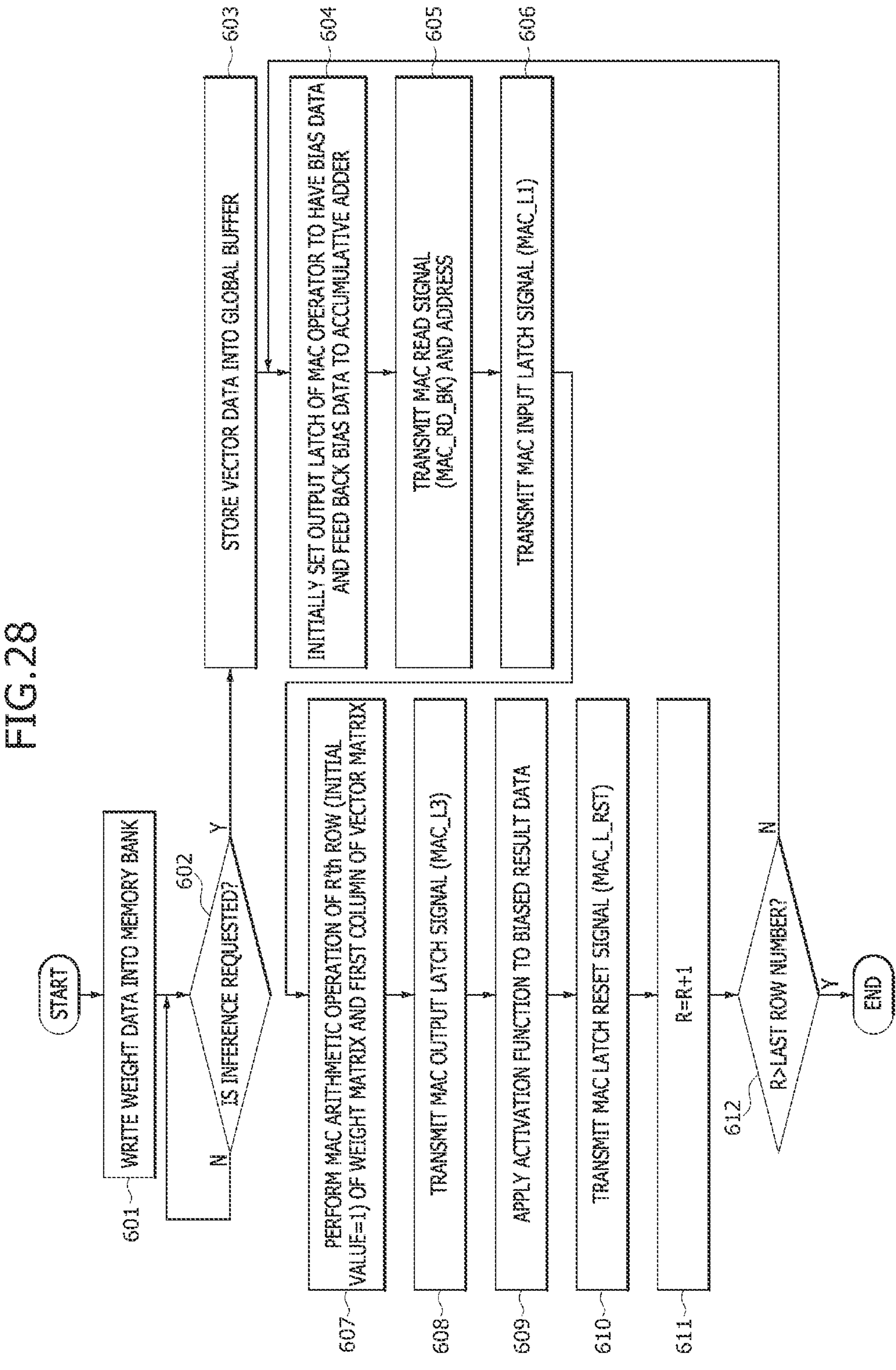
FIG. 28 is a flowchart illustrating processes of the MAC arithmetic operation illustrated in FIG. 17 in a PIM system according to a second embodiment of the present disclosure.

FIG. 28 is a flowchart illustrating processes of the MAC arithmetic operation described with reference to FIG. 17, which are performed in the PIM system 1-2 according to the second embodiment of the present disclosure. In order to perform the MAC arithmetic operation according to the present embodiment, the MAC operator 420 of the PIM device 400 may have the same configuration as the MAC operator 120-2 illustrated in FIG. 19. Referring to FIGS. 19 and 28, the first data (i.e., the weight data) may be written into the memory bank 411 at a step 601 to perform the MAC arithmetic operation. Thus, the weight data may be stored in the memory bank 411 of the PIM device 400. In the present embodiment, it may be assumed that the weight data are the elements W0.0, . . . , and W7.7 constituting the weight matrix of FIG. 17.

At a step 602, whether an inference is requested may be determined. An inference request signal may be transmitted from an external device located outside of the PIM system 1-2 to the PIM controller 500 of the PIM system 1-2. In an embodiment, if no inference request signal is transmitted to the PIM controller 500, the PIM system 1-2 may be in a standby mode until the inference request signal is transmitted to the PIM controller 500. Alternatively, if no inference request signal is transmitted to the PIM controller 500, the PIM system 1-2 may perform operations (e.g., data read/write operations) other than the MAC arithmetic operation in the memory mode until the inference request signal is transmitted to the PIM controller 500. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 17. If the inference request signal is transmitted to the PIM controller 500 at the step 602, then the PIM controller 500 may write the vector data transmitted with the inference request signal into the global buffer 412 at a step 603. Accordingly, the vector data may be stored in the global buffer 412 of the PIM device 400.

At a step 604, an output latch of a MAC operator 420 may be initially set to have bias data and the initially set bias data may be fed back to an accumulative adder of the MAC operator 420. This process is executed to perform the matrix adding calculation of the MAC result matrix and the bias matrix, which is described with reference to FIG. 17. That is, as described with reference to FIG. 19, the output latch 123-1 of the data output circuit 123-B included in the MAC operator 420 may be initially set to have the bias data of the bias matrix. Because the matrix multiplying calculation is executed for the first row of the weight matrix, the element B0.0 located at first row of the bias matrix may be initially set as the bias data in the output latch 123-1. The output latch 123-1 may output the bias data B0.0, and the bias data B0.0 that is output from the output latch 123-1 may be input to the accumulative adder 122-21D of the addition logic circuit 122-2 included in the MAC operator 420.

In an embodiment, in order to output the bias data B0.0 out of the output latch 123-1 and to feed back the bias data B0.0 to the accumulative adder 122-21D, the MAC command generator 540 of the PIM controller 500 may transmit the MAC output latch signal MAC_L3 to the MAC operator 420 of the PIM device 400. When a subsequent MAC arithmetic operation is performed, the accumulative adder 122-21D of the MAC operator 420 may add the MAC result data MAC0.0 that is output from the adder 122-21C disposed at the last stage of the addition logic circuit 122-2 to the bias data B0.0 which is fed back from the output latch 123-1 to generate the biased result data Y0.0 and may output the biased result data Y0.0 to the output latch 123-1. The biased result data Y0.0 may be output from the output latch 123-1 in synchronization with the MAC output latch signal MAC_L3 transmitted in a subsequent process.

At a step 605, the MAC command generator 540 of the PIM controller 500 may generate and transmit the MAC read signal MAC_RD_BK to the PIM device 400, as illustrated in FIG. 23. In such a case, the address generator 550 of the PIM controller 500 may generate and transmit the row/column address ADDR_R/ADDR_C to the PIM device 400. The MAC read signal MAC_RD_BK that is input to the PIM device 400 may control the data read operation for the memory bank 411 of the PIM device 400. The memory bank 411 may output and transmit the elements W0.0, . . . , and W0.7 in the first row of the weight matrix of the weight data stored in a region of the memory bank 411, which is designated by the row/column address ADDR_R/ADDR_C, to the MAC operator 420 in response to the MAC read signal MAC_RD_BK. In an embodiment, the data transmission from the memory bank 411 to the MAC operator 420 may be executed through a BIO line which is provided specifically for data transmission between the memory bank 411 and the MAC operator 420.

Meanwhile, the vector data X0.0, . . . , and X7.0 stored in the global buffer 412 may also be transmitted to the MAC operator 420 in synchronization with a point in time when the weight data are transmitted from the memory bank 411 to the MAC operator 420. In order to transmit the vector data X0.0, . . . , and X7.0 from the global buffer 412 to the MAC operator 420, a control signal for controlling the read operation for the global buffer 412 may be generated in synchronization with the MAC read signal MAC_RD_BK that is output from the MAC command generator 540 of the PIM controller 500. The data transmission between the global buffer 412 and the MAC operator 420 may be executed through a GIO line. Thus, the weight data and the vector data may be independently transmitted to the MAC operator 420 through two separate transmission lines, respectively. In an embodiment, the weight data and the vector data may be simultaneously transmitted to the MAC operator 420 through the BIO line and the GIO line, respectively.

At a step 606, the MAC command generator 540 of the PIM controller 500 may generate and transmit the MAC input latch signal MAC_L1 to the PIM device 400, as described with reference to FIG. 24. The MAC input latch signal MAC_L1 may control the input latch operation of the weight data and the vector data for the MAC operator 420 of the PIM device 400. The elements W0.0, . . . , and W0.7 in the first row of the weight matrix and the elements X0.0, . . . , and X7.0 in the first column of the vector matrix may be input to the MAC circuit 122 of the MAC operator 420 by the input latch operation. The MAC circuit 122 may include the plurality of multipliers (e.g., the eight multipliers 122-11), the number of which is equal to the number of columns of the weight matrix and the number of rows of the vector matrix. The elements W0.0, . . . , and W0.7 in the first row of the weight matrix may be input to the first to eighth multipliers 122-11, respectively, and the elements X0.0, . . . , and X7.0 in the first column of the vector matrix may also be input to the first to eighth multipliers 122-11, respectively.

At a step 607, the MAC circuit 122 of the MAC operator 420 may perform the MAC arithmetic operation of an $R^{th}$ row of the weight matrix and the first column of the vector matrix, which are input to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the inputted data, and the result data of the multiplying calculation may be input to the addition logic circuit 122-2. The addition logic circuit 122-2 may receive output data of the multipliers 122-11 and may perform the adding calculation of the output data of the multipliers 122-11 to output the result data of the adding calculation to the accumulative adder 122-21D. The output data of the adder 122-21C included in the addition logic circuit 122-2 may correspond to result data (i.e., the MAC result data MAC0.0) of the MAC arithmetic operation of the first row included in the weight matrix and the column included in the vector matrix. The accumulative adder 122-21D may add the output data MAC0.0 of the adder 122-21C to the bias data B0.0 fed back from the output latch 123-1 and may output the result data of the adding calculation. The output data (i.e., the biased result data Y0.0) of the accumulative adder 122-21D may be input to the output latch 123-1 disposed in the data output circuit 123-A of the MAC operator 420.

At a step 608, the MAC command generator 540 of the PIM controller 500 may generate and transmit the MAC output latch signal MAC_L3 to the PIM device 400, as described with reference to FIG. 25. The MAC output latch signal MAC_L3 may control the output latch operation for the output latch 123-1 of the MAC operator 420 included in the PIM device 400. The output latch 123-1 of the MAC operator 420 may output the biased result data Y0.0 according to the output latch operation performed in synchronization with the MAC output latch signal MAC_L3. The biased result data Y0.0 that is output from the output latch 123-1 may be input to the activation function logic circuit 123-5, which is illustrated in FIG. 19. At a step 610, the activation function logic circuit 123-5 may apply an activation function to the biased result data Y0.0 to generate a final output value, and the final output value may be input to the transfer gate (123-2 of FIG. 4).

At a step 610, the MAC command generator 540 of the PIM controller 500 may generate and transmit the MAC latch reset signal MAC_L_RST to the PIM device 400, as described with reference to FIG. 26. The MAC latch reset signal MAC_L_RST may control an output operation of the final output value generated by the MAC operator 420 and a reset operation of the output latch 123-1 included in the MAC operator 420. The transfer gate 123-2 receiving the final output value from the activation function logic circuit 123-5 of the data output circuit 123-B included in the MAC operator 420 may be synchronized with the MAC latch reset signal MAC_L_RST to output the final output value. In an embodiment, the final output value that is output from the MAC operator 420 may be stored into the memory bank 411 through the BIO line in the PIM device 400.

At a step 611, the row number 'R' of the weight matrix for which the MAC arithmetic operation is performed may be increased by '1'. Because the MAC arithmetic operation for the first row among the first to eight rows of the weight matrix has been performed at the previous steps, the row number of the weight matrix may change from '1' to '2' at the step 611. At a step 612, whether the row number changed at the step 611 is greater than the row number of the last row (i.e., the eighth row) of the weight matrix may be determined. Because the row number of the weight matrix is changed to '2' at the step 611, a process of the MAC arithmetic operation may be fed back to the step 604.

If the process of the MAC arithmetic operation is fed back to the step 604 from the step 612, the same processes as described with reference to the steps 604 to 612 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix to generate the MAC result data (corresponding to the element MAC1.0 located in the second row of the MAC result matrix) and the bias data (corresponding to the element B1.0 located in the second row of the bias matrix). If the process of the MAC arithmetic operation is fed back to the step 604 from the step 612, the processes from the step 604 to the step 612 may be iteratively performed until the MAC arithmetic operation is performed for all of the rows (i.e., first to eighth rows) of the weight matrix with the vector matrix. If the MAC arithmetic operation for the eighth row of the weight matrix terminates and the row number of the weight matrix changes from '8' to '9' at the step 611, the MAC arithmetic operation may terminate because the row number of '9' is greater than the last row number of '8' at the step 612.

FIG. 29 is a block diagram illustrating a PIM system 1-3 according to a third embodiment of the present disclosure. As illustrated in FIG. 29, the PIM system 1-3 may have substantially the same configuration as the PIM system 1-1 illustrated in FIG. 2 except that a PIM controller 200A of the PIM system 1-3 further includes a mode register set (MRS) 260 as compared with the PIM controller 200 of the PIM system 1-1. Thus, the same explanation as described with reference to FIG. 2 will be omitted hereinafter. The mode register set 260 in the PIM controller 200A may receive an MRS signal instructing arrangement of various signals necessary for the MAC arithmetic operation of the PIM system 1-3. In an embodiment, the mode register set 260 may receive the MRS signal from the mode selector 221 included in the scheduler 220. However, in another embodiment, the MRS signal may be provided by an extra logic circuit other than the mode selector 221. The mode register set 260 receiving the MRS signal may transmit the MRS signal to the MAC command generator 240. For an embodiment, the MRS 260 represents a MRS circuit.

In an embodiment, the MRS signal may include timing information on when the MAC command signals MAC_CMDs are generated. In such a case, the deterministic operation of the PIM system 1-3 may be performed by the MRS signal provided by the MRS 260. In another embodiment, the MRS signal may include information on the timing related to an interval between the MAC modes or information on a mode change between the MAC mode and the memory mode. In an embodiment, generation of the MRS signal in the MRS 260 may be executed before the vector data are stored in the second memory bank 112 of the PIM device 100 by the inference request signal transmitted from an external device to the PIM controller 200A. Alternatively, the generation of the MRS signal in the MRS 260 may be executed after the vector data are stored in the second memory bank 112 of the PIM device 100 by the inference request signal transmitted from an external device to the PIM controller 200A.

FIG. 30 is a block diagram illustrating a PIM system 1-4 according to a fourth embodiment of the present disclosure. As illustrated in FIG. 30, the PIM system 1-4 may have substantially the same configuration as the PIM system 1-2 illustrated in FIG. 20 except that a PIM controller 500A of the PIM system 1-4 further includes the mode register set (MRS) 260 as compared with the PIM controller 500 of the PIM system 1-2. Thus, the same explanation as described with reference to FIG. 20 will be omitted hereinafter. The mode register set 260 in the PIM controller 500A may receive an MRS signal instructing arrangement of various signals necessary for the MAC arithmetic operation of the PIM system 1-4. In an embodiment, the mode register set 260 may receive the MRS signal from the mode selector 221 included in the scheduler 220. However, in another embodiment, the MRS signal may be provided by an extra logic circuit other than the mode selector 221. The mode register set 260 receiving the MRS signal may transmit the MRS signal to the MAC command generator 540.

In an embodiment, the MRS signal may include timing information on when the MAC command signals MAC_CMDs are generated. In such a case, the deterministic operation of the PIM system 1-4 may be performed by the MRS signal provided by the MRS 260. In another embodiment, the MRS signal may include information on the timing related to an interval between the MAC modes or information on a mode change between the MAC mode and the memory mode. In an embodiment, generation of the MRS signal in the MRS 260 may be executed before the vector data are stored in the global buffer 412 of the PIM device 400 by the inference request signal transmitted from an external device to the PIM controller 500A. Alternatively, the generation of the MRS signal in the MRS 260 may be executed after the vector data are stored in the global buffer 412 of the PIM device 400 by the inference request signal transmitted from an external device to the PIM controller 500A.

FIG. 31 is a block diagram illustrating a PIM device 600 according to another embodiment of the present disclosure. Referring to FIG. 31, the PIM device 600 may include a MAC unit 610, a global buffer (GB) 620, a command decoder 630, an address signal generator 640, a data input/output circuit 650, and a mode register 660. The MAC unit 610 may include a memory bank (BK) 611 and a MAC operator (MAC) 612. Although FIG. 31 illustrates only one MAC unit 610, this is only an example, and as described with reference to FIG. 27, the PIM device 600 may include a plurality of MAC units. In this case, each of the plurality of MAC units may operate in the same manner as the MAC unit 610 of the PIM device 600 according to the present embodiment.

The memory bank 611 may transmit stored data (i.e., read data) to outside of the PIM device 600 through a GIO line. In addition, the memory bank 611 may store data (i.e., write data) received from the outside of the PIM device 600 through the GIO line. The memory bank 611 may transmit weight data to the MAC operator 612 through a BIO line disposed between the memory bank 611 and the MAC operator 612. However, this is only an example, and when there is no BIO line, the memory bank 611 may transmit the weight data to the MAC operator 612 through the GIO line. The global buffer 620 may receive and store vector data transmitted from the outside of the PIM device 600 through the GIO line. The global buffer 620 may transmit stored vector data to the MAC operator 612 of the MAC unit 610 through the GIO line. The MAC operator 612 may receive the weight data and the vector data from the memory bank 611 and the global buffer 620, respectively, and may perform a MAC operation to generate MAC result data. The MAC operator 612 may transmit the MAC result data to the outside of the PIM device 600 through the GIO line. The MAC operator 612 may have the same configuration as the MAC operator 320 described with reference to FIG. 20. However, in the following examples, a first latch control signal MACL1 and a second latch control signal MACL2 may have the same functions as the MAC input latch signal MAC_L1 and the MAC output latch signal MAC_L3 of FIG. 20, respectively.

The command decoder 630 may decode a command CMD received from the outside of the PIM device 600, for example, a controller (or a host) to generate and output a control signal. In an embodiment, when a read command CMD_RD is received, the command decoder 630 may generate and output a read control signal RD. When a write command CMD_WR is received, the command decoder 630 may generate and output a write control signal WR. When a vector data write command CMD_WRV is received, the command decoder 630 may generate and output a vector data write control signal WR_VEC. When a MAC result data read command CMD_RD_RST is received, the command decoder 630 may generate and output a MAC result data read control signal MAC_RD_RST.

When a MAC operation command CMD_MAC is received, the command decoder 630 may generate a MAC operation control signal MAC_OP to transmit the MAC operation control signal MAC_OP to the mode register 660. The command decoder 630 may receive a MAC burst enable signal EN_B_MAC and an internal MAC operation interval signal MAC_CCD from the mode register 660. In addition, the command decoder 630 may receive a MAC operation end signal END_MAC from the address signal generator 640. The command decoder 630 may generate an internal MAC operation signal INMAC based on the MAC operation command CMD_MAC, a MAC burst enable signal EN_B_MAC, the internal MAC operation interval signal MAC_CCD, and the MAC operation end signal END_MAC. The command decoder 630 may transmit the internal MAC operation signal INMAC to the address signal generator 640. The command decoder 630 may sequentially generate and output a plurality of internal MAC operation control signals IN_MAC_OPs at a regular time interval, based on the internal MAC operation signal INMAC. In an embodiment, the internal MAC operation control signals IN_MAC_OPs may include a MAC read control signal MAC_RD, a first latch control signal MACL1, and a second latch control signal MACL2. The MAC read control signal MAC_RD may be transmitted to the memory bank 611 and the global buffer 620. The first latch control signal MACL1 and the second latch control signal MACL2 may be transmitted to the MAC operator 612.

Whether the internal MAC operation signal INMAC is generated in the command decoder 630 may be determined by the MAC burst enable signal EN_B_MAC. For example, when a MAC burst enable signal EN_B_MAC of a logic "high" level is transmitted from the mode register 660, the internal MAC operation signal INMAC may be generated. When a MAC burst enable signal EN_B_MAC of a logic "low" level is transmitted from the mode register 660, the internal MAC operation signal INMAC might not be generated. A time point at which the internal MAC operation signal INMAC is generated in the command decoder 630 may be determined by the internal MAC operation interval signal MAC_CCD. A time point at which the generation of the internal MAC operation signal INMAC ends in the command decoder 630 may be determined by the MAC operation end signal END_MAC. Although not shown in the drawing, the command decoder 630 may receive an active command and a pre-charge command from a controller. In this case, the command decoder 630 may generate an active control signal and a pre-charge control signal and transmit the active control signal and the pre-charge control signal to the memory bank 611.

The address signal generator 640 may receive an address signal ADDR transmitted from the controller. The address signal generator 640 may latch the address signal ADDR to generate and output an internal address signal IN_ADDR. When the active command or the pre-charge command is transmitted from the controller to the PIM device 600, together with a row address signal, the address signal generator 640 may output the row address signal as the internal address signal IN_ADDR. When the read command CMD_RD or the write command CMD_WR is transmitted from the controller, together with a column address signal, the address signal generator 640 may output the column address signal as the internal address signal IN_ADDR. When the vector data write command CMD_WRV is transmitted from the controller, together with an address signal designating a region where the vector data is to be stored in the global buffer 620, the address signal generator 640 may output the address signal as the internal address signal IN_ADDR. When the MAC operation command MAC_CMD is transmitted from the controller, together with a column address signal, the address signal generator 640 may generate a plurality of column address signals and sequentially output each of the plurality of generated column address signals as the internal address signal IN_ADDR.

The address signal generator 640 may receive the internal MAC operation signal INMAC from the command decoder 630. In addition, the address signal generator 640 may receive a last address signal L_ADDR and the MAC burst enable signal EN_B_MAC from the mode register 660. When the last address signal L_ADDR and the MAC burst enable signal EN_B_MAC are transmitted from the mode register 660 and the internal MAC operation signal INMAC is transmitted from the command decoder 630, the address signal generator 640 may output the internal address signal IN_ADDR at a regular interval. In this case, the internal address signal IN_ADDR first output from the address signal generator 640 may be constituted with the address signal ADDR transmitted from the controller. The internal address signal IN_ADDR second output from the address signal generator 640 may be constituted with an address signal increased by a predetermined value from the address signal ADDR. As described, whenever the internal address signal IN_ADDR is output from the address signal generator 640, an internal address signal IN_ADDR increased by a predetermined value from the previously output internal address signal IN_ADDR may be output. When the internal address signal IN_ADDR output from the address signal generator 640 has the same value as the last address signal L_ADDR, the address signal generator 640 may generate and output the MAC operation end signal END_MAC. The MAC operation end signal END_MAC may be transmitted to the command decoder 630. The word "predetermined" as used herein with respect to a parameter, such as a predetermined value or predetermined cycle, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The data input/output circuit 650 may receive data from the controller and transmit the received data to the memory bank 611 or the global buffer 620 through the GIO line. In an embodiment, the data input/output circuit 650 may receive write data, for example, weight data that is used in the MAC operation, and may transmit the weight data to the memory bank 611 through the GIO line. In addition, the data input/output circuit 650 may receive vector data that is used in the MAC operation, and may transmit the vector data to the global buffer 620 through the GIO line. The data input/output circuit 650 may receive write data from the memory bank 611 through the GIO line, and may transmit the write data to the outside of the PIM device 600, for example, a host or a controller. In addition, the data input/output circuit 650 may receive the MAC result data from the MAC operator 612 through the GIO line, and may transmit the MAC result data to the outside of the PIM device 600, for example, a host or a controller.

The mode register 660 may store MAC burst operation parameters necessary to cause the MAC operation to be performed in a burst mode. In an embodiment, the MAC burst operation parameters may include the number of internal MAC operations performed in the burst mode, an interval between the internal MAC operations, and information about the internal address signal. Such MAC burst operation parameters may be determined by a time required for performing a MAC operation in the MAC unit 610 and a method in which the weight data is stored in the memory bank 611. In an embodiment, the interval between the internal MAC operations may be set to be equal to or longer than the time required for performing the MAC operation in the MAC unit 610. In an embodiment, when the weight data is stored in units of a plurality of column address groups in one row of the memory bank 611, the number of internal MAC operations may be set to be equal to the number of column address groups. The internal addresses may be set to be the same as the first column address signal of each of the column address groups. An operation of setting the MAC burst operation parameters in the mode register 660 may be performed after the operations of storing the weight data in the memory bank 611 and storing the vector data in the global buffer 620 are performed.

The mode register 660 may receive the MAC operation control signal MAC_OP from the command decoder 630. When the MAC operation control signal MAC_OP is received, the mode register 660 may generate and output a MAC burst enable signal EN_B_MAC of a logic "high" level that activates the MAC burst operation, an internal MAC operation interval signal MAC_CCD that indicates a time interval between the internal MAC operations, and a last address signal L_ADDR corresponding to the column address of a region in which the data used for the last internal MAC operation among the internal MAC operations is stored. The mode register 660 may transmit the MAC burst enable signal EN_B_MAC to the command decoder 630 and the address signal generator 640. The mode register 660 may transmit the internal MAC operation interval signal MAC_CCD to the command decoder 630. The mode register 660 may transmit the last address signal L_ADDR to the address signal generator 640.

Figure 32:
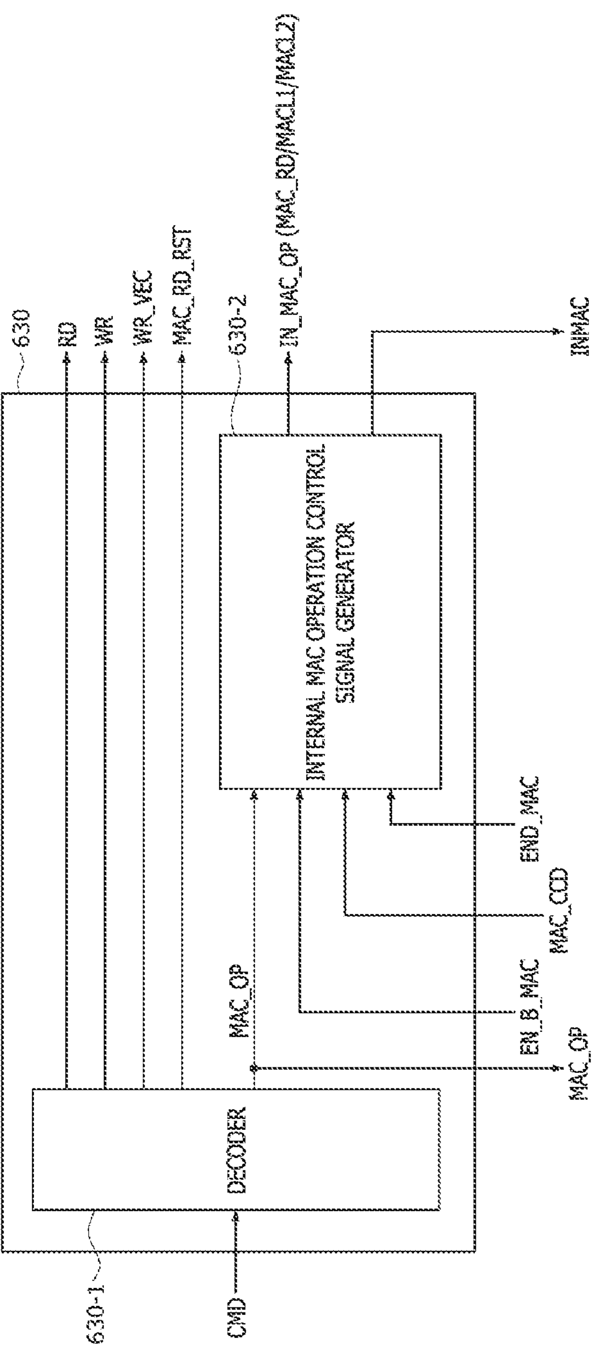
FIG. 32 is a block diagram illustrating an example of a configuration of a command decoder of the PIM device of FIG. 31.

FIG. 32 is a block diagram illustrating an example of a configuration of the command decoder 630 of the PIM device 600 of FIG. 31. Referring to FIG. 32, the command decoder 630 may include a decoder 630-1 and an internal MAC operation control signal generator 630-2. The decoder 630-1 may generate and output a read control signal RD when the externally transmitted command CMD is the read command (CMD_RD of FIG. 31) requesting a read operation of the PIM device 600. The decoder 630-1 may generate and output a write control signal WR when the externally transmitted command CMD is the write command (CMD_WR of FIG. 31) requesting a write operation of the PIM device 600. The decoder 630-1 may generate and output a vector data write control signal WR_VEC when the externally transmitted command CMD is the vector data write command (CMD_WRV of FIG. 31) requesting a vector data write operation of the PIM device 600. The decoder 630-1 may generate and output a MAC result data read control signal MAC_RD_RST when the externally transmitted command CMD is the MAC result data read command (CMD_RD_RST of FIG. 31) requesting a MAC result data read operation of the PIM device 600. The decoder 630-1 may generate and output a MAC operation control signal MAC_OP when the externally transmitted command CMD is a MAC operation command (CMD_MAC of FIG. 31) requesting a MAC operation of the PIM device 600. The MAC operation control signal MAC_OP may be transmitted to the internal MAC operation control signal generator 630-2 and the mode register (660 of FIG. 31).

The internal MAC operation control signal generator 630-2 may receive the MAC burst enable signal EN_B_MAC and the internal MAC operation interval signal MAC_CCD from the mode register (660 of FIG. 31), and receive the MAC operation end signal END_MAC from the address signal generator (640 of FIG. 31). The internal MAC operation control signal generator 630-2 may generate the internal MAC operation signal INMAC and transmit the internal MAC operation signal INMAC to the address signal generator (640 of FIG. 31) based on the MAC operation control signal MAC_OP, the MAC burst enable signal EN_B_MAC, the internal MAC operation interval signal MAC_CCD, and the MAC operation end signal END_MAC. In addition, the internal MAC operation control signal generator 630-2 may generate and output the internal MAC operation control signal IN_MAC_OP based on the internal MAC operation signal INMAC. As described with reference to FIG. 31, the internal MAC operation control signal IN_MAC_OP may include the MAC read control signal MAC_RD, the first latch control signal MACL1, and the second latch control signal MACL2.

Figure 33:
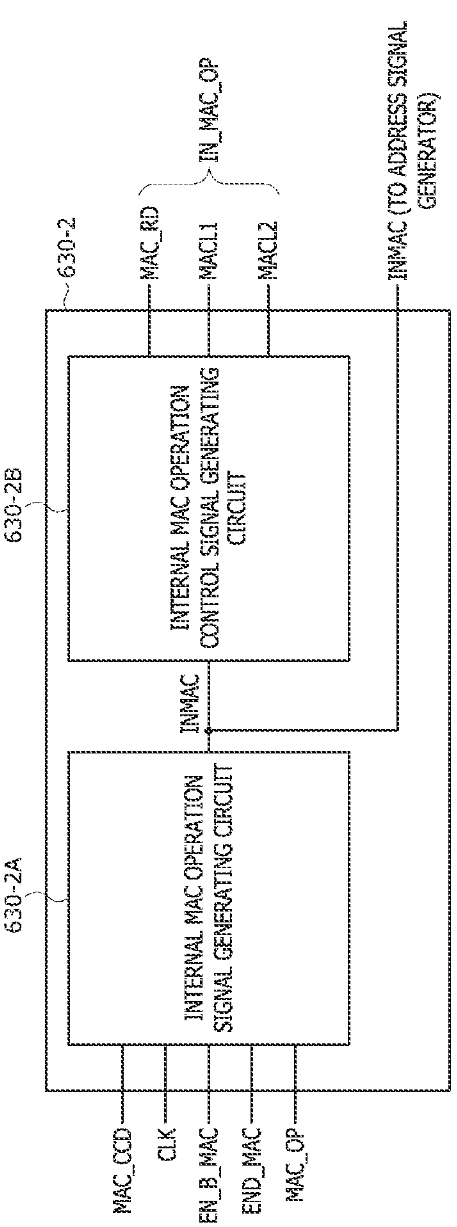
FIG. 33 is a block diagram illustrating an example of a configuration of a MAC operation signal generator of the command decoder of FIG. 32.

FIG. 33 is a block diagram illustrating an example of a configuration of the MAC operation control signal generator 630-2 of the command decoder 630 of FIG. 32. Referring to FIG. 33, the MAC operation control signal generator 630-2 may include an internal MAC operation signal generating circuit 630-2A and an internal MAC operation control signal generating circuit 630-2B. The internal MAC operation signal generating circuit 630-2A may receive the internal MAC operation interval signal MAC_CCD and the MAC burst enable EN_B_MAC from the mode register (660 of FIG. 31). The internal MAC operation signal generating circuit 630-2A may receive the MAC operation end signal END_MAC from the address latch (640 of FIG. 31). The internal MAC operation signal generating circuit 630-2A may receive the MAC operation control signal MAC_OP from the decoder (630-1 of FIG. 32). In addition, the internal MAC operation signal generating circuit 630-2A may receive a clock signal CLK. In an embodiment, the clock signal CLK may be transmitted from outside of the PIM device 600 or may be generated in the PIM device 600. The internal MAC operation signal generating circuit 630-2A may generate and output a plurality of internal MAC operation signals INMACs based on the received signals MAC_CCD, CLK, EN_B_MAC, END_MAC, and MAC_OP at a regular interval. The internal MAC operation signals INMACs output from the internal MAC operation signal generating circuit 630-2A may be transmitted to the internal MAC operation control signal generating circuit 630-2B. In addition, as described with reference to FIG. 31, the internal MAC operation signals INMACs output from the internal MAC operation signal generating circuit 630-2A may also be transmitted to the address signal generator (640 of FIG. 31).

The internal MAC operation control signal generating circuit 630-2B may sequentially generate and output the MAC read control signal MAC_RD, the first latch control signal MACL1, and the second latch control signal MACL2 based on the internal MAC operation signals INMACs output from the internal MAC operation signal generating circuit 630-2A. Hereinafter, for example, a first signal generated first will be referred to as a primary first signal, and a first signal generated second will be referred to as a secondary first signal. Subsequent signals will also be referred to in the same manner. For example, the internal MAC operation control signal generating circuit 630-2B may sequentially generate and output a first MAC read control signal MAC_RD, a primary first latch control signal MACL1, and a primary second latch control signal MACL2 based on a first internal MAC operation signal INMAC. Next, the internal MAC operation control signal generating circuit 630-2B may generate and output a second MAC read control signal MAC_RD, a secondary first latch control signal MACL1, and a secondary second latch control signal MACL2 based on a second internal MAC operation signal INMAC. In this way, the operation of outputting the internal MAC operation control signal IN_MAC_OP from the internal MAC operation control signal generator 630-2 may be performed until the internal MAC operation control signal INMAC is no longer transmitted.

Figure 34:
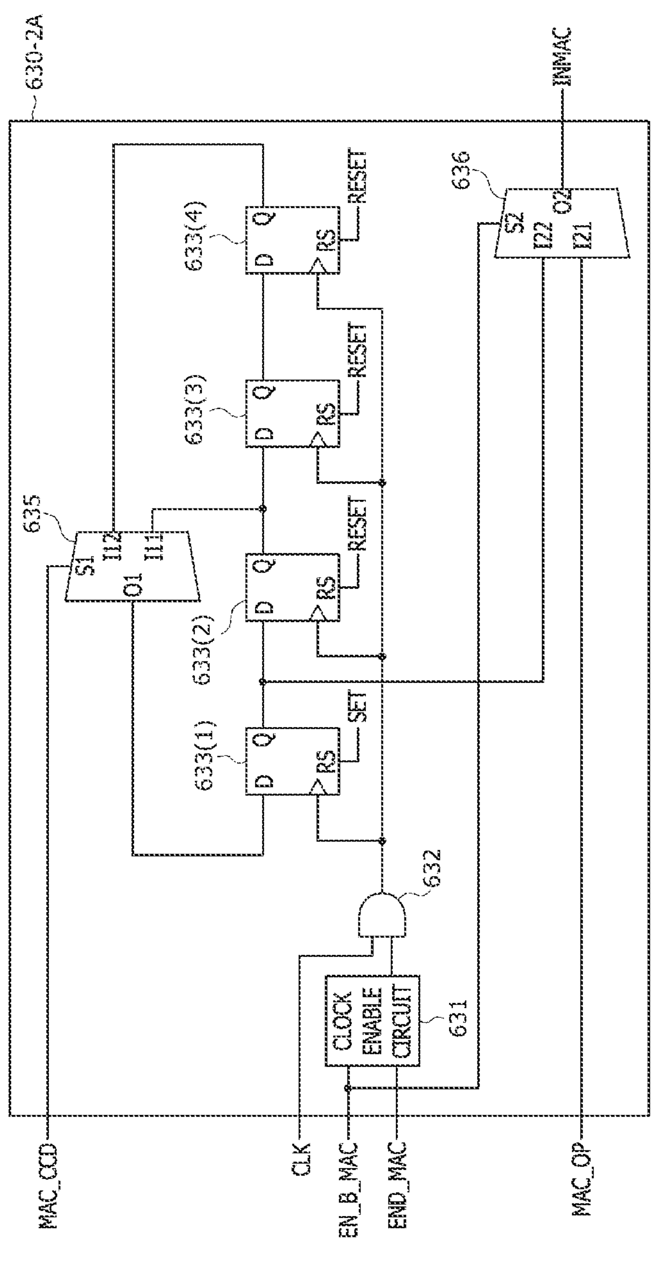
FIG. 34 is a circuit diagram illustrating an example of an internal MAC operation signal generating circuit of the MAC operation control signal generator of FIG. 33.

FIG. 34 is a circuit diagram illustrating an example of an internal MAC operation signal generating circuit 630-2A of the MAC operation control signal generator 630-2 of FIG. 33. Referring to FIG. 34, the internal MAC operation signal generating circuit 630-2A may include a clock enable circuit 631, an AND gate 632, first to fourth flip-flops 633(1)-633(4), a first selector 635, and a second selector 635. In the present embodiment, the internal MAC operation signal generating circuit 630-2A includes four flip-flops 633(1)-633(4), but this is only an example, and the internal MAC operation signal generating circuit 630-2A may include a plurality of flip-flops other than four. When a connection structure with the flip-flops 633(1)-633(4) is changed or the number of flip-flops is changed, the number of input terminals of the first selector 635 may also be changed. In an embodiment, when the internal MAC operation signal generating circuit 630-2A includes four flip-flops 633(1)-633(4), the fourth flip-flop 633(4) may be referred to as a last flip-flop among the four flip-flops 633(1)-633(4).

The clock enable circuit 631 may generate and output a clock enable signal that activates the clock signal CLK or a clock disable signal that disables the clock signal CLK. In an embodiment, the clock enable signal may have a logic “high” level, and the clock disable signal may have a logic “low” level. The clock enable circuit 631 may receive the MAC burst enable signal EN_B_MAC and the MAC operation end signal END_MAC. When the MAC burst enable signal EN_B_MAC is at a logic “high” level and the MAC operation end signal END_MAC is at a logic “low” level, the clock enable circuit 631 may generate and output a clock enable signal, that is, a logic “high” signal. On the other hand, when the MAC operation end signal END_MAC is at a logic “high” level, the clock enable circuit 631 may generate and output a clock disable signal, that is, a logic "low" signal. In an embodiment, the clock enable circuit 631 may include an inverter receiving the MAC operation end signal END_MAC, and an AND gate receiving the MAC burst enable signal EN_B_MAC and an output signal of the inverter. In this case, the clock enable signal or the clock disable signal may be output through an output terminal of the AND gate.

The AND gate 632 may receive the clock signal CLK and an output signal of the clock enable circuit 631 through a first input terminal and a second input terminal, respectively. When a signal of a logic "high" level (i.e., a clock enable signal) is transmitted from the clock enable circuit 631, the AND gate 632 may output the clock signal CLK through an output terminal. On the other hand, when a signal of a logic "low" level (i.e., a clock disable signal) is transmitted from the clock enable circuit 631, the AND gate 632 may output the signal of a logic "low" level through the output terminal without outputting the clock signal CLK. The signal output through the output terminal of the AND gate 632 may be transmitted to clock terminals of the first to fourth flip-flops 633(1)-633(4) in common.

The first to fourth flip-flops 633(1)-633(4) may be arranged in such a way that an output terminal Q of the flip-flop disposed before is coupled to an input terminal D of the flip-flop disposed immediately after. That is, the first to fourth flip-flops 633(1)-633(4) may be arranged such that the input terminal and the output terminal are connected in the same manner as the serial in parallel out (SIPO) type shift register. Accordingly, the output terminal Q of the first flip-flop 633(1) may be coupled to the input terminal D of the second flip-flop 633(2). The output terminal Q of the second flip-flop 633(2) may be coupled to the input terminal D of the third flip-flop 633(3). The output terminal Q of the third flip-flop 633(3) may be coupled to the input terminal D of the fourth flip-flop 633(4). The input terminal D of the first flip-flop 633(1) may be coupled to an output terminal O1 of the first selector 635. The output terminal Q of the first flip-flop 633(1) may also be coupled to a first input terminal I21 of the second selector 636. The output terminal Q of the second flip-flop 633(2) may also be coupled to a first input terminal I11 of the first selector 635. The output terminal Q of the fourth flip-flop 633(4) may be coupled to a second input termnal I12 of the first selector 635.

The first selector 635 may have the first input terminal I11, the second input terminal I12, a selection terminal S1, and an output terminal O1. The first selector 635 may receive an output signal of the second flip-flop 633(2) through the first input terminal I11. The first selector 635 may receive an output signal of the fourth flip-flop 633(4) through the second input terminal I12. The first selector 635 may receive the internal MAC operation interval signal MAC_CCD through the selection terminal S1. The first selector 635 may output an output signal to the input terminal D of the first flip-flop 633(1) through the output terminal O1. In an embodiment, when an internal MAC operation interval signal MAC_CCD of a logic "low" level is transmitted to the selection terminal S1, the first selector 635 may output the signal received through the first input terminal I11 through the output terminal O1. In this case, the output signal of the second flip-flop 633(2) may be input to the input terminal D of the first flip-flop 633(1) through the first selector 635. On the other hand, when an internal MAC operation interval signal MAC_CCD of a logic "high" level is transmitted to the selection terminal S1, the first selector 635 may output the signal received through the second input terminal I12 through the output terminal O1. In this case, the output signal of the fourth flip-flop 633(4) may be input to the input terminal D of the first flip-flop 633(1) through the first selector 635.

The second selector 636 may have a first input terminal 121, the second input terminal I22, a selection terminal S2, and an output terminal O2. The second selector 636 may receive the MAC operation control signal MAC_OP through the first input terminal I21. The second selector 636 may receive the output signal of the first flip-flop 633(1) through the second input terminal I22. The second selector 636 may receive the MAC burst enable signal EN_B_MAC through the selection terminal S2. The second selector 636 may output the internal MAC operation signal INMAC through the output terminal O2. In an embodiment, when a MAC burst enable signal EN_B_MAC of a logic "low" level is transmitted to the selection terminal S2, the second selector 636 may output the MAC operation control signal MAC_OP transmitted to the first input terminal I21 as the internal MAC operation signal INMAC through the output terminal O2. On the other hand, when a MAC burst enable signal EN_B_MAC of a logic "high" level is transmitted to the selection terminal S2, the second selector 636 may output the output signal of the first flip-flop 633(1) transmitted to the second input terminal I22 as the internal MAC operation signal INMAC through the output terminal O2.

FIGS. 35 to 38 are diagrams illustrating an example of a process in which an output signal of the first flip-flop 633(1) is generated in the internal MAC operation signal generating circuit 630-2A of FIG. 34. In this example, it is assumed that the clock signal CLK is transmitted from the AND gate (632 of FIG. 34) to the clock terminals of the first to fourth flip-flops 633(1)-633(4). In addition, it is assumed that an internal MAC operation interval signal MAC_CCD of a logic low level "L" is input to the selection terminal S1 of the first selector 635. In FIGS. 35 to 38, the same reference numerals as those of FIG. 34 indicate the same components.

Figure 35:
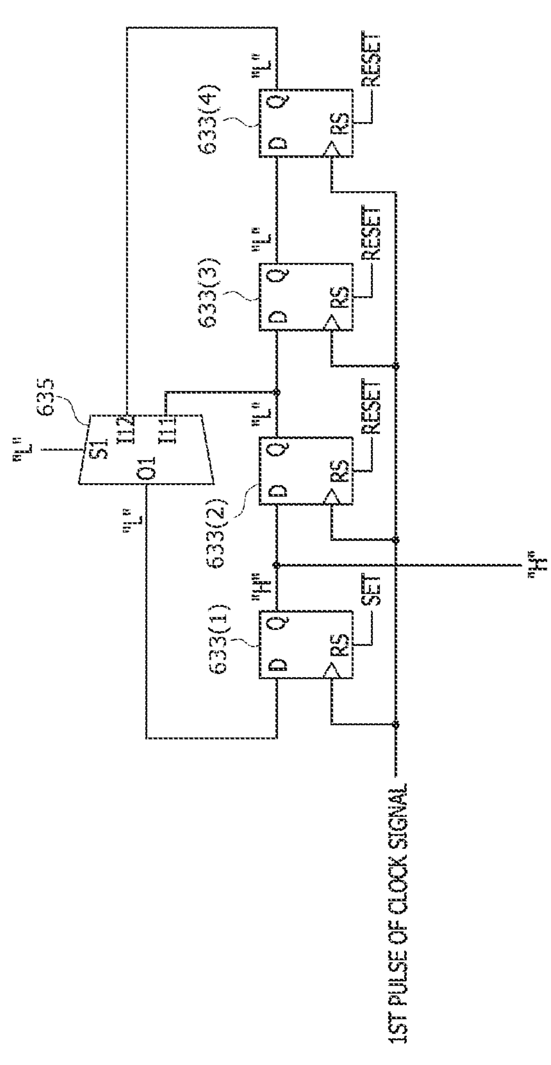

First, as illustrated in FIG. 35, a set signal SET may be input to only a set/reset (set and reset) terminal RS of the first flip-flop 633(1), and a reset signal RESET may be input to set/reset terminals RSs of the second to fourth flip-flops 633(2)-633(4). Under such a condition, a signal of a logic high level "H" may be output through the output terminal Q of the first flip-flop 633(1) at a time point when a first pulse of the clock signal CLK is generated. Each of the second to fourth flip-flops 633(2)-633(4) may output a signal of a logic low level "L". The first selector 635 may output the output signal of the second flip-flop 633(2) transmitted through the first input terminal I11, that is, a signal of a logic low level "L", through the output terminal O1.

Figure 36:
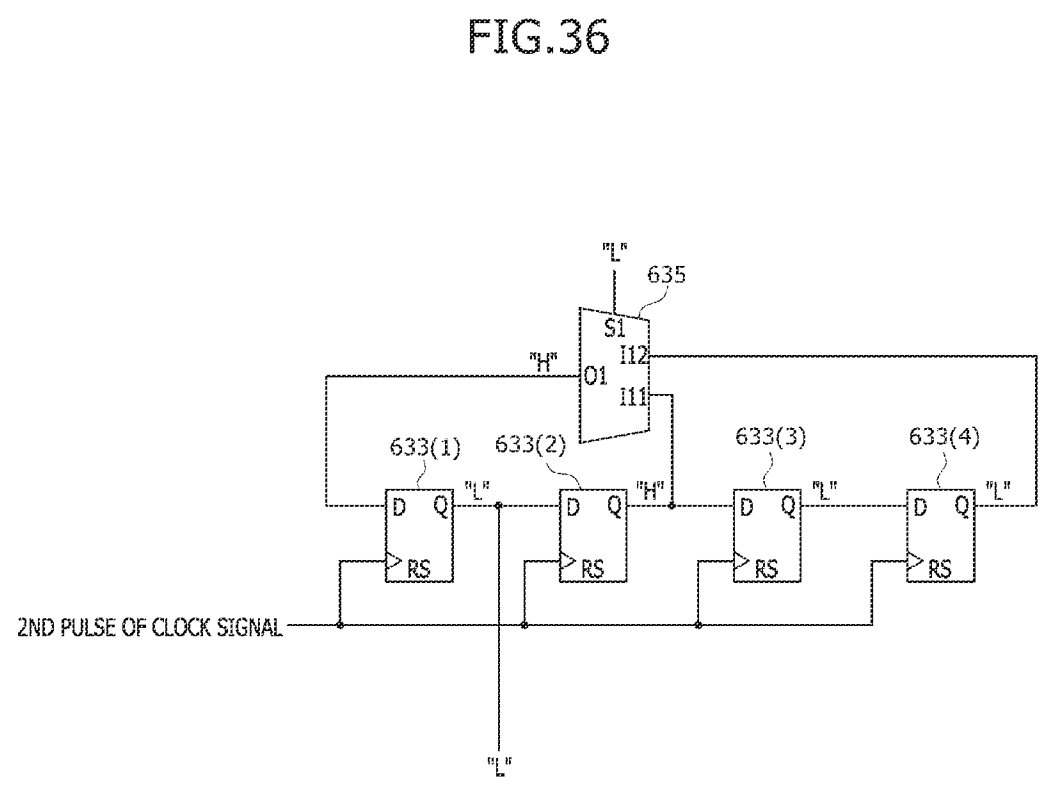

Next, as illustrated in FIG. 36, at a time point at which a second pulse of the clock signal CLK is generated, because the first flip-flop 633(1) has received the signal of a logic low level "L" from the first selection output 635 through the input terminal D, the first flip-flop 633(1) may output the signal of a logic low level "L" through the output terminal Q. The second flip-flop 633(2) may output a signal of a logic high level "H" through the output terminal Q. Each of the third flip-flop 633(3) and the fourth flip-flop 633(4) may output a signal of a logic low level "L" through the output terminal Q. That is, at the time point at which the second pulse of the clock signal CLK is generated, the logic level of the signal output from the first flip-flop 633(1) may be changed from a logic high level "H" to a logic low level "L". The first selector 635 may transmit the output signal of the second flip-flop 633(2) transmitted through the first input terminal I11, that is, the signal of a logic high level "H", through the output terminal O1.

Figure 37:
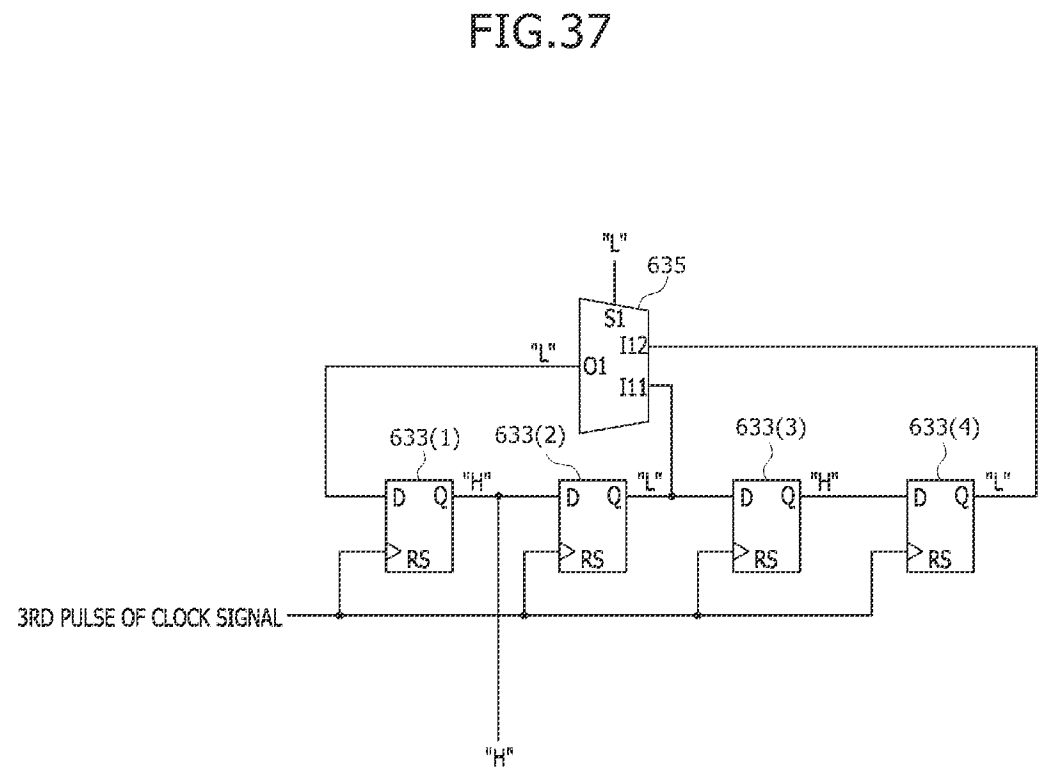

Next, as illustrated in FIG. 37, at a time point at which a third pulse of the clock signal CLK is generated, because the first flip-flop 633(1) has received the signal of a logic high level "H" output from the first selector 635 through the input terminal D, the first flip-flop 633(1) may output the signal of a logic high level "H" through the output terminal Q. Each of the second flip-flop 633(2) and the fourth flip-flop 633(4) may output a signal of a logic low level "L". The third flip-flop 633(3) may output a signal of a logic high level "H". As such, at the time point at which the third pulse of the clock signal CLK is generated, the logic level of the signal output from the first flip-flop 633(1) may be changed from a logic low level "L" to a logic high level "H". The first selector 635 may transmit the output signal of the second flip-flop 633(2) transmitted through the first input terminal I11, that is, the signal of a logic low level "L", through the output terminal O1.

Figure 38:
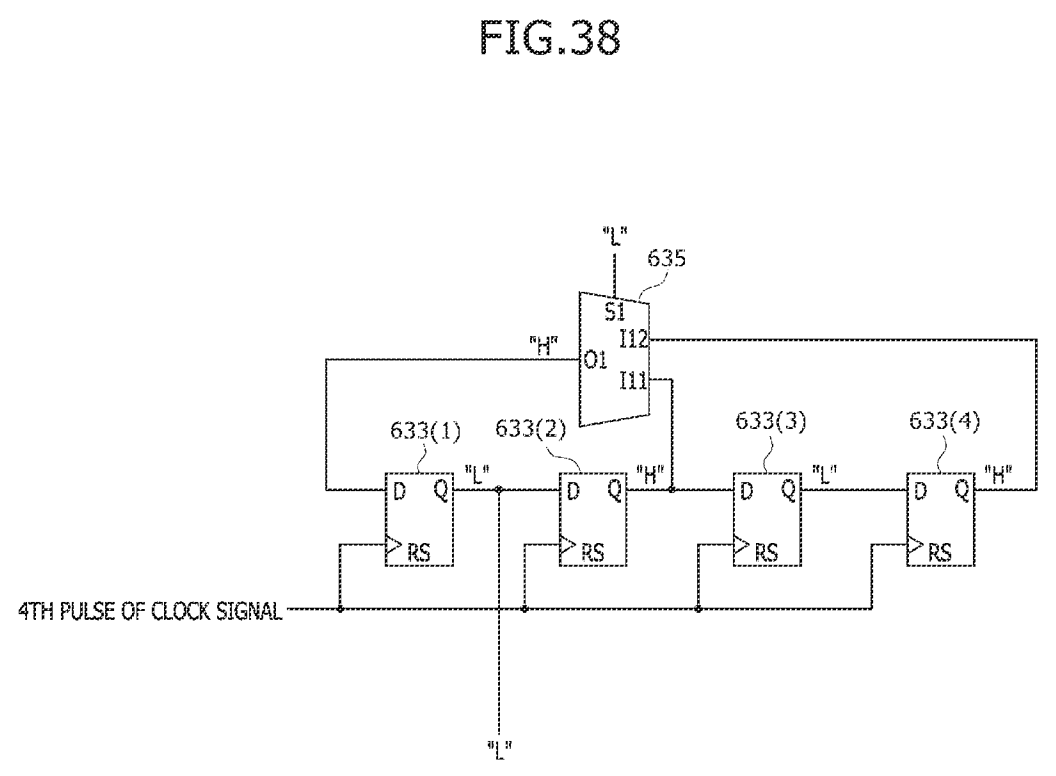

Next, as illustrated in FIG. 38, at a time point at which a fourth pulse of the clock signal CLK is generated, because the first flip-flop 633(1) has received the signal of a logic low level "L" output from the first selector 635 through the input terminal D, the first flip-flop 633(1) may output the signal of a logic low level "L" through the output terminal Q. Each of the second flip-flop 633(2) and the fourth flip-flop 633(4) may output a signal of a logic high level "H". The third flip-flop 633(3) may output a signal of a logic low level "L". That is, at the time point at which the fourth pulse of the clock signal CLK is generated, the logic level of the signal output from the first flip-flop 633(1) may be changed from a logic high level "H" to a logic low level "L". The first selector 635 may transmit the output signal of the second flip-flop 633(2), transmitted through the first input terminal I11, that is, the signal of a logic high level "H", through the output terminal O1.

At a time point at which a fifth pulse of the clock signal CLK is generated, the output signals of the first to fourth flip-flops 633(1)-633(4) may be in the same state as described with reference to FIG. 37. That is, each of the first flip-flop 633(1) and the third flip-flop 633(3) may output the signal of logic high level "H", and each of the second flip-flop 633(2) and the fourth flip-flop 633(4) may output the signal of a logic low level "L". Accordingly, at the time point at which the fifth pulse of the clock signal CLK is generated, the logic of the signal output from the first flip-flop 633(1) may be changed from a logic low level "L" to a logic high level "H". At a time point at which a sixth pulse of the clock signal CLK is generated, the output signals of the first to fourth flip-flops 633(1)-633(4) may be in the same state as described with reference to FIG. 38. That is, each of the first flip-flop 633(1) and the third flip-flop 633(3) may output the signal of a logic low level "L", and each of the second flip-flop 633(2) and the fourth flip-flop 633(4) may output the signal of logic high level "H". Accordingly, at the time point at which the sixth pulse of the clock signal CLK is generated, the logic level of the signal output from the first flip-flop 633(1) may be changed from a logic high level "H" to a logic low level "L". From then on, every time an odd-numbered pulse (i.e., a seventh pulse, a ninth pulse, etc.) of the clock signal CLK is generated, as described with reference to FIG. 37, the logic level of the signal output from the first flip-flop 633(1) may be changed from a logic low "L" level to a logic high level "H". In addition, every time an even-numbered pulse (i.e., an eighth pulse, a tenth pulse, etc.) of the clock signal CLK is generated, as described with reference to FIG. 38, the logic level of the signal output from the first flip-flop 633(1) may be changed from a logic high level "H" to a logic low level "L".

As such, when an internal MAC operation interval signal MAC_CCD of a logic low level "L" is input to the selection terminal S1 of the first selector 635, a signal in which pulses of a logic high level "H" are generated with a cycle twice the cycle of the clock signal CLK may be output through the output terminal Q of the first flip-flop 633(1). When an internal MAC operation interval signal MAC_CCD of a logic high level "H" is input to the selection terminal S1 of the first selector 635, that is, when the output signal of the fourth flip-flop 633(4) is output through the first selector 635, a signal in which pulses of a logic high level "H" are generated with a cycle six times the cycle of the clock signal CLK may be output through the output terminal Q of the first flip-flop 633(1). As described, the cycle in which the signal is output from the first flip-flop 633(1) may be determined according to which flip-flop output signal is fed back to the input terminal D of the first flip-flop 633(1) by the internal MAC operation interval signal MAC_CCD.

Figure 39:
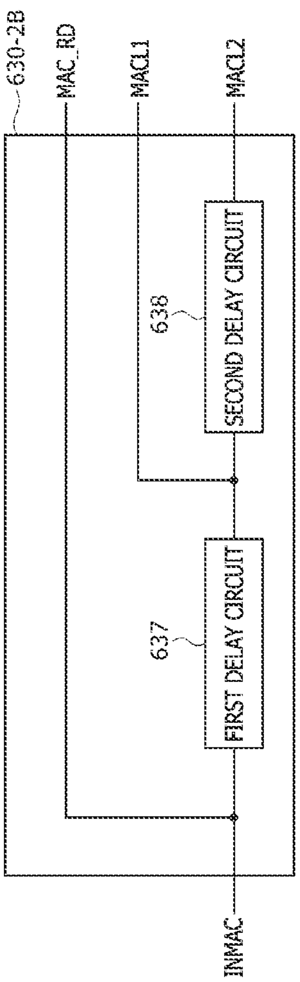
FIG. 39 is a diagram illustrating an example of the internal MAC operation control signal generating circuit of FIG. 33.

FIG. 39 is a diagram illustrating an example of the internal MAC operation control signal generating circuit 630-2B of FIG. 33. Referring to FIG. 39, the internal MAC operation control signal generating circuit 630-2B may include a first delay circuit 637 and a second delay circuit 638. The internal MAC operation signal INMAC input to the internal MAC operation control signal generating circuit 630-2B may be output from the internal MAC operation control signal generating circuit 630-2B as a MAC read control signal MAC_RD. That is, the internal MAC operation control signal generating circuit 630-2B may output the MAC read control signal MAC_RD at a first time point at which the internal MAC operation signal INMAC is input. The internal MAC operation signal INMAC input to the internal MAC operation control signal generating circuit 630-2B may also be input to the first delay circuit 637. The first delay circuit 637 may output a first latch control signal MACL1 as an output signal at a second time point delayed for a first delay time from the first time point. The first latch control signal MACL1 output from the first delay circuit 637 may also be input to the second delay circuit 638. The second delay circuit 638 may output a second latch control signal MACL2 as an output signal at a third time point delayed for a second delay time from the second time point. As such, the internal MAC operation control signal generating circuit 630-2B may output the MAC read control signal MAC_RD at the first time point at which the internal MAC operation signal INMAC is input, output the first latch control signal MACL1 at the second time point, and output the second latch control signal MACL2 at the third time point. In an embodiment, a time interval between the first time point and the second time point, that is, the first delay time set by the first delay circuit 637 may be equal to or longer than the time required for weight data and vector data to be input from the memory bank (612 in FIG. 31) and the global buffer (620 in FIG. 31) to the MAC operator (612 in FIG. 31), respectively. The time interval between the second time point and the third time point, that is, the second delay time set by the second delay circuit 638 may be equal to or longer than the time required for the MAC operator (612 in FIG. 31) to perform a multiplication operation, an addition operation, and an accumulative addition operation.

Figure 40:
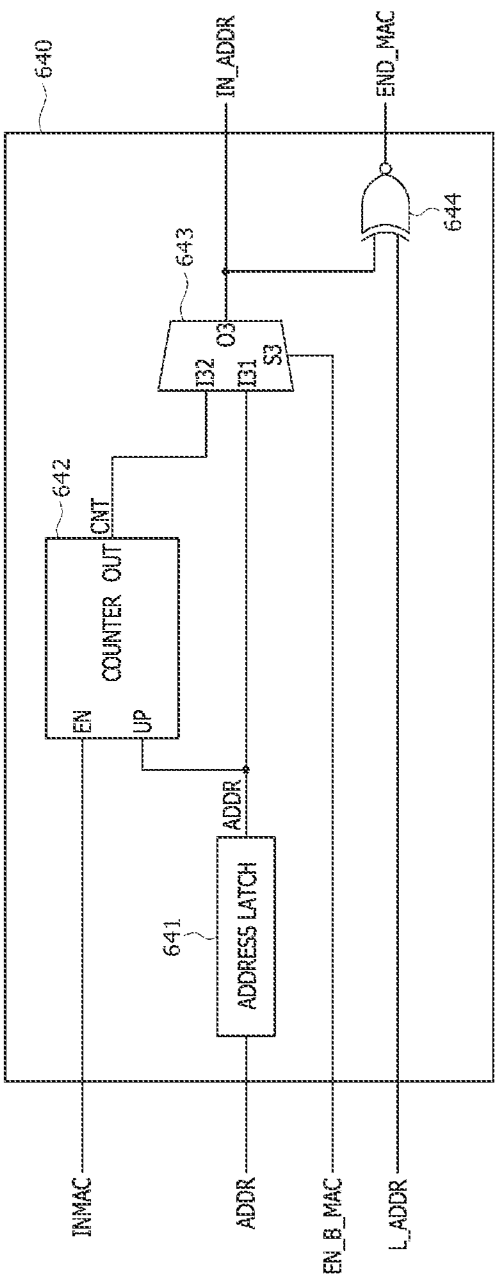
FIG. 40 is a circuit diagram illustrating an example of a configuration of an address signal generator of the PIM device of FIG. 31.

FIG. 40 is a circuit diagram illustrating an example of a configuration of the address signal generator 640 of the PIM device 600 of FIG. 31. Referring to FIG. 40, the address signal generator 640 may include an address latch 641, a counter 642, a selector 643, and an exclusive NOR (XNOR) gate 644. The address latch 641 may latch an address signal ADDR transmitted from a host or a controller and output the address signal ADDR. An output terminal of the address latch 641 may be coupled to an enable terminal EN of the counter 642 and a first input terminal I31 of the selector 643. The counter 642 may have the enable terminal EN, an up terminal UP, and an output terminal OUT. The enable terminal EN of the counter 642 may be coupled to the internal MAC operation signal generating circuit (630-2A of FIG. 33) of the MAC operation control signal generator (630-2 of FIG. 32) constituting the command decoder (630 of FIG. 31). Accordingly, the counter 642 may receive an internal MAC operation signal INMAC through the enable terminal EN. The up terminal UP of the counter 642 may be coupled to the output terminal of the address latch 641. Accordingly, the counter 642 may receive the address signal ADDR output from the address latch 641 through the up terminal UP. The output terminal OUT of the counter 642 may be coupled to a second input terminal I32 of the selector 643. The counter may output a counting signal CNT through the output terminal OUT. In an embodiment, the counter 642 may perform a counting operation on the address signal ADDR transmitted through the up terminal UP whenever the internal MAC operation signal INMAC is received through the enable terminal EN, and output a result of the counting operation as the counting signal CNT.

The selector 643 may have the first input terminal I31, a second input terminal I32, a selection terminal S3, and an output terminal O3. The selector 642 may receive the address signal ADDR output from the address latch 641 through the first input terminal I31. The selector 643 may receive the counting signal CNT output from the counter 642 through the second input terminal I32. The selector 643 may receive a MAC burst enable signal EN_B_MAC through the selection terminal S3. The selector 643 may output an internal address signal IN_ADDR through the output terminal O3. In an embodiment, when a MAC burst enable signal EN_B_MAC of a logic "low" level is received through the selection terminal S3, the selector 643 may output the address signal ADDR received through the first input terminal I31 as an internal address signal IN_ADDR through the output terminal O3. On the other hand, when a MAC burst enable signal EN_B_MAC of a logic "high" level is received through the selection terminal S3, the selector 643 may output the counting signal CNT received through the second input terminal I32 as the internal address signal IN_ADDR through the output terminal O3. In this case, as the counting signal CNT is output in synchronization with the internal MAC operation signal INMAC from the counter 642, the internal address signal IN_ADDR may also be output in synchronization with the internal MAC operation signal INMAC through the selector 643.

The XNOR gate 644 may have first and second input terminals and an output terminal. The first input terminal of the XNOR gate 644 may be coupled to the output terminal of the selector 643. Accordingly, the XNOR gate 644 may receive the internal address signal IN_ADDR output from the selector 643 through the first input terminal. The second input terminal of the XNOR gate 644 may be coupled to a node register (660 of FIG. 31). Accordingly, the XNOR gate 644 may receive a last address signal L_ADDR transmitted from the mode register (660 of FIG. 31) through the second input terminal. When the internal address signal IN_ADDR output from the selector 643 is the same as the last address signal L_ADDR, the XNOR gate 644 may output an internal MAC operation end signal END_MAC of a logic "high" level. On the other hand, when the internal address signal IN_ADDR output from the selector 643 is not the same as the last address signal L_ADDR, the XNOR gate 644 may output an internal MAC operation end signal END_MAC of a logic "low" level.

Figure 41:
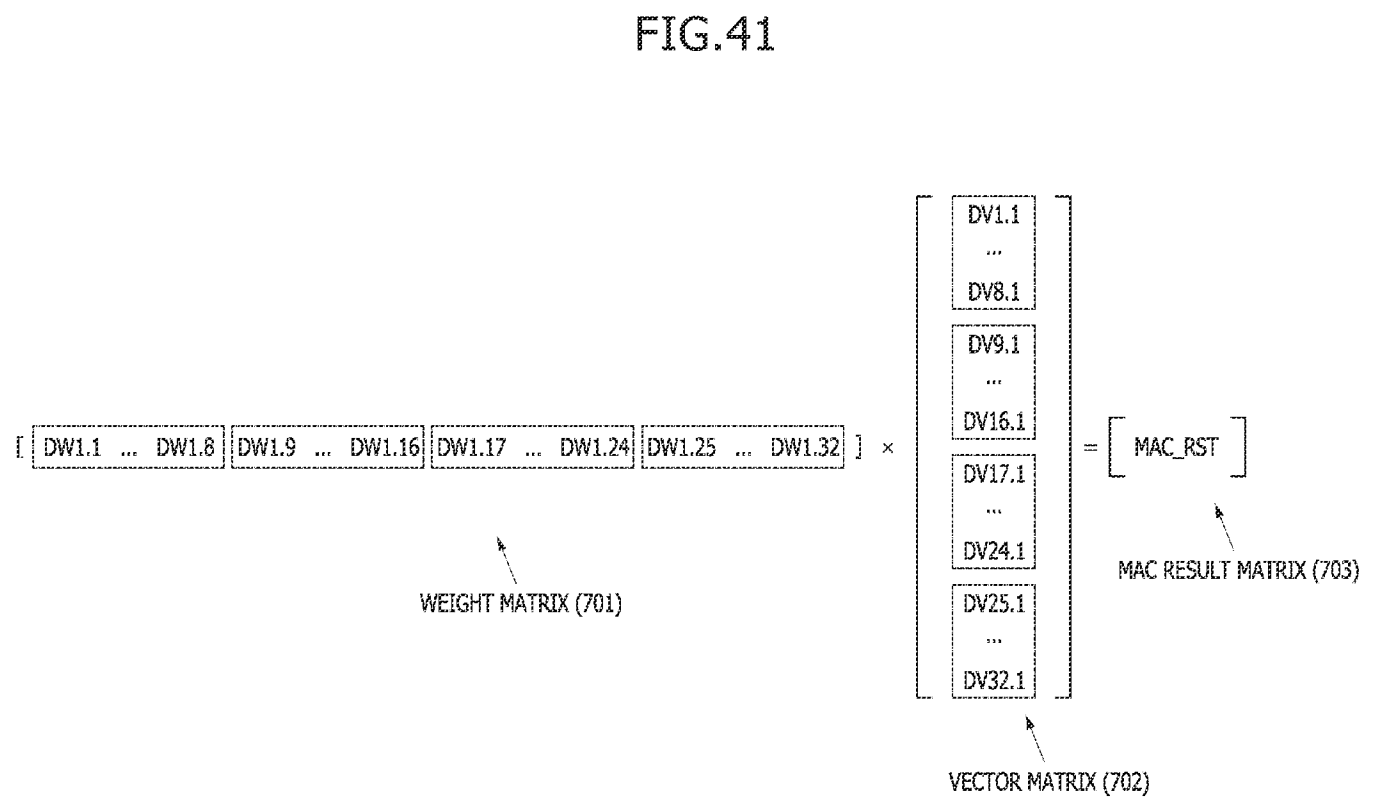

FIG. 41 is a diagram illustrating an example of matrix multiplication performed by a MAC operation of the PIM device 600 of FIG. 31. Referring to FIG. 41, the MAC operation may be a process of generating a MAC result matrix 703 through matrix multiplication for a weight matrix 701 and a vector matrix 702. The elements of the weight matrix 701 may constitute weight data. The elements of the vector matrix 702 may constitute vector data. The elements of the MAC result matrix 703 may constitute MAC result data MAC_RST. Although the weight matrix 701 of one row and 32 columns will be taken as an example, this is only an example, and the numbers of rows and columns of the weight matrix 701 may be variously set. The vector matrix 702 may have one column and the same number of rows as the number of columns of the weight matrix 701.

As illustrated in the drawing, the weight matrix 701 may include first to $32^{nd}$ second weight data DW1.1-DW1.32 arranged in a first row. The vector matrix 702 may include first to $32^{nd}$ vector data DV1.1-DV32.1 arranged in a first column. The matrix multiplication on the weight data DW1.1-DW1.32 and the vector data DV1.1-DV32.1 may be performed by being divided into a plurality of MAC operations according to the operation capacity of the MAC operator (612 in FIG. 31). For example, when each of the weight data DW1.1-DW1.32 has a size of 16 bits and the number of bits that can be processed by the multiplication circuit (222-1 of FIG. 20) constituting the MAC operator (612 of FIG. 31) is 128 bits, the number of weight data that is processed through one MAC operation may become eight. Accordingly, matrix multiplication on 32 pieces of weight data DW1.1-DW1.32 and 32 pieces of vector data DV1.1-DV32.1 may be completed by performing four MAC operations.

A first MAC operation among the four MAC operations may be performed as a process of generating first MAC result data by matrix multiplication on the weight data DW1.1-DW1.8 of the first column to the eighth column of the first row and the vector data DV1.1-DV8.1 of the first row to the eighth row of the first column. A second MAC operation may be performed as a process of performing matrix multiplication on the weight data DW1.9-DW1.16 of the ninth column to the sixteenth column of the first row and the vector data DV9.1-DV16.1 of the ninth row to the sixteenth row of the first column, and generating second MAC result data by accumulating data generated as a result of the multiplication with the first MAC result data. The third MAC operation may be performed as a process of performing matrix multiplication on the weight data DW1.17-DW1.24 of the $17^{th}$ column to $24^{th}$ column of the first row and the vector data DV17.1-DV24.1 of the $17^{th}$ row to the $24^{th}$ row of the first column, and generating third MAC result data by accumulating data generated as a result of the multiplication with the second MAC result data. In addition, the fourth MAC operation may be performed as a process of performing matrix multiplication on the weight data DW1.25-DW1.32 of the $25^{th}$ column to $32^{nd}$ column of the first row and the vector data DV25.1-DV32.1 of the $25^{th}$ row to the $32^{nd}$ row of the first column, and generating final MAC result data MAC_RST by accumulating data generated as a result of the multiplication with the third MAC result data.

In general, in order to perform the first to fourth MAC operations for the matrix multiplication of FIG. 41, a host or a controller may transmit four MAC operation commands CMD_MACs to the PIM device. The PIM device may perform first to fourth MAC operations in response to each of the MAC operation commands CMD_MACs. However, according to the PIM device (600 in FIG. 31) according to the present disclosure, the host or the controller may transmit one MAC operation command CMD_MAC to the PIM device (600 in FIG. 31), and the PIM device (600 of FIG. 31) may perform the first to fourth MAC operations in response to the one MAC operation command CMD_MAC. Accordingly, in an embodiment, power consumption of the PIM device (600 in FIG. 31) can be reduced by reducing the number of MAC operation commands CMD_MACs received from the host or the controller. For example, in an embodiment, after one MAC operation command CMD_MAC is transmitted to the PIM device (600 in FIG. 31), the buffers in the command buffer 630 and address signal generator 640 may be inactivated, and thus, the total power consumption may be reduced by the amount of power consumed by the buffers.

Figure 42:
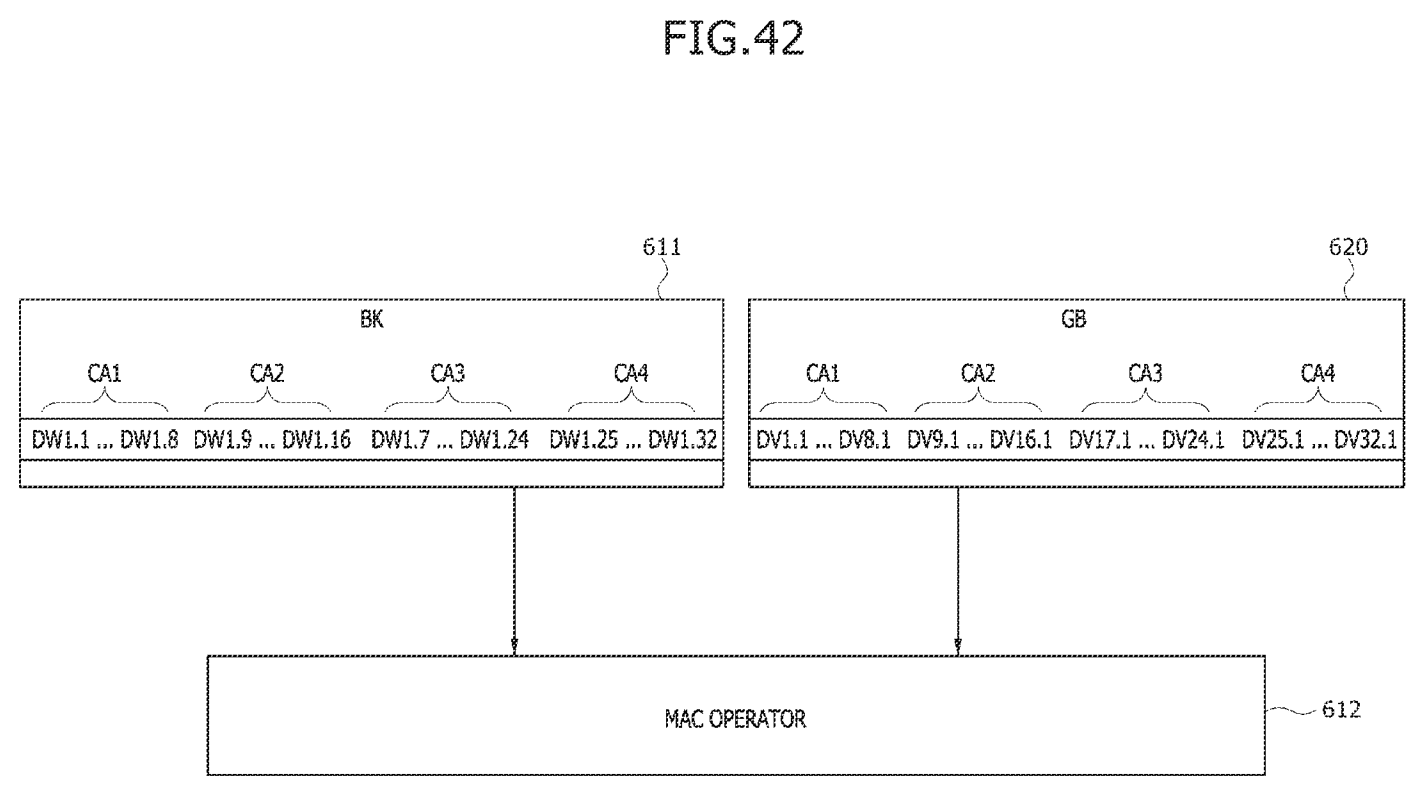

FIG. 42 is a diagram illustrating a state in which weight data DW1.1-DW1.32 and vector data DV1.1-DV32.1 constituting the weight matrix 701 and the vector matrix 702 of FIG. 41 are stored in a memory bank 611 and a global buffer 620, respectively. Referring to FIG. 42, the weight data DW1.1-DW1.32 may be stored in a row among the rows of a cell array in the memory bank 611. The weight data DW1.1-DW1.32 may be selected by a column address signal CA in the row. In an embodiment, the column address signal CA may designate a plurality of columns. Similarly, the vector data DV1.1-DV32.1 may be selected by the column address signal CA in the global buffer 620. In this embodiment, the vector data DV1.1-DV32.1 in the global buffer 620 may be designated and output by the column address signal CA, but this is only an example, and in another example, the vector data DV1.1-DV32.1 may be output through a signal other than the column address signal.

As illustrated in the drawing, when a first column address signal CA1 is transmitted to the memory bank 611 and the global buffer 620, the memory bank 611 and the global buffer 620 may transmit the first to eighth weight data DW1.1-DW1.8 and the first to eighth vector data DV1.1-DV8.1 to the MAC operator 612, respectively. When a second column address signal CA2 is transmitted to the memory bank 611 and the global buffer 620, the memory bank 611 and the global buffer 620 may transmit the ninth to sixteenth weight data DW1.9-DW1.16 and the ninth to sixteenth vector data DV9.1-DV16.1 to the MAC operator 612, respectively. When a third column address signal CA3 is transmitted to the memory bank 611 and the global buffer 620, the memory bank 611 and the global buffer 620 may transmit the $17^{th}$ to $24^{th}$ weight data DW1.17-DW1.24 and the $17^{th}$ to $24^{th}$ vector data DV17.1-DV24.1 to the MAC operator 612, respectively. In addition, when a fourth column address signal CA4 is transmitted to the memory bank 611 and the global buffer 620, the memory bank 611 and the global buffer 620 may transmit the $25^{th}$ to $32^{nd}$ weight data DW1.25-DW1.32 and the $25^{th}$ to $32^{nd}$ vector data DV25.1-DV32.1 to the MAC operator 612, respectively.

Figure 43:
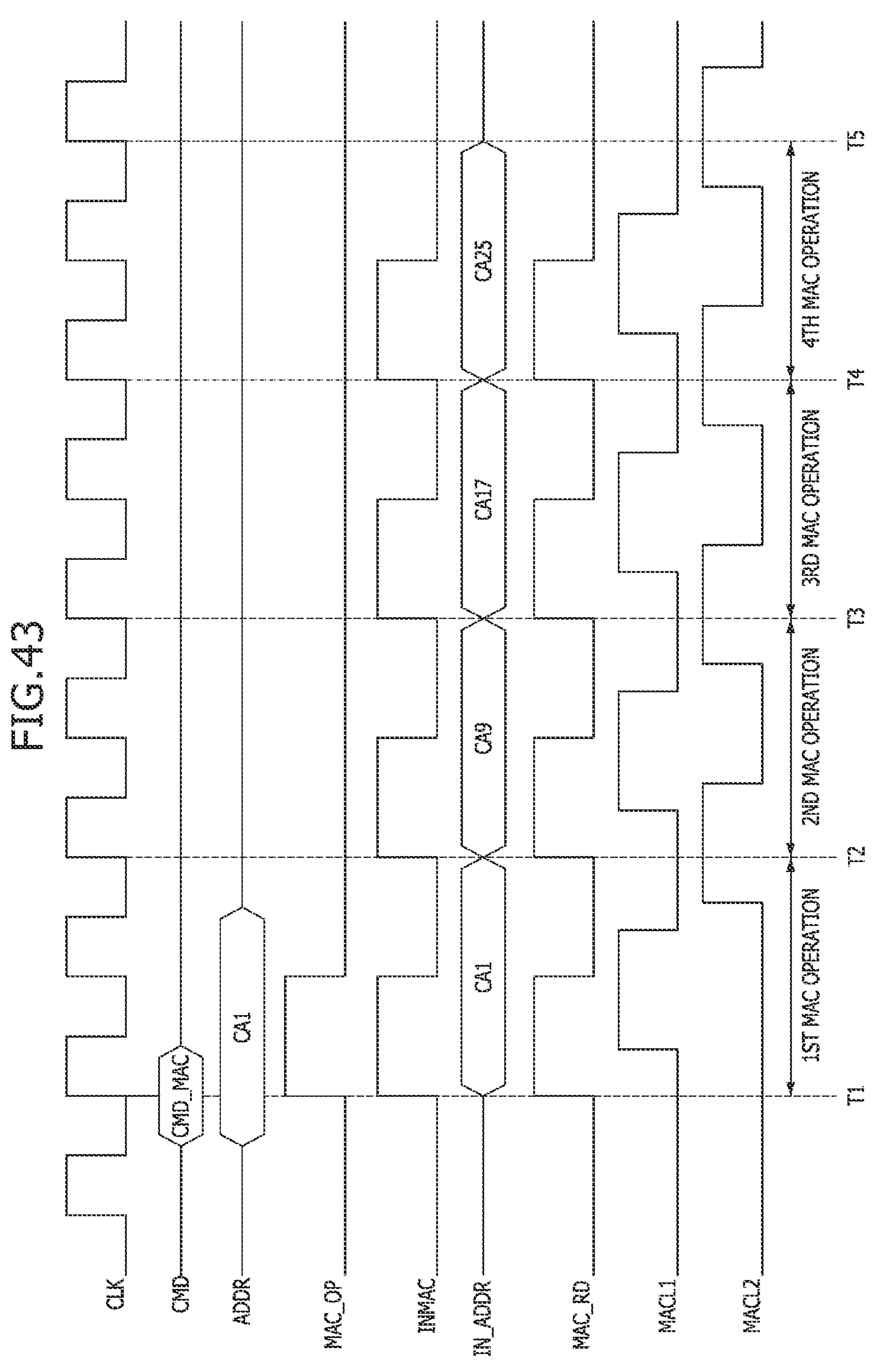
FIG. 43 is a timing diagram illustrating a MAC operation of the PIM device of FIG. 31.

FIG. 43 is a timing diagram illustrating a MAC operation of the PIM device 600 of FIG. 31. In this embodiment, it is shown that the PIM device 600 performs the matrix operation of FIG. 41, and the weight data and vector data are stored in the memory bank 611 and the global buffer 620, respectively, in the manner described with reference to FIG. 42, as an example.

Referring to FIG. 43 together with FIGS. 31 to 40, when a MAC operation command CMD_MAC and a first column address signal CA1 are transmitted to the PIM device 600, at a first time point T1 at which a rising edge of a pulse of a clock signal CLK is generated, the decoder (630-1 of FIG. 32) of the command decoder 630 may generate and output a MAC operation control signal MAC_OP. The MAC operation control signal MAC_OP may be transmitted to the mode register 660 and the internal MAC operation control signal generator 630-2 of the command decoder 630. As described with reference to FIG. 34, the MAC operation control signal MAC_OP may be input to the first input terminal I21 of the second selector 636. As a MAC burst enable signal EN_B_MAC of a logic "low" level is transmitted from the mode register 660 to the selection terminal S2, the second selector 636 may output the MAC operation control signal MAC_OP as a first internal MAC operation signal INMAC. The first internal MAC operation signal INMAC may be transmitted to the internal MAC operation control signal generating circuit (630-2B of FIG. 33) and the address signal generator 640.

The address latch (641 of FIG. 40) of the address signal generator 640 that receives the first column address signal CA1 may transmit the first column address signal CA1 to the first input terminal 131 of the selector 643. As the MAC burst MAC burst enable signal EN_B_MAC of a logic "low" level is transmitted from the mode register 660 to the selection terminal S3, the selector 643 may output the first column address signal CA1 as a first internal address signal IN_ADDR. The first column address signal CA1 output from the address signal generator 640 may be transmitted to the memory bank 611 and the global buffer 620.

The internal MAC operation control signal generating circuit (630-2B of FIG. 33) that receives the first internal MAC operation signal INMAC may transmit the first internal MAC operation signal INMAC to the memory bank 611 and the global buffer 620 as a first MAC read control signal MAC_RD, as described with reference to FIG. 39. Then, at a time point delayed by a first delay time, the internal MAC operation control signal generating circuit (630-2B of FIG. 33) may transmit the first internal MAC operation signal INMAC to the MAC operator 612 as a primary first latch control signal MACCL1. Then, at a time point delayed by a second delay time, the internal MAC operation control signal generating circuit (630-2B of FIG. 33) may transmit the first internal MAC operation signal INMAC to the MAC operator 612 as a primary second latch control signal MACL2.

The first memory bank 611 and the global buffer 620 may transmit the weight data DW1.1-DW1.8 and the vector data DV1.1-DV8.1 designated by the first column address signal CA1 to the MAC operator 612 in response to the first MAC read control signal MAC_RD1. The MAC operator 612 may receive the weight data DW1.1-DW1.8 and the vector data DV1.1-DV8.1 in synchronization with the primary first latch control signal MACL1, and perform multiplication, addition, and accumulative addition. The MAC operator 612 may latch and output first MAC result data generated as a result of the accumulative addition in synchronization with the primary second latch control signal MACL2.

Meanwhile, the mode register 660 that receives the MAC operation control signal MAC_OP from the decoder (630-1 in FIG. 32) of the command decoder 630 may output a MAC burst enable signal EN_B_MAC of a logic "high" level, an internal MAC operation interval signal MAC_CCD of a logic "low" level, and a fourth column address signal CA4 as a last address signal L_ADDR. The MAC burst enable signal EN_B_MAC of a logic "high" level may be transmitted to the internal MAC operation signal generating circuit (630-2A of FIG. 33) constituting the internal MAC operation control signal generator (630-2 of FIG. 32) of the command decoder 630 and to the address signal generator 640. Specifically, the MAC burst enable signal EN_B_MAC of a logic "high" level may be transmitted to the clock enable circuit (631 of FIG. 34) of the internal MAC operation signal generating circuit (630-2A of FIG. 33) and the selection terminal S2 of the second selector (636 of FIG. 34). In addition, the MAC burst enable signal EN_B_MAC of a logic "high" level may be transmitted to the selection terminal S3 of the selector (643 of FIG. 40) constituting the address signal generator 640.

The internal MAC operation interval signal MAC_CCD of a logic "low" level may be transmitted to the internal MAC operation signal generating circuit (630-2A of FIG. 33) constituting the internal MAC operation control signal generator (630-2 of FIG. 33) of the command decoder 630. Specifically, the internal MAC operation interval signal MAC_CCD of a logic "low" level may be transmitted to the selection terminal S1 of the first selector (635 of FIG. 34) of the internal MAC operation signal generating circuit (630-2A of FIG. 33). The fourth column address signal CA4, that is the last address signal L_ADDR, may be transmitted to the input terminal of the XNOR gate (644 of FIG. 40) of the address signal generator 640. As described with reference to FIG. 40, the XNOR gate (644 of FIG. 40) of the address signal generator 640 may output a MAC operation end signal END_MAC of a logic "low" level until the fourth column address signal CA4 is output from the selector (643 of FIG. 40).

As described with reference to FIG. 34, as the MAC burst enable signal EN_B_MAC of a logic "high" level and the MAC operation end signal END_MAC of a logic "low" level are input to the clock enable circuit (631 of FIG. 34) of the internal MAC operation signal generating circuit (630-2A of FIG. 33), the clock enable circuit (631 of FIG. 34) may output a signal of a logic "high" level. The AND gate (632 of FIG. 34) may transmit a clock signal CLK to the clock terminals of the first to fourth flip-flops (633(1)-633(4) of FIG. 34). As the internal MAC operation interval signal MAC_CCD of a logic "low" level is input to the selection terminal S1 of the first selector (635 of FIG. 34) of the internal MAC operation signal generating circuit (630-2A of FIG. 33), as described with reference to FIGS. 35 to 38, a signal in which pulses are generated with a cycle twice the cycle of the clock signal CLK may be output through the output terminal Q of the first flip-flop (633(1) of FIG. 34) from the first time point T1. Because the logic level of the MAC burst enable signal EN_B_MAC transmitted to the selection terminal S2 of the second selector (636 of FIG. 34) is changed from a logic "low" level to a logic "high" level, the signal output from the first flip-flop (633(1) of FIG. 34) may be output from the internal MAC operation signal generating circuit (630-2A of FIG. 33) as the internal MAC operation signal INMAC. As illustrated in FIG. 43, a second internal MAC operation signal INMAC may be generated at a second time point T2 after twice the clock signal CLK cycle has elapsed from the first time point T1. A third internal MAC operation signal INMAC may be generated at the third time point T3 after twice the clock signal CLK cycle has elapsed from the second time point T2. A fourth internal MAC operation signal INMAC may be generated at a fourth time point T4 after twice the clock signal CLK cycle has elapsed from the third time point T3.

Meanwhile, the counter (642 of FIG. 40) of the address signal generator 640 may perform a counting-up operation on the first column address signal CA1 and output the second column address signal CA2 generated as a result of the counting-up operation in response to the second internal MAC operation signal INMAC generated at the second time point T2. Since the logic level of the MAC burst enable signal EN_B_MAC transmitted to the selection terminal S3 of the selector (643 in FIG. 40) of the address signal generator 640 is changed from a logic "low" level to a logic "low" level, the second column address signal CA2 output from the counter 642 may be output from the address signal generator 640 as the second internal address signal IN_ADDR. Since the second column address signal CA2 output from the selector (643 of FIG. 40) of the address signal generator 640 and the fourth column address signal CA4 that is the last address signal L_ADDR are not the same, the XNOR gate (644 in FIG. 40) of the address signal generator 640 may maintain a state of outputting a MAC operation end signal END_MAC of a logic "low" level.

At the second time point, the second column address signal CA2 output from the address signal generator 640 may be transmitted to the memory bank 611 and the global buffer 620. The internal MAC operation control signal generating circuit (630-2B of FIG. 33) that has received the second internal MAC operation signal INMAC may transmit the second internal MAC operation signal INMAC to the memory bank 611 and the global buffer 620 as the second MAC read control signal MAC_RD, as described with reference to FIG. 39. Subsequently, at a time delayed by the first delay time, the internal MAC operation control signal generating circuit (630-2B of FIG. 33) may transmit the second internal MAC operation signal INMAC to the MAC operator 612 as the secondary first latch control signal MACCL1. Next, at a time delayed by the second delay time, the internal MAC operation control signal generating circuit (630-2B of FIG. 33) may transmit the second internal MAC operation signal INMAC to the MAC operator 612 as the secondary second latch control signal MACCL2.

The first memory bank 611 and the global buffer 620 may transmit the weight data DW1.9-DW1.16 and the vector data DV9.1-DV16.1 designated by the second column address CA2 to the MAC operator 612 in response to the second MAC read control signal MAC_RD. The MAC operator 612 may receive the weight data DW1.9-DW1.16 and the vector data DV9.1-DV16.1 in synchronization to the secondary first latch control signal MACL1, and perform multiplication, addition, and accumulative addition. The MAC operator 612 may latch and output the second MAC result data generated as a result of the cumulative addition operation in synchronization to the secondary second latch control signal MACL2.

At a third time point, the third column address signal CA3 may be output from the address signal generator 640 and the third column address signal CA3 may be transmitted to the memory bank 611 and the global buffer 620. The MAC operation control signal generator (630-2B of FIG. 33) receiving the third internal MAC operation signal INMAC may transmit the third internal MAC operation signal INMAC to the memory bank 611 and the global buffer 620 as a third MAC read control signal MAC_RD, as described with reference to FIG. 39. Then, at a point in time delayed by the first delay time, the third internal MAC operation signal INMAC may be transmitted to the MAC operator 612 as the tertary first latch control signal MACL1. Subsequently, at a time delayed by the second delay time, the third internal MAC operation signal INMAC may be transmitted to the MAC operator 612 as the tertiary second latch control signal MACL2.

The first memory bank 611 and the global buffer 620 may transmit the weight data DW1.17-DW1.24 and the vector data DV17.1-DV24.1 designated by the third column address signal CA3 to the MAC operator 612 in response to the third MAC read control signal MAC_RD. The MAC operator 612 may receive the weight data DW1.17-DW1.24 and the vector data DV17.1-DV24.1 in synchronization with a tertiary first latch control signal MACL1, and perform a multiplication operation, an addition operation, and an accumulative addition operation. The MAC operator 612 may latch and output the third MAC result data generated as a result of the cumulative addition operation in synchronization with a tertiary second latch control signal MACL2.

At a fourth time point, a fourth column address signal CA4 may be output from the address signal generator 640, and the fourth column address signal CA4 may be transmitted to the memory bank 611 and the global buffer 620. The internal MAC operation control signal generating circuit (630-2B of FIG. 33) receiving the fourth internal MAC operation signal INMAC may transmit the fourth internal MAC operation signal INMAC to the memory bank 611 and the global buffer 620 as a third MAC read control signal MAC_RD, as described with reference to FIG. 39. Subsequently, at a time delayed by the first delay time, the fourth internal MAC operation signal INMAC may be transmitted to the MAC operator 612 as a quinary first latch control signal MACCL1. Then, at a time delayed by the second delay time, the fourth internal MAC operation signal INMAC may be transmitted to the MAC operator 612 as a quinary second latch control signal MACCL2.

The first memory bank 611 and the global buffer 620 may transmit the weight data DW1.25-DW1.32 and the vector data DV25.1-DV32.1 designated by the fourth column address signal CA4 to the MAC operator 612 in response to the fourth MAC read control signal MAC_RD. The MAC operator 612 may receive the weight data DW1.25-DW1.32 and the vector data DV25.1-DV32.1 in synchronization with the quinary first latch control signal MACL1, and perform a multiplication operation, an addition operation, and an accumulative addition operation. The MAC operator 612 may latch and output the fourth MAC result data generated as a result of the accumulative addition operation, that is, a final MAC result data in synchronization with the unary second latch control signal MACL2. When a MAC result data read command CMD RST is transmitted from the host or controller, the final MAC result data may be transmitted from the MAC operator 612 to the host or controller.

Meanwhile, at the fourth time point T4 at which the fourth internal MAC operation signal INMAC is generated, the selector (643 of FIG. 40) of the address signal generator 640 may output the fourth column address signal CA4. Since the XNOR gate (644 of FIG. 40) receives the same fourth column address signal CA4 through two input terminals, the logic level of the MAC operation end signal END_MAC, which is an output signal, may be changed from a logic "low" level to a logic "high" level. As the MAC operation end signal END_MAC of a logic "low" level is input to the clock enable circuit (631 in FIG. 34), as described with reference to FIG. 34, the internal MAC operation signal generating circuit (630-2A of FIG. 33) may no longer output the internal MAC operation signal INMAC.

FIG. 44 is a block diagram illustrating a PIM device 700 according to still another embodiment of the present disclosure. In FIG. 44, the same reference numerals as those of FIG. 31 denote the same components, and thus, overlapping descriptions will be omitted below. Referring to FIG. 44, the PIM device 700 according to the present embodiment may be apart from the PIM device 600 of FIG. 31 in which a last address signal L_ADDR is also transmitted in addition to the MAC burst enable signal EN_B_MAC in that only the MAC burst enable signal EN_B_MAC is transmitted from a mode register 760 to an address signal generator 740. In addition, the PIM device 700 according to the present embodiment may be apart from the PIM device 600 of FIG. 31 in that the PIM device 700 receives a column address signal of a region in which weight data and vector data used for the last MAC operation among MAC operations are transmitted as an address signal ADDR from the host or controller.

Specifically, when a MAC operation control signal MAC_OP is transmitted from a command decoder 630, the mode register 760 may generate the MAC burst enable signal EN_B_MAC to transmit a generated MAC burst enable signal EN_B_MAC of a logic "high" level to the command decoder 630 and the address signal generator 740. The address signal generator 740 may output a first column address signal corresponding to a start column address signal among the column address signals of the memory bank 611 as a first internal address signal IN_ADDR in response to the first internal MAC operation signal INMAC transmitted from the command decoder 630. Next, the address signal generator 740 may output a second column address signal counted up from the first column address signal as a second internal address signal IN_ADDR in response to a second internal MAC operation signal INMAC transmitted from the command decoder 630. The process of outputting the internal address signal IN_ADDR of the address signal generator 740 may be repeated until the counted-up column address signal becomes the same as the address signal ADDR transmitted from the host or controller. When the counted-up column address signal becomes the same as the address signal ADDR transmitted from the host or controller, the address signal generator 740 may change the logic level of the MAC operation end signal END_MAC from a logic "low" level to a logic "high" level and output the MAC operation end signal END_MAC.

Figure 45:
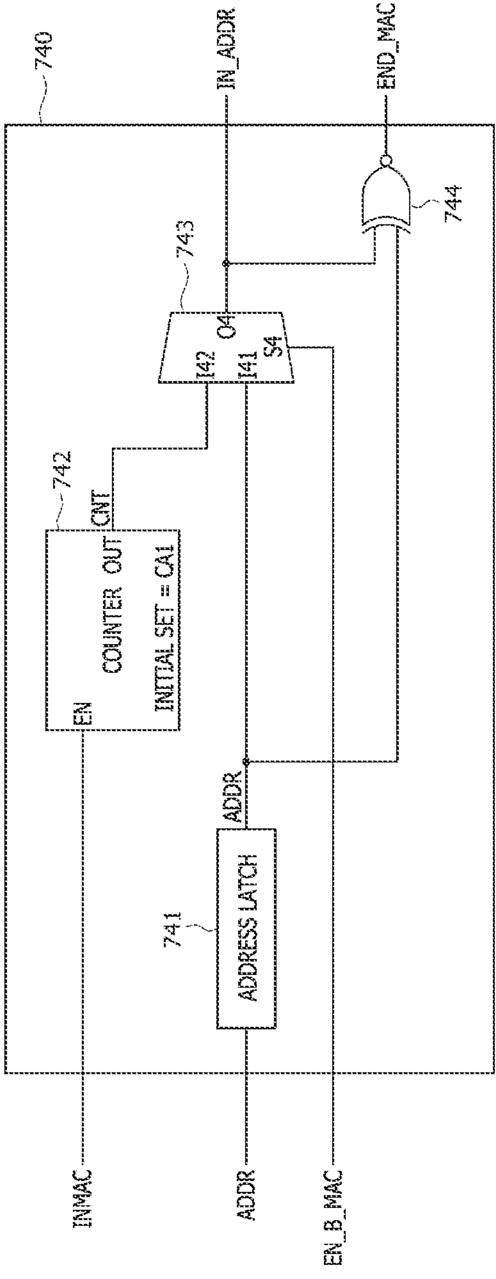
FIG. 45 is a block diagram illustrating an example of a configuration of an address signal generator of the PIM device of FIG. 44.

FIG. 45 is a block diagram illustrating an example of a configuration of the address signal generator 740 of the PIM device 700 of FIG. 44. Referring to FIG. 45, the address signal generator 740 may include an address latch 741, a counter 742, a selector 743, and an XNOR gate 744. The address latch 741 may latch the address signal ADDR transmitted from a host or a controller and output the latched address signal ADDR. An output terminal of the address latch 741 may be coupled to a first input terminal I41 of the selector 743 and a first input terminal of the XNOR gate 744. The counter 742 may have an enable terminal EN and an output terminal OUT. The enable terminal EN of the counter 742 may be coupled to the command decoder (630 of FIG. 44). The counter 742 may receive an internal MAC operation signal INMAC through the enable terminal EN. The output terminal OUT of the counter 742 may be coupled to a second input terminal I42 of the selector 743. The counter 742 may output a counting signal CNT through the output terminal OUT. In the counter 742, an initial value may be set as a start column address signal of an area in which weight data is stored in the memory bank 611, for example, the first column address signal CA1. The counter 742 may output the initially set first column address signal CA1 as the counting signal CNT when the first internal MAC operation signal INMAC is transmitted through the enable terminal EN.

Next, the counter 742 may perform a counting-up operation whenever the internal MAC operation signal INMAC is input, and output the result as a counting signal CNT.

The selector 743 may have the first input terminal I41, a second input terminal I42, a selection terminal S4, and an output terminal O4. The selector 743 may receive the address signal ADDR output from the address latch 741 through the first input terminal I41. The selector 743 may receive the counting signal CNT output from the counter 742 through the second input terminal I42. The selector 743 may receive the MAC burst enable signal EN_B_MAC through the selection terminal S4. The selector 743 may output an internal address signal IN_ADDR through the output terminal OUT. In an embodiment, when a MAC burst enable signal EN_B_MAC of a logic "low" level is transmitted to the selection terminal S4, the selector 743 may output the address signal ADDR received through the first input terminal I41 as the internal address signal IN_ADDR through the output terminal O4. On the other hand, when a MAC burst enable signal EN_B_MAC of a logic "high" level is transmitted to the selection terminal S4, the selector 743 may output the counting signal CNT received through the second input terminal I42 as the internal address signal IN_ADDR through the output terminal O4.

The XNOR gate 744 may have first and second input terminals and an output terminal. The first input terminal of the XNOR gate 744 may be coupled to the output terminal O4 of the selector 743. Accordingly, the XNOR gate 744 may receive the internal address signal IN_ADDR output from the selector 743 through the first input terminal. The second input terminal of the XNOR gate 744 may be coupled to the output terminal of the address latch 741. Accordingly, the XNOR gate 744 may receive the output signal ADDR output from the address latch 741 through the second input terminal. The XNOR gate 744 may output an internal MAC operation end signal END_MAC of a logic "high" level when the internal address signal IN_ADDR output from the selection output 743 is the same as the address signal ADDR output from the address latch 741. On the other hand, the XNOR gate 744 may output an internal MAC operation end signal END_MAC of a logic "low" level when the internal address signal IN_ADDR output from the selection output 743 is not the same as the address signal ADDR output from the address latch 741.

Figure 46:
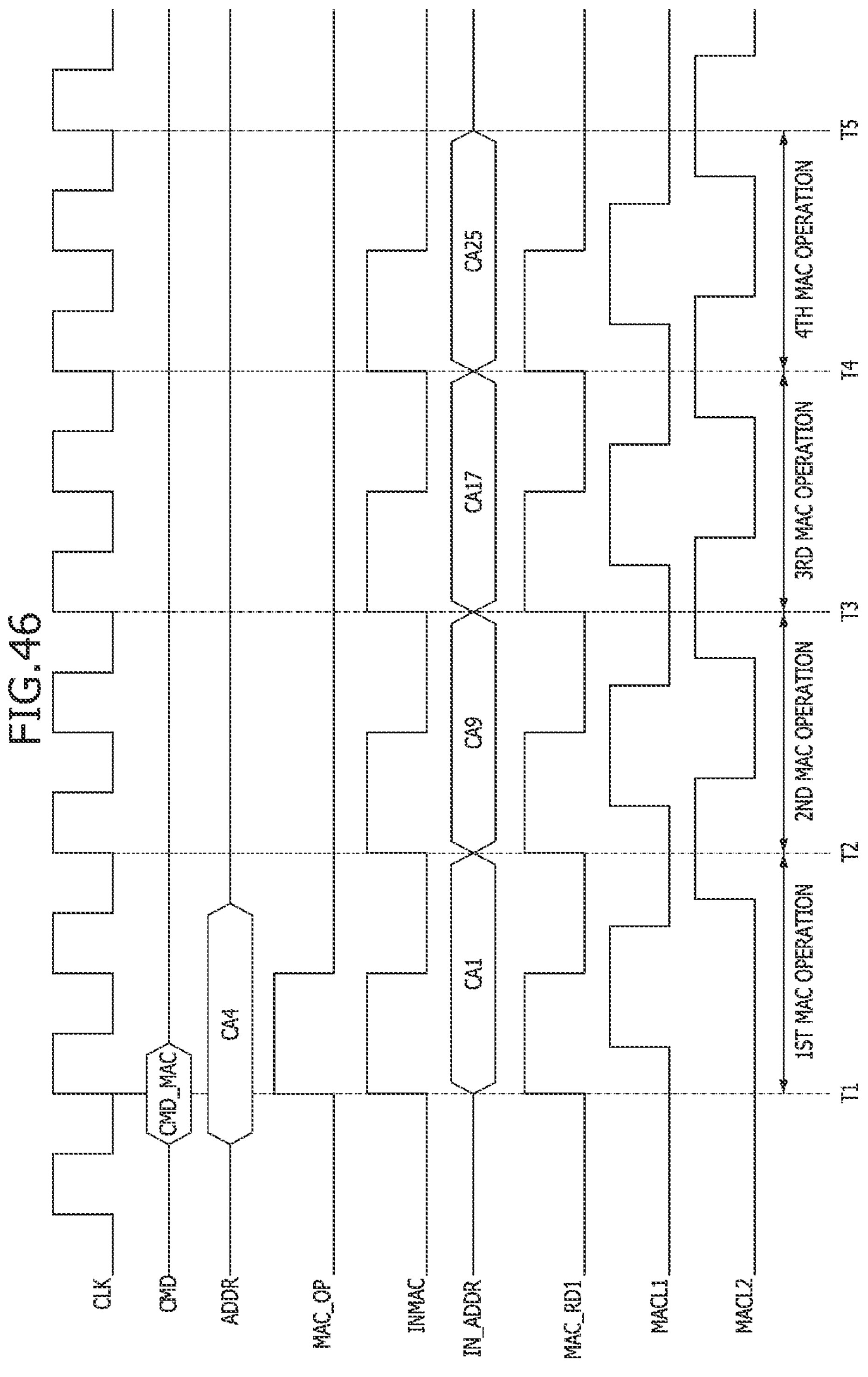
FIG. 46 is a timing diagram illustrating a MAC operation of the PIM device of FIG. 44.

FIG. 46 is a timing diagram illustrating a MAC operation of the PIM device 700 of FIG. 44. As in the example described with reference to FIG. 43, in this embodiment, the PIM device 700 performs the matrix operation of FIG. 41, and weight data and vector data are stored in a memory bank 611 and a global buffer 620, respectively, in the manner described with reference to FIG. 42. Hereinafter, descriptions of content overlapping with those described with reference to FIG. 43 will be omitted.

Referring to FIG. 46 together with FIGS. 44 and 45, when a MAC operation command CMD_MAC and a fourth column address signal CA4 are transmitted to the PIM device 700, at a first time point T1 at which a rising edge of a pulse of a clock signal CLK, the command decoder 630 may generate and output a MAC operation control signal MAC_OP. The mode register 760 may generate a MAC burst enable signal EN_B_MAC of a logic "high" level to transmit the generated MAC burst enable signal EN_B_MAC of a logic "high" level to the selection terminal S4 of the selector 743 constituting the address signal generator 740 in response to the MAC operation control signal MAC_OP. As described with reference to FIG. 43, the command decoder 630 may generate and output an internal MAC operation signal INMAC at each of a first time point t1, a second time point T2, a third time point T3, and a fourth time point T4 of an interval twice the clock signal CLK cycle. The counter 742 of the address signal generator 740 may output the initially set first column address signal CA1 as the first internal address signal IN_ADDR through the selection output unit 743 in response to the first internal MAC calculation signal INMAC. The MAC unit 610 may perform a first MAC operation in response to the first internal MAC operation signal INMAC and the first column address signal CA1.

At the second time point T2, when the second internal MAC operation signal INMAC is input to the counter 742 of the address signal generator 740, the counter 742 may output a second column address signal CA2 as a second internal address signal IN_ADDR through the selection output unit 743. The MAC unit 610 may perform a second MAC operation in response to the second internal MAC operation signal INMAC and the second column address signal CA2. At the third time point t3, when a third internal MAC operation signal INMAC is input to the counter 742 of the address signal generator 740, the counter 742 may output the third column address signal CA3 generated by counting-up as the second internal address signal IN_ADDR through the selection output 743. The MAC unit 610 may perform a third MAC operation in response to the third internal MAC operation signal INMAC and the third column address signal CA3. At the fourth time T4, when a fourth internal MAC operation signal INMAC is input to the counter 742 of the address signal generator 740, the counter 742 may output the fourth column address signal CA4 generated by counting-up the third column address signal CA3 as the second internal address signal IN_ADDR through the selection output unit 743. The MAC unit 610 may perform a fourth MAC operation in response to the fourth internal MAC operation signal INMAC and the fourth column address signal CA4. When the fourth column address signal CA4 is output from the selection output unit 743 and transmitted to the XNOR gate 744, the XNOR gate 744 may change the logic level of the MAC operation end signal END_MAC from a logic "low" level to a logic "high" level, and thus all internal MAC operations may be terminated.

A limited number of possible embodiments for the present teachings have been presented above for illustrative purposes. Those of ordinary skill in the art will appreciate that various modifications, additions, and substitutions are possible considering the teachings provided by this patent document. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

What is claimed is:

1. A processing-in-memory (PIM) device comprising:

a command decoder configured to repeatedly output internal multiplication and accumulation (MAC) operation control signals at a predetermined cycle in response to a MAC operation command received from outside the PIM device;

a MAC unit configured to perform MAC operations in response to the internal MAC operation control signals; and an address signal generator configured to repeatedly transmit internal address signals designating storage positions of weight data and vector data that are used for the MAC operations to the MAC unit at the predetermined cycle, based on an address signal received from outside the PIM device.

2. The PIM device of claim 1, wherein the command decoder is configured to decode the MAC operation command to output a MAC operation control signal for generating the internal MAC operation control signals.

3. The PIM device of claim 2, further comprising a mode register configured to receive the MAC operation control signal from the command decoder, and to generate a MAC burst enable signal, an internal MAC operation interval signal, and a last address signal.

4. The PIM device of claim 3, wherein the address signal generator is configured to generate a MAC operation end signal and an internal address signal, based on the address signal, and the MAC burst enable signal and the last address signal that are output from the mode register.

5. The PIM device of claim 4, wherein the command decoder includes:

a decoder configured to generate the MAC operation control signal; and an internal MAC operation control signal generator configured to receive the MAC operation control signal, the MAC burst enable signal, the internal MAC operation interval signal, and the MAC operation end signal, and to generate an internal MAC operation signal and the internal MAC operation control signal.

6. The PIM device of claim 5, wherein the internal MAC operation control signal generator includes:

an internal MAC operation signal generating circuit configured to receive the MAC operation control signal, the MAC burst enable signal, the internal MAC operation interval signal, the MAC operation end signal, and a clock signal, and to generate the internal MAC operation signal; and an internal MAC operation control signal generating circuit configured to receive the internal MAC operation signal, and to generate the internal MAC operation control signal.

7. The PIM device of claim 6, wherein the internal MAC operation signal generating circuit includes:

a clock enable circuit configured to receive the MAC burst enable signal and the MAC operation end signal, and to generate one of a clock enable signal and a clock disable signal;

an AND gate configured to perform a logical AND operation on the clock signal and the clock enable signal;

a plurality of flip-flops arranged in a serial input and parallel output structure and configured to receive the clock signal output from the AND gate in common;

a first selector configured to input an output signal selected by the internal MAC operation interval signal from among output signals from the plurality of flip-flops to a first flip-flop among the plurality of flip-flops; and a second selector configured to output a signal selected by the MAC burst enable signal from the MAC operation control signal and an output signal of the first flip-flop as the internal MAC operation signal.

8. The PIM device of claim 7, wherein the clock enable circuit is configured to:

output a signal of a logic “high” level as the clock enable signal when logic levels of the MAC burst enable signal and the MAC operation end signal are a logic “high” level and a logic “low” level, respectively, and output a signal of a logic “low” level as the clock enable signal when logic levels of the MAC burst enable signal and the MAC operation end signal are a logic “high” level and a logic “low” level, respectively.

9. The PIM device of claim 7, wherein a set signal is input only to a set and reset (set/reset) terminal of the first flip-flop among the plurality of flip-flops, and a reset signal is input to the set/reset terminals of the remaining flip-flops.

10. The PIM device of claim 7, wherein the first selector is configured to:

input an output signal of a second flip-flop among the plurality of flip-flops to the first flip-flop when the internal MAC operation interval signal is at a logic “low” level, and input an output signal of a last flip-flop among the plurality of flip-flops to the first flip-flop when the internal MAC operation interval signal is at a logic “high” level.

11. The PIM device of claim 7, wherein the second selector is configured to:

output the MAC operation control signal as the internal MAC operation signal when the MAC burst enable signal is at a logic “low” level, and output the output signal of the first flip-flop as the internal MAC operation signal when the MAC burst enable signal is at a logic “high” level.

12. The PIM device of claim 6, wherein the internal MAC operation control signal includes a MAC read control signal, a first latch control signal, and a second latch control signal, wherein the internal MAC operation control signal generating circuit is configured to output the internal MAC operation signal as the MAC read control signal when the internal MAC operation signal is input, and wherein the internal MAC operation control signal generating circuit includes:

a first delay circuit configured to receive the internal MAC operation signal and to output an output signal obtained by delaying the internal MAC operation signal by a first delay time as the first latch control signal; and a second delay circuit configured to receive the first latch control signal from the first delay circuit and to output an output signal obtained by delaying the first latch control signal by a second delay time as the second latch control signal.

13. The PIM device of claim 4, wherein the address signal generator includes:

an address latch configured to latch and output the address signal;

a counter configured to perform a counting operation on the address signal output from the address latch to output a counting signal in synchronization with the internal MAC operation signal; and a selector configured to output one of the address signal and the counting signal selected according to a logic level of the MAC burst enable signal as the internal address signal.

14. The PIM device of claim 13, wherein the address signal generator further includes an XNOR gate configured to perform an exclusive NOR operation on the internal address signal output from the selector and the last address signal, and to output a result of the XNOR operation as the MAC operation end signal.

15. The PIM device of claim 13, wherein the selector is configured to:

output the address signal output from the address latch as the internal address signal when the MAC burst enable signal is at a logic "low" level, and output the counting signal output from the counter as the internal address signal when the MAC burst enable signal is at a logic "high" level.

16. The PIM device of claim 2, further comprising a mode register configured to receive the MAC operation control signal from the command decoder, and to generate a MAC burst enable signal and an internal MAC operation interval signal.

17. The PIM device of claim 16, wherein the address signal generator is configured to generate a MAC operation end signal and an internal address signal based on the address signal and the MAC burst enable signal output from the mode register.

18. The PIM device of claim 16, wherein the address signal generator includes:

an address latch configured to latch and output the address signal;

a counter set with a first column address signal and configured to perform a counting operation on the first column address signal and output a counting signal in synchronization with the internal MAC operation signal; and a selector configured to output one of the address signal and the counting signal selected according to a logic level of the MAC burst enable signal as the internal address signal.

19. The PIM device of claim 18, wherein the address signal generator further includes an exclusive NOR (XNOR) gate configured to perform an XNOR operation on the internal address signal output from the selector and the address signal output from the address latch, and to output a result of the XNOR operation as the MAC operation end signal.

20. The PIM device of claim 18, wherein the selector is configured to:

output the address signal output from the address latch as the internal address signal when the MAC burst enable signal is at a logic "low" level, and output the counting signal output from the counter as the internal address signal when the MAC burst enable signal is at a logic "high" level.

* * * * *